(12) United States Patent
Ichikawa et al.

(10) Patent No.: US 7,245,530 B2
(45) Date of Patent: Jul. 17, 2007

(54) SEMICONDUCTOR MEMORY DEVICE WITH MOS TRANSISTORS, EACH INCLUDING FLOATING GATE AND CONTROL GATE, AND MEMORY CARD INCLUDING THE SAME

(75) Inventors: Masaki Ichikawa, Fujisawa (JP); Takehiro Hasegawa, Yokohama (JP); Akira Umezawa, Tokyo (JP); Takuya Fujimoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/111,878

(22) Filed: Apr. 22, 2005

(65) Prior Publication Data

US 2005/0237808 A1    Oct. 27, 2005

(30) Foreign Application Priority Data

Apr. 23, 2004 (JP) ............................. 2004-128985

(51) Int. Cl.
*G11C 16/04* (2006.01)

(52) U.S. Cl. ........................... 365/185.05; 365/185.13; 365/185.17

(58) Field of Classification Search ........... 365/185.05, 365/185.13, 185.17
See application file for complete search history.

(56) References Cited

U.S. PATENT DOCUMENTS 6,353,242 B1   3/2002  Watanabe et al.
6,512,253 B2   1/2003  Watanabe et al.
7,064,978 B2*  6/2006  Lee et al. .............. 365/185.01
2004/0240273 A1* 12/2004 Sakui .................... 365/185.33

OTHER PUBLICATIONS

Wei-Hua Liu, et al., "A 2-Transistor Source-select (2TS) Flash EEPROM for 1.8V-Only Applications", Non-Volatile Semiconductor Memory Workshop 4.1, 1997, pp. 1-3.
Ton Ditewig, et al., "An Embedded 1.2V-Read Flash Memory Module in a 0.18μm Logic Process", Solid-State Circuits Conference, Digest of Technical Papers ISSCC, Feb. 5-7, 2001, pp. 34-35 and 425.

* cited by examiner

*Primary Examiner*—Hoai V. Ho
(74) *Attorney, Agent, or Firm*—Oblon, Spivak, McClelland, Maier & Neustadt, P.C.

(57) ABSTRACT

A semiconductor memory device includes memory cells, a memory cell array, bit lines, source lines, word lines, and select gate lines. Each of the memory cells includes a first MOS transistor having a floating gate and a control gate and a second MOS transistor having a stacked gate including a first gate electrode and a second gate electrode formed above the first gate electrode and having its drain connected to the source of the first MOS transistor. Each of the bit lines electrically connects the drains of the first MOS transistors in a same column. Each of the word lines connects the control gates of the first MOS transistors in a same row. Each of the select gate lines electrically connects the second gate electrodes of the second MOS transistors in a same row and is electrically isolated from the second gate electrodes.

5 Claims, 60 Drawing Sheets

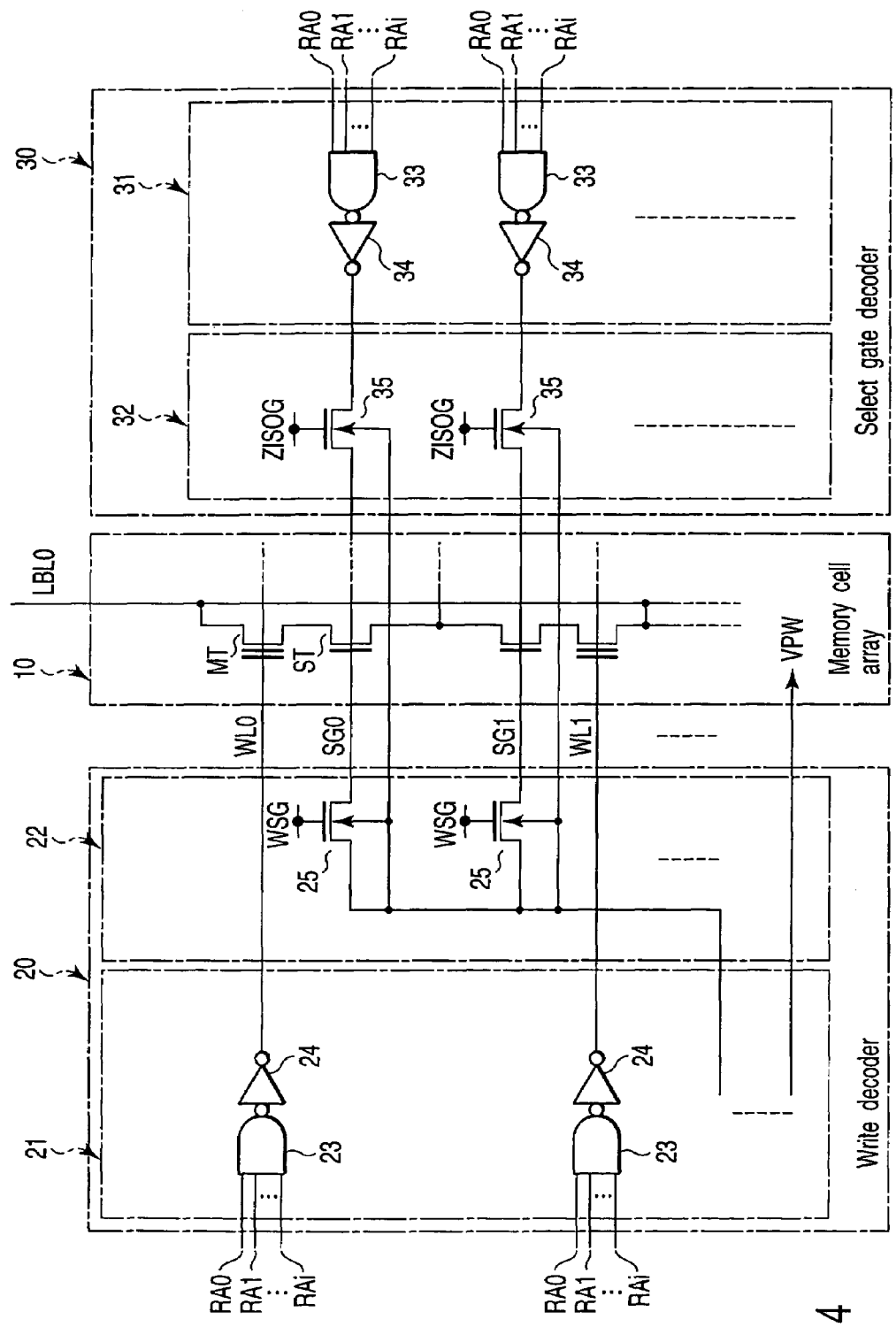
F I G. 4

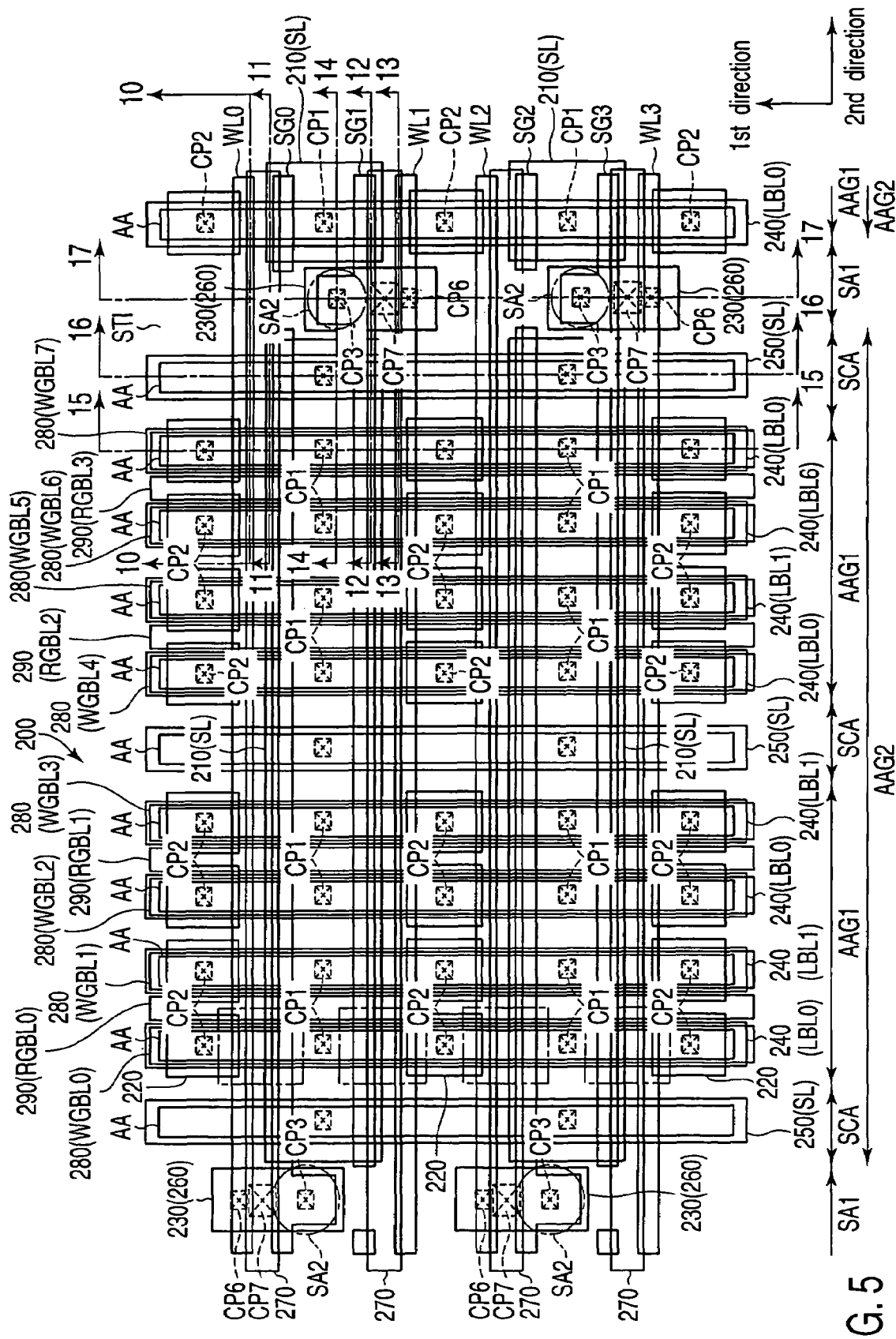
F I G. 5

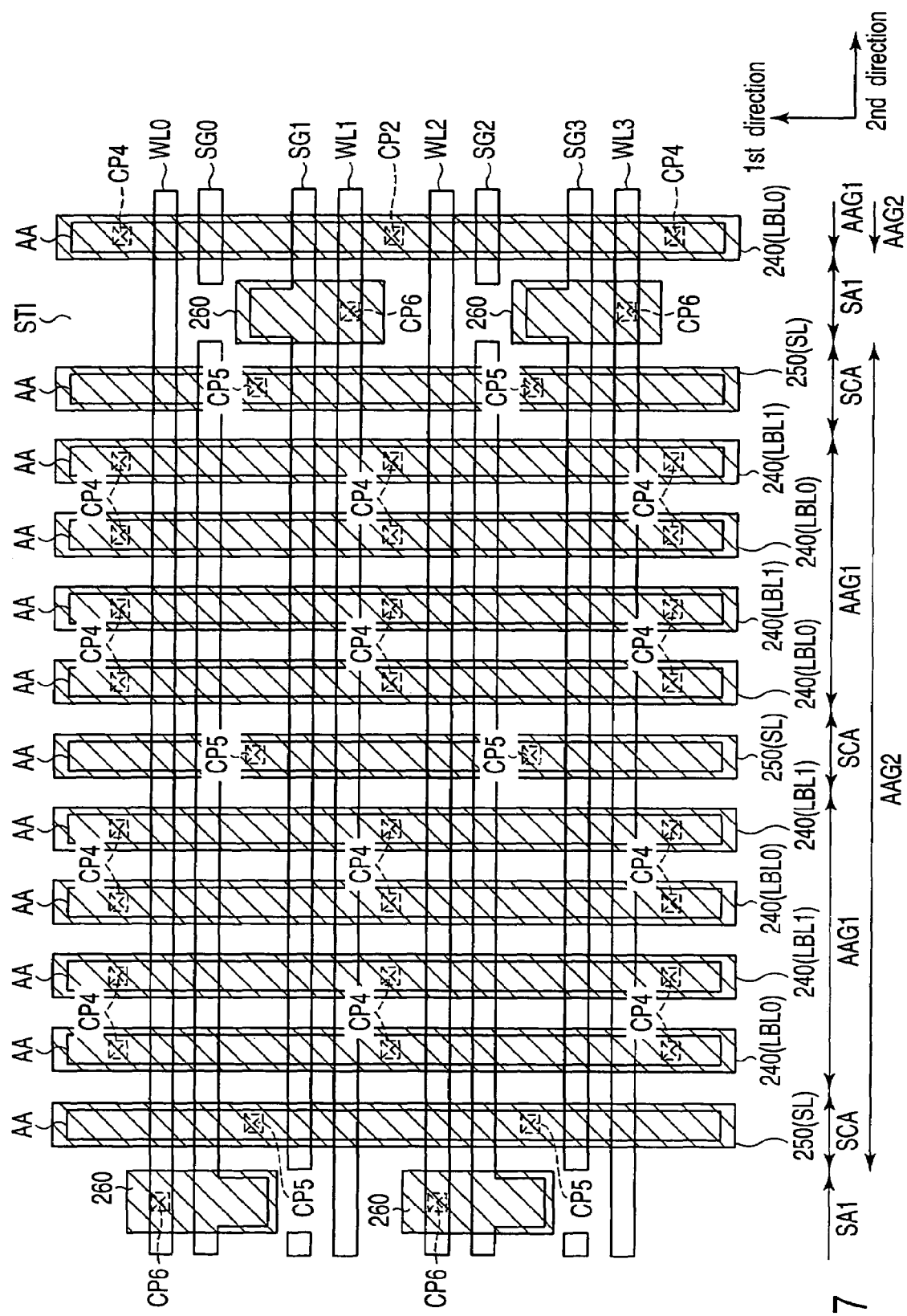
F I G. 7

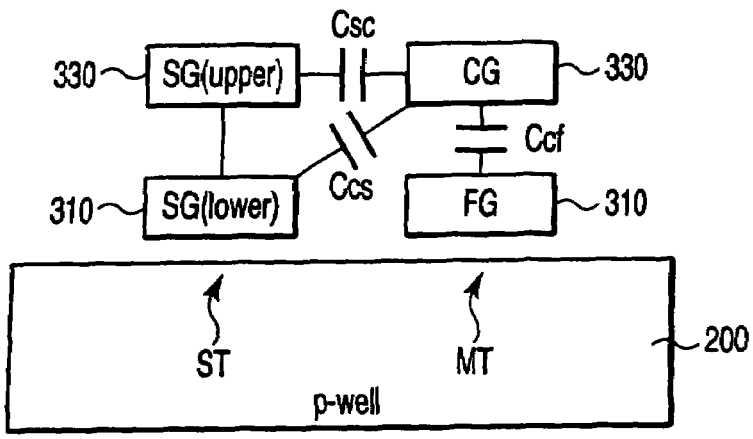
CONVENTIONAL ART   FIG. 21
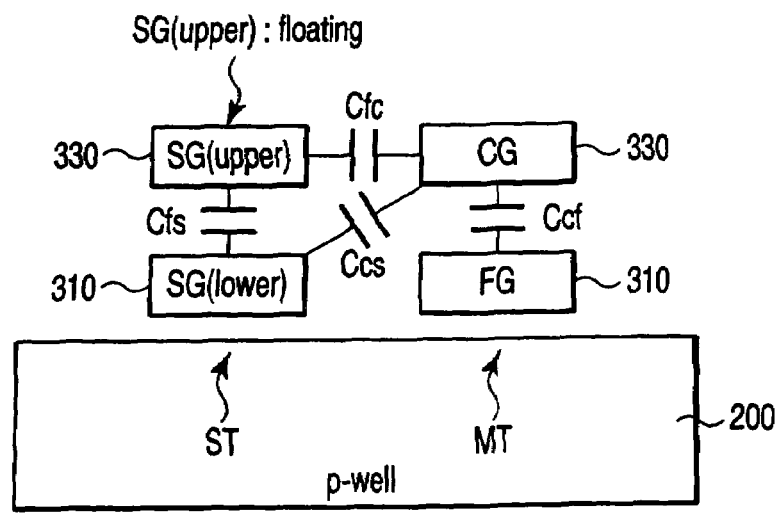
FIG. 22

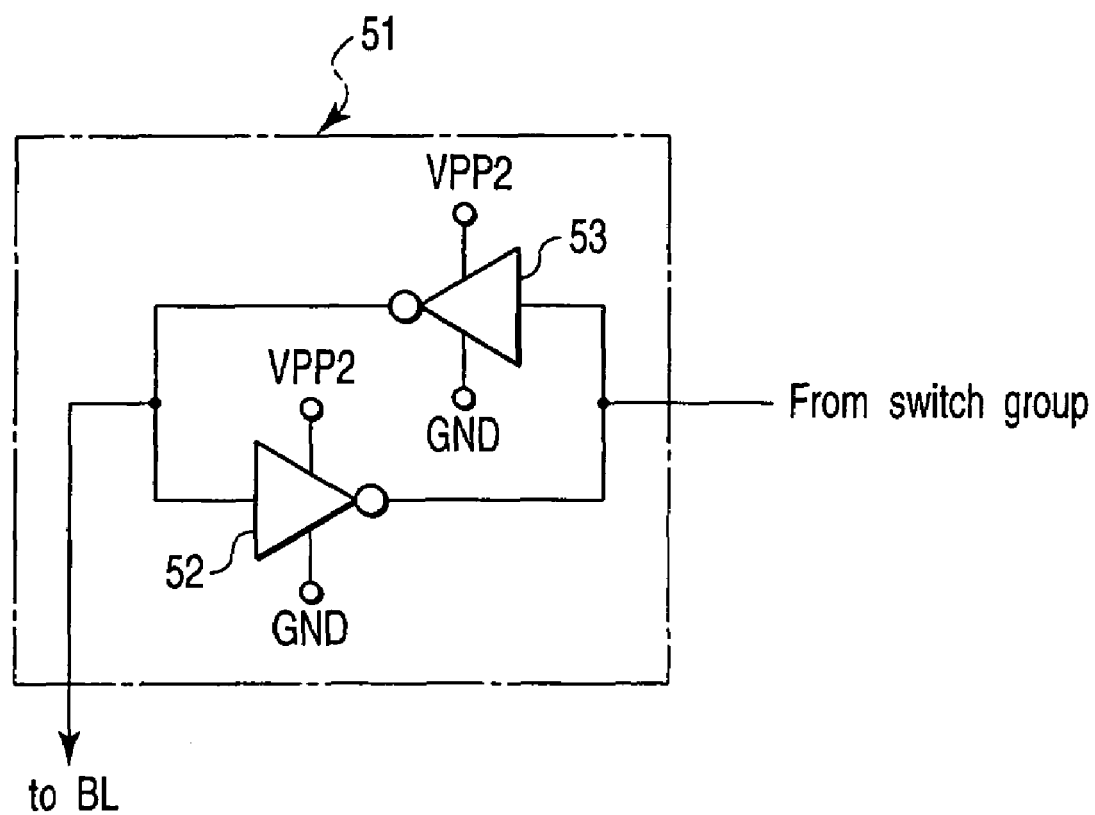
F I G. 27

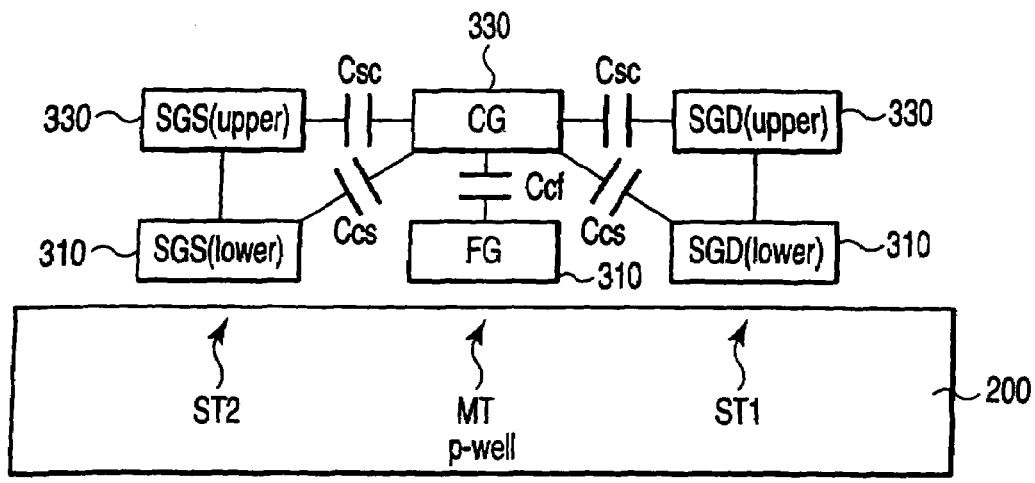
CONVENTIONAL ART  FIG. 38
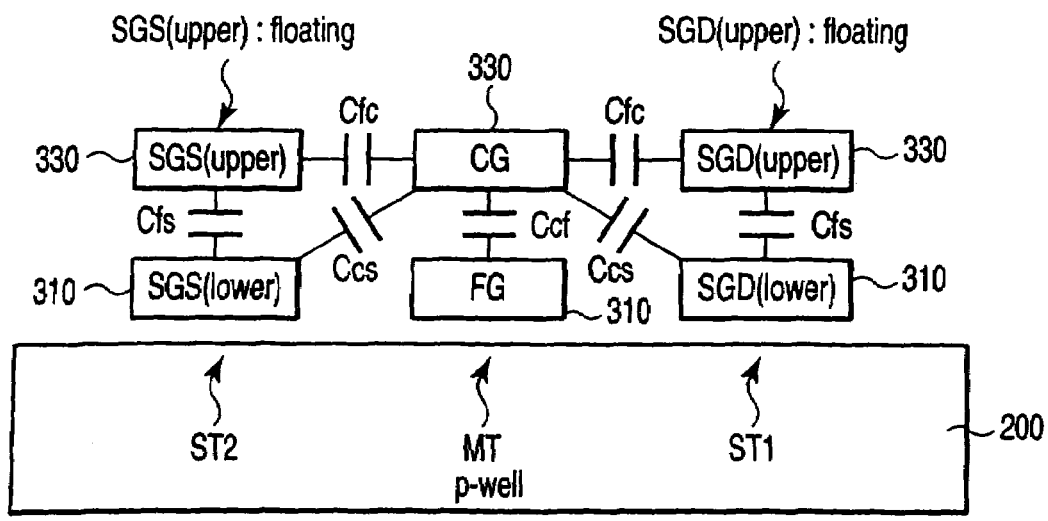
FIG. 39

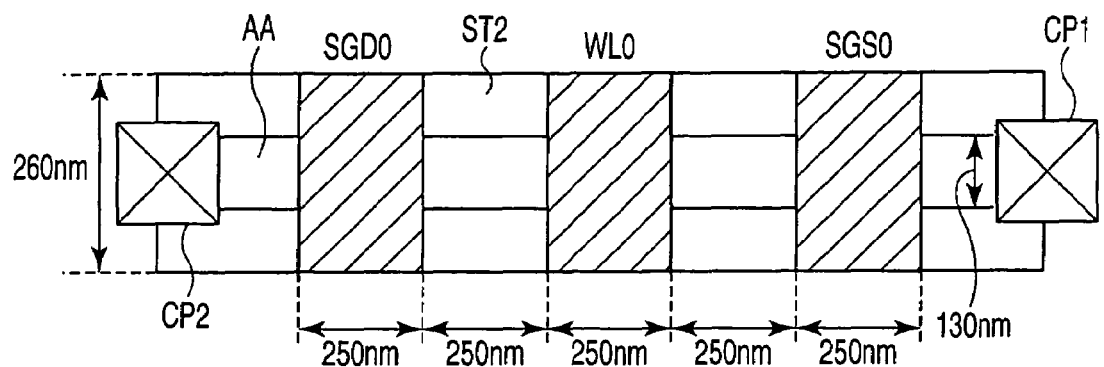
F I G. 4 6
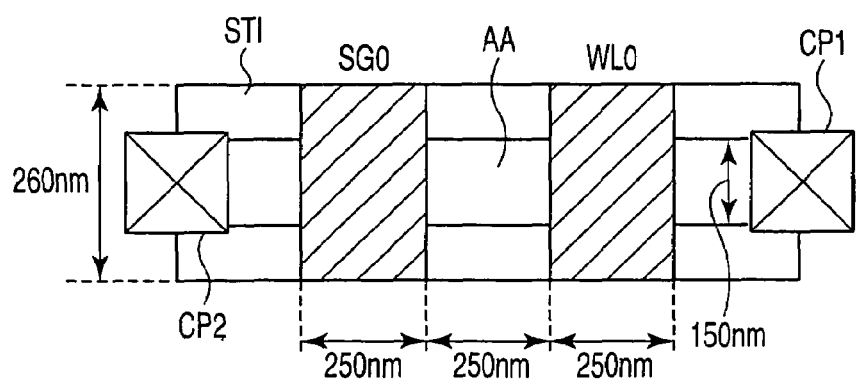
F I G. 4 7

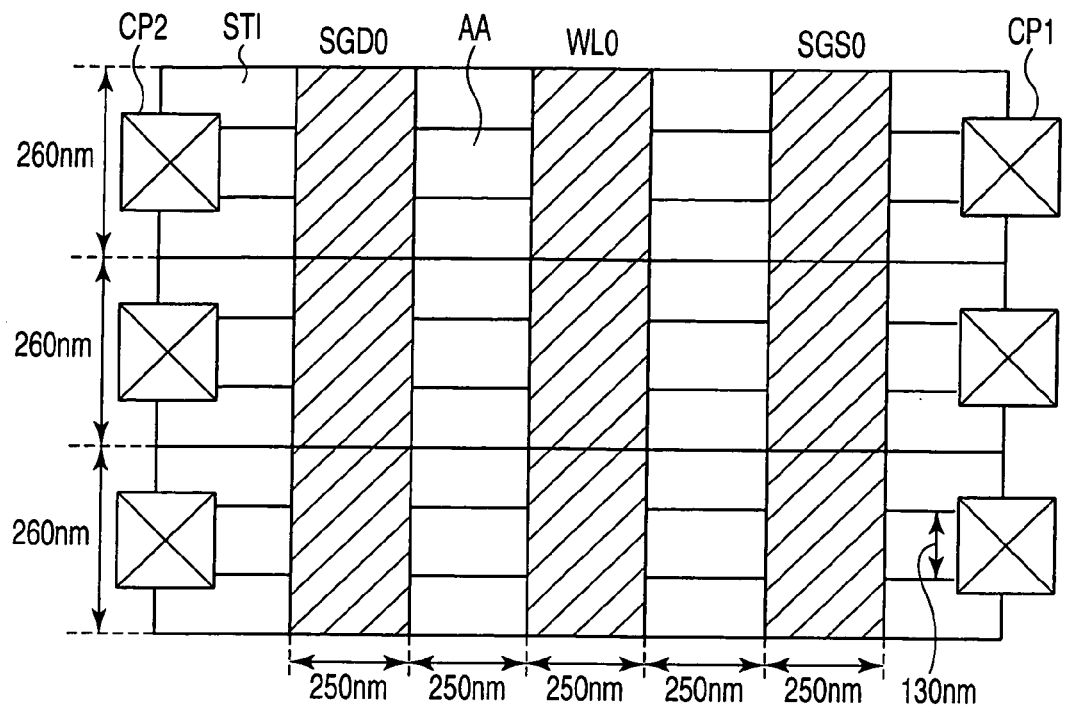
F I G. 49
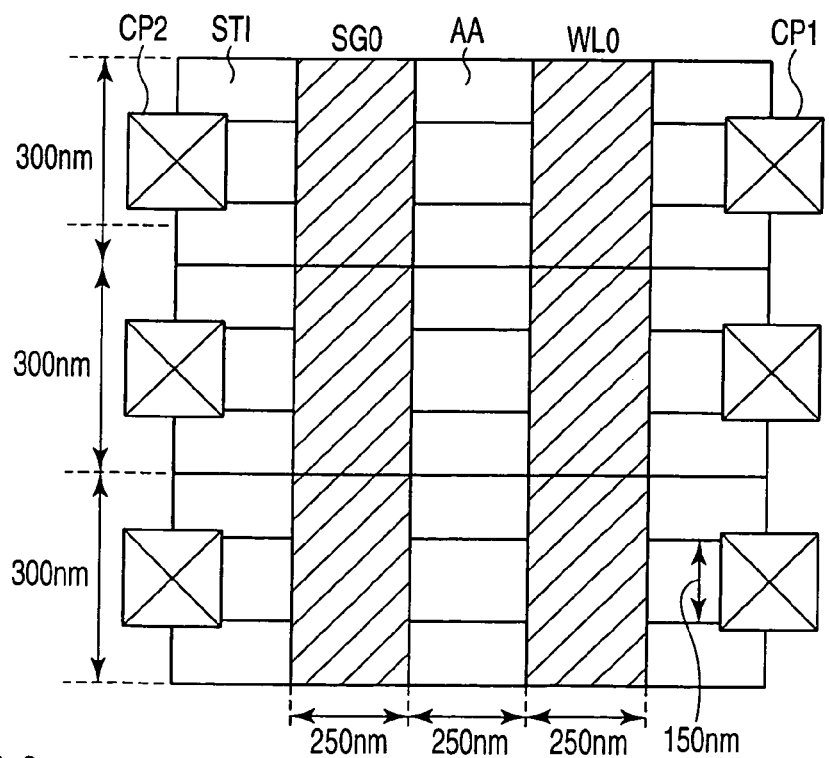
F I G. 50

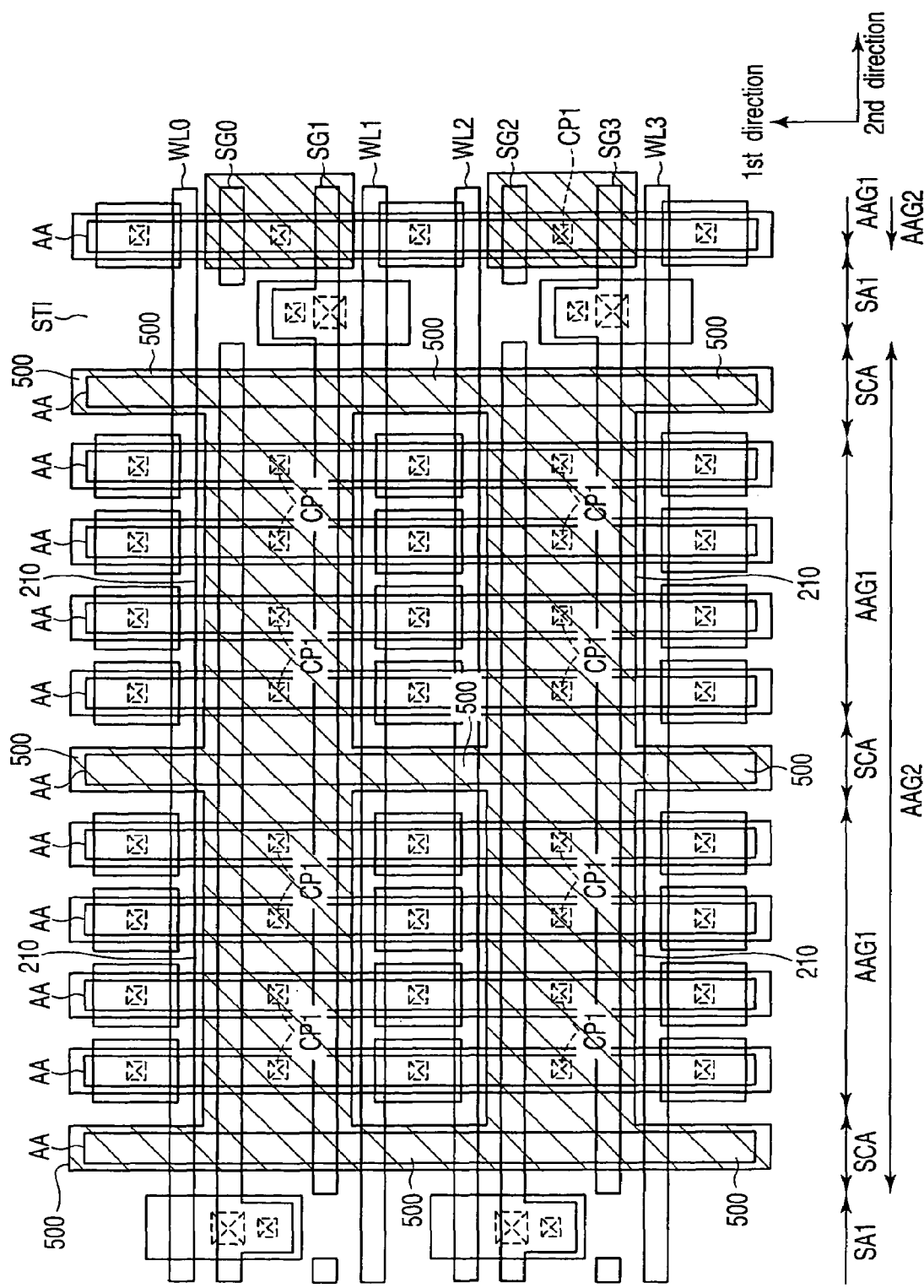
F I G. 51

SEMICONDUCTOR MEMORY DEVICE WITH MOS TRANSISTORS, EACH INCLUDING FLOATING GATE AND CONTROL GATE, AND MEMORY CARD INCLUDING THE SAME

CROSS-REFERENCE TO RELATED APPLICATIONS

This application is based upon and claims the benefit of priority from prior Japanese Patent Application No. 2004-128985, filed Apr. 23, 2004, the entire contents of which are incorporated herein by reference.

BACKGROUND OF THE INVENTION

1. Field of the Invention

This invention relates to a semiconductor memory device and a memory card including the semiconductor memory device. More particularly, this invention relates to a non-volatile semiconductor memory device including MOS transistors, each having a floating gate and a control gate.

2. Description of the Related Art

A NAND flash memory has been known as a data storage memory for use in a digital camera or the like. A NAND flash memory uses FN (Fowler-Nordheim) tunneling to write and erase data.

Another known flash memory is a NOR flash memory which writes and erases data by using FN tunneling. A NOR flash memory has been written in, for example, Ditewig T., et al., "An Embedded 1.2-V Read Flash Memory Module in a 0.18-μm Logic Process," Solid-State Circuits Conference, 2001 Digest of Technical Papers ISSCC. 2001 IEEE International 5–7, February 2001, pp. 34–35, 425. Unlike a flash memory which exchanges electrons using hot electrons, the NOR flash memory described in the reference is such that a memory cell has one memory cell transistor and two select transistors. Hereinafter, this type of flash memory is referred to as a 3Tr-NAND flash memory.

Furthermore, in recent years, a flash memory combining the features of the NOR flash memory and the NAND flash memory has been proposed in, for example, Wei-Hua Liu, "A 2-Transistor Source-select (2TS) Flash EEPROM for 1.8-V-Only Application," Non-Volatile Semiconductor Memory Workshop 4.1, 1997. A flash memory of this type has memory cells, each including one memory cell transistor and one select transistor. Hereinafter, this type of flash memory is referred to as a 2Tr flash memory.

However, with the conventional flash memory, it may take a long time for the gate potential of a memory cell to settle down because of the influence of adjacent electrodes coupling with one another.

BRIEF SUMMARY OF THE INVENTION

A semiconductor memory device according to an aspect of the present invention includes: a plurality of memory cells each of which includes a first MOS transistor having a floating gate and a control gate and a second MOS transistor having a stacked gate including a first gate electrode and a second gate electrode formed above the first gate electrode and having its drain connected to the source of the first MOS transistor; a memory cell array in which the memory cells are arranged in a matrix; bit lines each of which electrically connects commonly the drains of the first MOS transistors in a same column; source lines each of which connects commonly the sources of the second MOS transistors; word lines each of which connects commonly the control gates of the first MOS transistors in a same row; and select gate lines each of which electrically connects the first gate electrodes of the second MOS transistors in a same row and which is electrically isolated from the second gate electrodes.

A memory card according to an aspect of the present invention includes a semiconductor memory device comprising: a plurality of memory cells each of which includes a first MOS transistor having a floating gate and a control gate and a second MOS transistor having a stacked gate including a first gate electrode and a second gate electrode formed above the first gate electrode and having its drain connected to the source of the first MOS transistor; a memory cell array in which the memory cells are arranged in a matrix; bit lines each of which electrically connects commonly the drains of the first MOS transistors in a same column; source lines each of which connects commonly the sources of the second MOS transistors; word lines each of which connects commonly the control gates of the first MOS transistors in a same row; and select gate lines each of which electrically connects the first gate electrodes of the second MOS transistors in a same row and which is electrically isolated from the second gate electrodes.

BRIEF DESCRIPTION OF THE SEVERAL VIEWS OF THE DRAWING

FIG. 4 is a circuit diagram of a write decoder, a memory cell array, and a select gate decoder included in the 2Tr flash memory of the first embodiment;

FIG. 5 is a plan view of the memory cell array of the 2Tr flash memory according to the first embodiment;

FIG. 7 is a plan view of the memory cell array of the 2Tr flash memory according to the first embodiment, showing a pattern of a second-layer metal wiring layer;

FIG. 21 is a sectional view of a memory cell in a conventional flash memory;

FIG. 22 is a sectional view of a memory cell included in the 2Tr flash memory of the first embodiment;

FIG. 27 is a circuit diagram of a latch circuit included in the 3Tr-NAND flash memory of the second embodiment;

FIG. 38 is a sectional view of a memory cell in a conventional flash memory;

FIG. 39 is a sectional view of a memory cell included in the 3Tr-NAND flash memory of the second embodiment;

FIG. 46 is a plan view of a memory cell included in a 3Tr-NAND flash memory according to a fourth embodiment of the present invention;

FIG. 47 is a plan view of a memory cell included in a 2Tr flash memory according to the fourth embodiment of the present invention;

FIG. 49 is a plan view of a memory cell included in a 3Tr-NAND flash memory according to the fifth embodiment of the present invention;

FIG. 50 is a plan view of a memory cell included in a 2Tr flash memory according to the fifth embodiment of the present invention;

FIG. 51 is a plan view of a memory cell array included in a 2Tr flash memory according to a sixth embodiment of the present invention, particularly focusing on a source line;

DETAILED DESCRIPTION OF THE INVENTION

Figure 1:
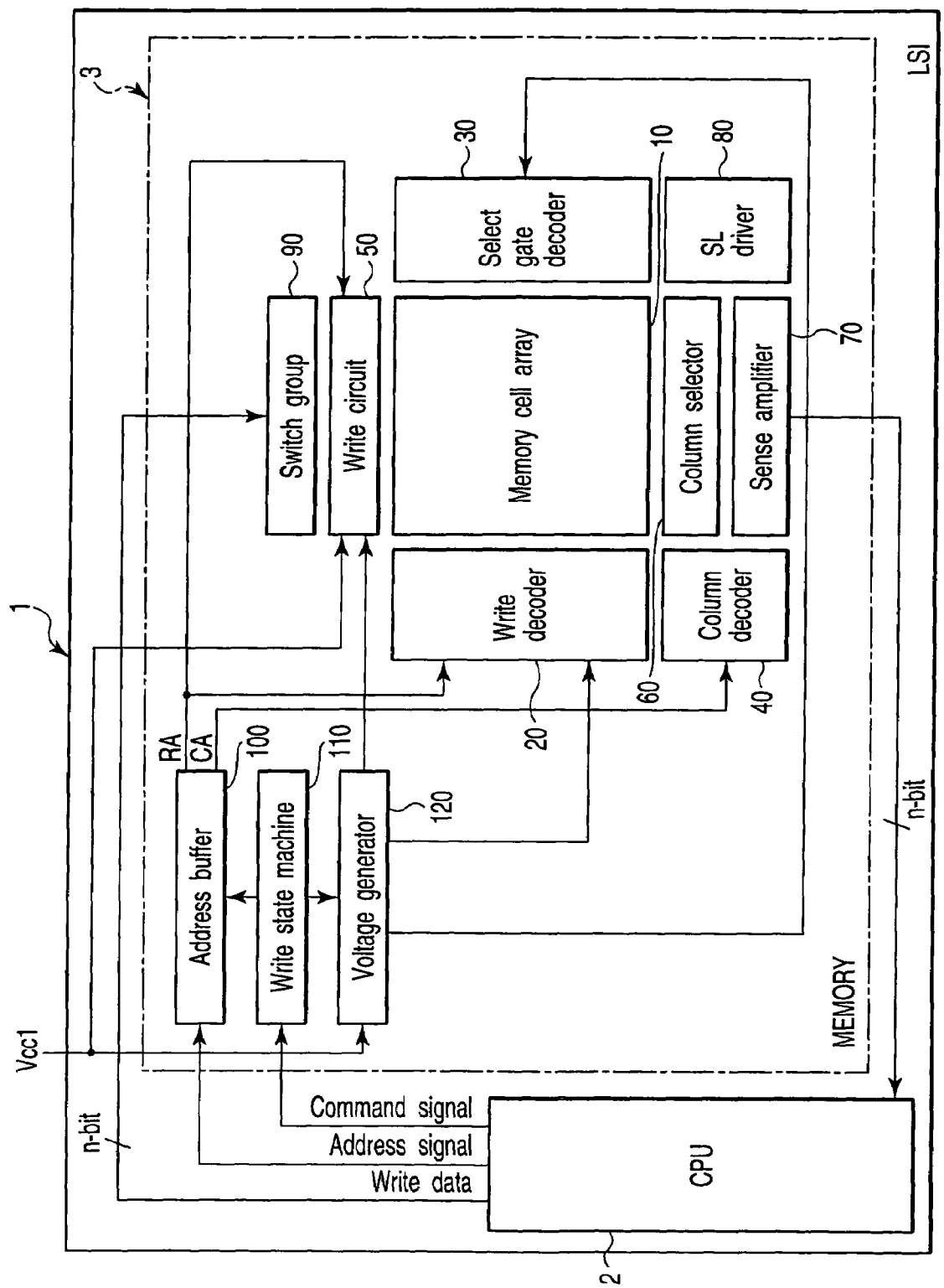
FIG. 1 is a block diagram of a system LSI according to a first embodiment of the present invention.

Referring to FIG. 1, a semiconductor memory device according to a first embodiment of the present invention will be explained. FIG. 1 is a block diagram of a system LSI according to the first embodiment.

As shown in FIG. 1, the system LSI 1 comprises a CPU 2 and a 2Tr flash memory 3. The CPU 2 exchanges data with the flash memory 3. The flash memory 3 comprises a memory cell array 10, a write decoder 20, a select gate decoder 30, a column decoder 40, a write circuit 50, a column selector 60, a sense amplifier 70, a source line driver 80, a switch group 90, an address buffer 100, a write state machine 110, and a voltage generator 120. A voltage of Vcc1 (about 1.5V) is externally applied to the LSI 1. The voltage Vcc1 is applied to the voltage generator 120 and write circuit 50.

Figure 2:
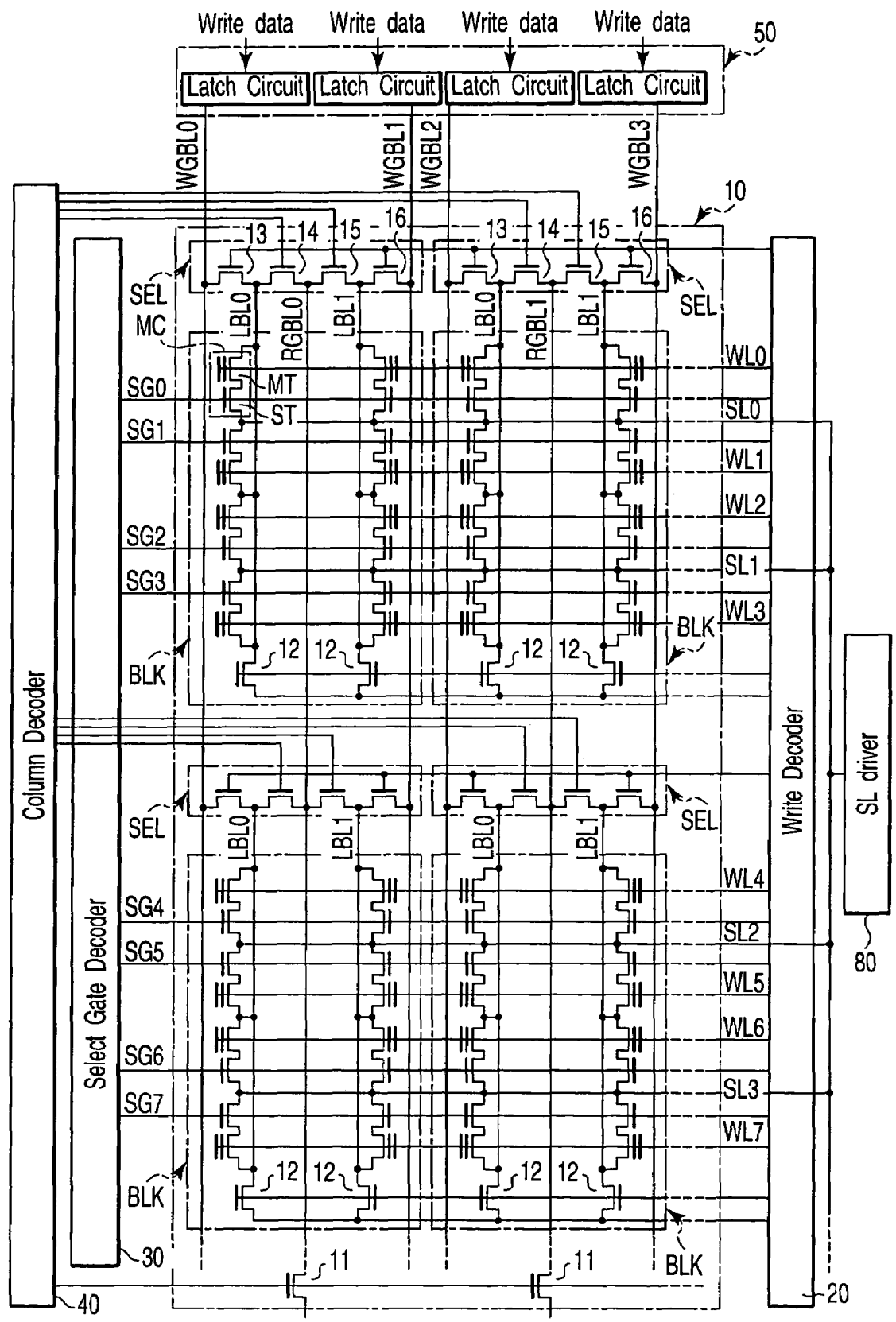
FIG. 2 is a circuit diagram of a memory cell array included in a 2Tr flash memory according to the first embodiment of the present invention.

The memory cell array 10 has a plurality of memory cells arranged in a matrix. Using FIG. 2, the configuration of the memory cell array 10 will be explained. FIG. 2 is a circuit diagram of a part of the memory cell array 10.

The memory cell array 10 has (m+1)×(n+1) memory cell blocks BLK (m and n are natural numbers). The memory cell array 10 further has selectors SEL and MOS transistors 11, which are provided for the memory cell blocks BLK in a one-to-one correspondence. Although only (2×2) memory cell blocks BLK are shown in FIG. 2, the number is illustrative and not restrictive.

Each of the memory cell blocks includes a plurality of memory cells MC. Each of the memory cells MC includes a memory cell transistor MT and a select transistor ST, whose current paths are connected in series. The memory cell transistor MT has a stacked gate structure that includes a floating gate formed above a semiconductor substrate via a gate insulating film and a control gate formed above the floating gate via an inter-gate insulating film. The select transistor ST also has a stacked gate structure that includes a first polysilicon layer formed above the semiconductor substrate via a gate insulating film and a second polysilicon layer formed above the first polysilicon layer via an inter-gate insulating film. The source region of the memory cell transistor MT is connected to the drain region of the select transistor ST. Each of the memory cell blocks includes (4×2) memory cells MC with this configuration. Although the number of memory cells MC arranged in the column direction is 4 in FIG. 2, this is illustrative and not restrictive. For instance, the number of memory cells MC may be 8 or 16. Memory cells adjoining each other in the column direction share the source region of the select transistor ST or the drain region of the memory cell transistor MT. The drain regions of the memory cell transistors MT of one column of memory cells and those of the other column of memory cells are connected to two local bit lines LBL0, LBL1, respectively. One end of each of local bit lines LBL0, LBL1 is connected to the selector SEL and the other end is connected via the current path of a MOS transistor 12 to the write decoder 20. In the memory cell array 10, the control gates of the memory cell transistors MT in a same row are connected commonly to any one of word lines WL0 to WL(4m−1). The gates of the select transistors ST in a same row are connected commonly to any one of select gate lines SG0 to SG(4m−1). Local bit lines LBL0, LBL1 connect the memory cell transistors to one another in each of the memory cell blocks BLK, whereas the word lines WL and select gate lines SG connect the memory cell transistors and select transistors in a same row to one another even across the memory cell blocks. Word lines WL0 to WL(4m−1) are connected to the write decoder 20. Select gate lines SG0 to SG(4m−1) are connected to the write decoder 20 and select gate decoder 30. The source regions of the select transistors ST are connected to one another across a plurality of memory cell blocks BLK and further connected to the source line driver 80.

Next, the configuration of a selector SEL will be explained. Each of the selectors SEL includes four MOS transistors 13 to 16 connected in series. Specifically, one end of the current path of the NOS transistor 13 is connected to one end of the current path of the MOS transistor 14. The other end of the current path of the MOS transistor 14 is connected to one end of the current path of the MOS transistor 15. The other end of the current path of the MOS transistor 15 is connected to one end of the current path of the MOS transistor 16. The gates of the MOS transistors 13, 16 are connected to the write decoder 20 and the gates of the MOS transistors 14, 15 are connected to the column decoder 40. Local bit line LBL0 of the corresponding memory cell block BLK is connected to the junction node of the MOS transistor 13 and MOS transistor 14. Local bit line LBL1 of the corresponding memory cell block BLK is connected to the junction node of the MOS transistor 15 and MOS transistor 16. Furthermore, the other ends of the MOS transistors 13, 16 of the selector SEL are connected to any one of write global bit lines WGBL0 to WGBL(2n−1).

Each of write global bit lines WGBL0 to WGBL(2n−1) is connected commonly to the other ends of the current paths of the MOS transistors 13 or MOS transistors 16 of the selectors in a same column. One end of each of the write global bit lines WGBL0 to WGBL(2n−1) is connected to the write circuit 50. The write circuit 50 has latch circuits 51 provided for the write global bit lines in a one-to-one correspondence. Each latch circuit 51 is connected to the corresponding write global bit line. To the corresponding junction nodes of the MOS transistors 14 and MOS transistors 15, read global bit lines RGBL0 to RGBL(n−1) are connected. Each of read global bit lines RGBL0 to RGBL(n−1) is connected commonly to the junction nodes of the MOS transistors 14 and MOS transistors 15 of the selectors SEL in a same column. One end of each of read global bit lines RGBL0 to RGBL(n−1) is connected to the column selector 60 via the current path of the corresponding MOS transistor 11. The gates of the individual MOS transistors 11 are connected to one another and then connected to the read decoder 30.

The configuration of the memory cell array 10 can also be explained as follows. In the memory cell array 10, a plurality of memory cells MCs are arranged in a matrix. The control gates of the memory cell transistors MT of the memory cells MC in a same row are connected commonly to any one of word lines WL0 to WL(4m−1). The gates of the select transistors of the memory cells in the same row are connected commonly to any one of select gate lines SG0 to SG(4m−1). The drains of the memory cell transistors MT of four memory cells MC connected in series in a same are connected commonly to any one of local bit lines LBL0, LBL1. Specifically, the memory cells MC in the memory cell array 10 are connected to different local bit lines in units of four memory cells MC arranged in a line. Then, one end of each of the local bit lines in the same row is connected to one another via the MOS transistor 12 and then is connected to the write decoder 20. The other ends of local bit lines LBL0, LBL1 in the same column are connected commonly to any one of write global bit lines WGBL0 to WGBL(2n−1) via the MOS transistors 13, 16 respectively and further are connected commonly to any one of read global bit lines RGB0 to RGBL(n−1) via the MOS transistors 14, 15. Then, the sources of the select transistors ST of the memory cells MC are connected to one another and then are connected to the source line driver 80. In the memory cell array with the above configuration, two columns of four memory cells MCs connected to the same local bit line form a single memory cell block BLK. The memory cell blocks in a column are connected to a common write global bit line and a common read global bit line. The memory cell blocks in a different column are connected to a different write global bit line and a different read global bit line.

Referring to FIG. 1, the explanation of the LSI 1 will be continued.

The voltage generator circuit 120 generates a plurality of internal voltages on the basis of the voltage Vcc1 externally input. The voltage generator circuit 120 has a negative charge pump circuit and a positive charge pump circuit. The negative and positive charge pump circuits generate a negative voltage VBB (e.g., −6V) and positive voltages VPP1 (e.g., 10V) and VPP2 (e.g., 3V).

Figure 3:
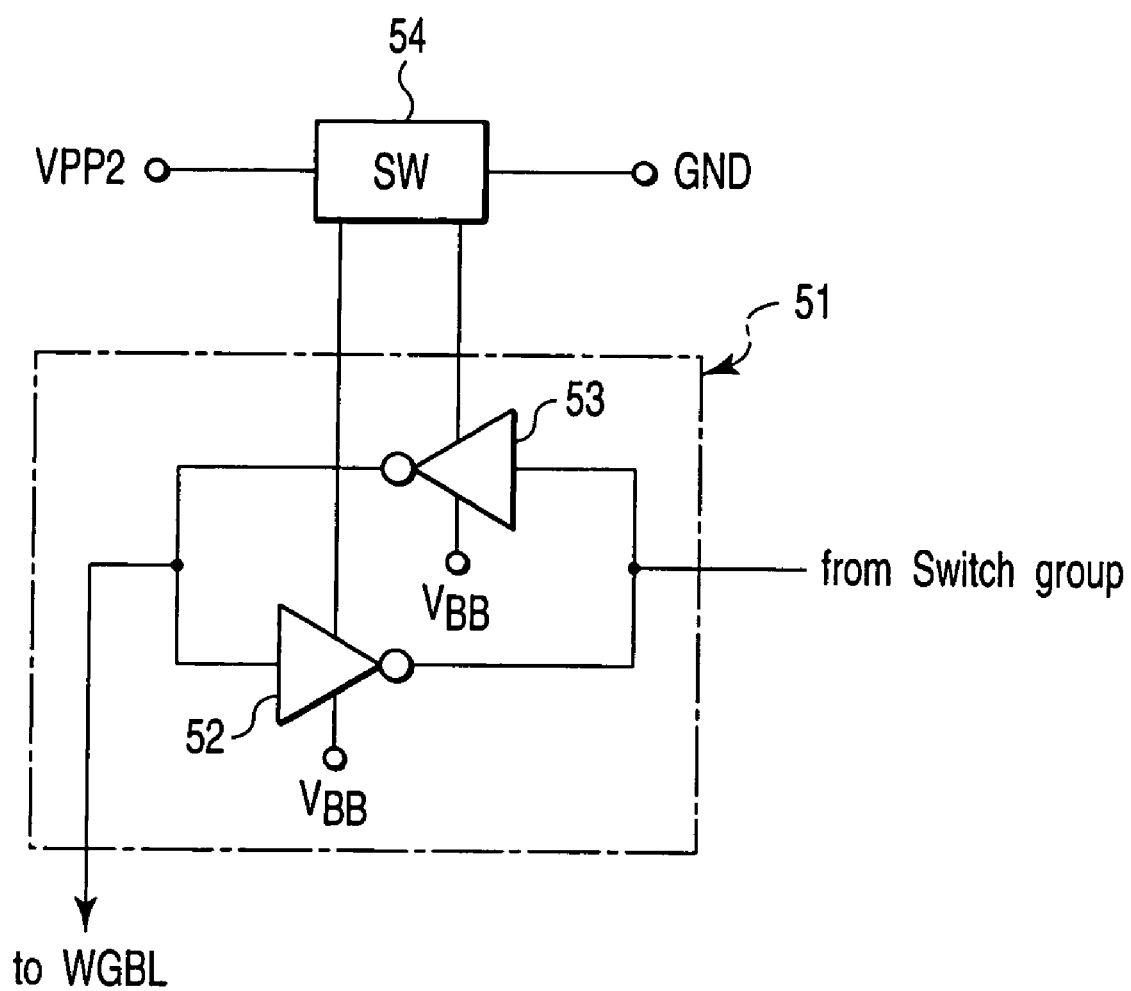
FIG. 3 is a circuit diagram of a latch circuit included in the 2Tr flash memory of the first embodiment.

The write circuit 50 latches write data. As described above, the write circuit 50 includes latch circuits 51 provided for the write global bit lines in a one-to-one correspondence. FIG. 3 is a circuit diagram of a configuration of the latch circuit 51. As shown in FIG. 3, each of the latch circuits 51 has two inverters 52, 53. The input terminal of the inverter 52 is connected to the output terminal of the inverter 53. The output terminal of the inverter 52 is connected to the input terminal of the inverter 53. The junction node of the input terminal of the inverter 52 and the output terminal of the inverter 53 is connected to the corresponding write global bit line. The power supply voltage of the inverters 52, 53 are the negative potential VBB and VPP2 or GND output by the voltage generator circuit 120. Whether the high-voltage side of the power supply voltage is Vcc or GND is determined by a switch element 54.

The write decoder 20 decodes a row address signal, thereby producing a row address decode signal. Then, the write decoder 20 selects any one of the word lines WL0 to WL(4m−1) and select gate lines SG0 to SG(4m−1).

The select gate decoder 30 selects any one of the select gate lines SG0 to SG(4m−1) in a read operation.

Referring to FIG. 4, the configuration of the write decoder 20 and select gate decoder 30 will be explained. The write decoder 20 not only selects any one of the word lines WL0 to WL(4m−1) and applies the positive potential VPP1 to the selected word line but also applies the negative potential VBB to all of the select gate lines SG0 to SG(4m−1). Furthermore, in an erase operation, the write decoder 20 not only applies the negative potential VBB to all of the word lines but also applies the positive potential VPP1 to all of the select gate lines SG0 to SG(4m−1). The select gate decoder 30 selects any one of the select gate lines SG0 to SG(4m−1) in a read operation and applies the positive potential VPP2 to the selected select gate line.

First, the configuration of the select gate decoder 30 will be explained. The select gate decoder 30 includes a row address decode circuit 31 and a switch element group 32. The row address decode circuit 31, which operates on the power supply voltage VPP2 (3V), decodes (i+1)-bit row address signals RA0 to RAi, thereby producing a row address decode signal. The row address decode circuit 31 has NAND circuits 33 and inverters 34 provided for select gate lines SG0 to SG(4m−1) in a one-to-one correspondence. The NAND circuit 33 performs NAND operation on each bit in row address signals RA0 t RAi. Then, the inverter 34 inverts the result of the NAND operation and outputs the inverted value as a row address decode signal.

The switch element group 32 has n-channel MOS transistors 35. The n-channel MOS transistors 35 are provided for select gate lines SG0 to SG(4m−1) in a one-to-one correspondence. The outputs of the inverters 34 are supplied to select gate lines SG0 to SG(4m−1) via the current paths of the n-channel MOS transistors 35. A control signal ZISOG is input to the gates of the n-channel MOS transistors 35. The control signal ZISOG turns off the MOS transistors 35 in a write operation and turns on the MOS transistors 35 in a read operation.

Next, the configuration of the write decoder 20 will be explained. The write decoder 20 includes a row address decode circuit 21 and a switch element group 22. The row address decode circuit 21 decodes (i+1)-bit row address signals RA0 to RAi, thereby producing a row address decode signal. The row address decode signal is supplied to word line WL0 to WL(4m−1). The row address decode circuit 21 includes NAND circuits 23 and inverters 24 provided for word lines WL0 to WL(4m−1) in a one-to-one correspondence. The NAND circuits 23 and inverters 24 operate using the positive voltage VPP1, negative voltage VBB, or 0V as a power supply voltage. The NAND circuit 23 performs NAND operation on each bit in the row address signals RA0 to RAi. Then, the inverter 24 inverts the result of the NAND operation and outputs the result as a row address decode signal.

The switch element group 22 has n-channel MOS transistors 25. The n-channel MOS transistors 25 are provided for select gate lines SG0 to SG(4m−1) in a one-to-one correspondence. One end of the current path of each of the MOS transistors 25 is connected to the corresponding one of the select gate lines SG0 to SG(4m−1). The negative potential VBB1 or positive potential VPP1 is applied to the other end of the current path. A control signal WSG is applied to the gate of the MOS transistor 25. The MOS transistor 25 is turned on by the control signal WSG in a write and an erase operation.

Furthermore, the write decoder 20 also applies a voltage VPW to the semiconductor substrate (well region) in which the memory cell array 10 has been formed. Moreover, the write decoder 20 supplies a voltage to the MOS transistors 13, 16 in the selector SEL. The write decoder 20 further supplies a voltage to the gates of the MOS transistors 12 and to the common junction node of the local bit lines.

The column decoder 40 decodes a column address signal, thereby producing a column address decode signal. In a read operation, the column decoder 40 selects either the MOS transistors 14 or the MOS transistors 15 and supplies a voltage to the gates of the selected transistors. The column decoder 40 further supplies a voltage to the gates of the MOS transistors 11.

In a read operation, the column selector 60 selects any one of the read global bit lines RGBL0 to RGBL(n−1) on the basis of the column address decode signal.

The sense amplifier 70 amplifies the data read from the memory cell MC selected by the select gate decoder 30 and column decoder 40.

The source line driver 80 supplies a voltage to the source lines SL.

The switch group 90 transfers the write data supplied from the CPU 2 to the write circuit 50.

The address buffer 100 holds an address signal supplied from the CPU 2. Then, the address buffer 100 supplies a column address signal CA to the column decoder 30 and a row address signal RA to the write decoder 20, select gate decoder 30, and write circuit 50.

The write state machine 110 controls the operation of each circuit included in the flash memory 3 on the basis of a command signal supplied from the CPU 2, thereby performing timing control in writing, erasing, or reading data, and executing a specific algorithm determined for each operation.

Next, using FIGS. 5 to 9, a plane structure of the memory cell array 10 included in the 2Tr flash memory 3 will be explained. FIG. 5 is a plan view of a part of the memory cell array 10. FIGS. 6 to 9 are plan views showing plane patterns of a first-layer to fourth-layer metal wiring layers, respectively, together with element regions, word lines, and select gate lines. In FIGS. 6 to 9, the regions shown correspond to those in FIG. 5.

As shown in FIGS. 5 to 9, in the semiconductor substrate (p-well region) 200, a plurality of strip-shaped element regions AA extending in a first direction are formed in a second direction perpendicular to the first direction. Strip-shaped word lines WL0 to WL(4m−1) and select gate lines SG0 to SG(4m−1), which extend in the second direction, are formed so as to cross the element regions AA. In the regions where word lines WL0 to WL(4m−1) cross the element regions AA, memory cell transistors MT are formed. In the regions where select gate lines SG0 to SG(4m−1) cross the element regions AA, select transistors ST are formed. Moreover, in the regions where word lines WL0 to WL(4m−1) cross the element regions AA, floating gates (not shown) are formed in such a manner that they are separated from one another on a memory cell transistor basis.

As described above, adjacent memory cells MC have their select gate lines SG or word lines WL adjoining each other. Hereinafter, a group of four columns of element regions AA is referred to as a first element region group AAG1. A region where a column of element regions AA is formed between adjacent first element region groups AAG1 is referred to as a source contact region SCA. The memory cells MC formed in the first element region groups AAG1 are used for storing data. The memory cells MC in the source contact region SCA are dummy memory cells and are not used for storing data. A stitch region SA1 is formed in units of two columns of first element region groups AAG1. In the first embodiment, no element region AA is formed in the stitch region SA1. The width of the stitch region SA1 is equal to the sum of the width of an element region AA and the width of the element isolating region STI formed between element regions AA. On the stitch region SA1, too, word lines WL0 to WL(4m−1) and select gate lines SG0 to SG(4m−1) are formed. However, word lines WL0 to WL4m and select gate lines SG0 to SG(4m−1) existing in the stitch region SA1 do not practically form the memory cells. In the stitch region SA1, a part of each of the select gate lines SG0 to SG(4m−1) is made wider, particularly so as to project toward the adjacent select gate line. The region made wider in the select gate line is referred to as a shunt region SA2. The shunt regions SA2 are provided in select gate line SG0 to SG(4m−1) alternately. Specifically, in a stitch region SA1, a shunt region SA2 is formed in each of the select gate lines SG0, SG2, SG4, . . . . In another stitch region SA1 adjacent to the stitch region, a shunt region SA2 is formed in each of the select gate lines SG1, SG3, SG5, . . . . The select gate lines where no shunt region SA2 is formed are partially removed in the stitch region SA1. Hereinafter, the region obtained by combining a first element region group AAG1 and a source contact region SCA is referred to as a second element region group AAG2.

Figure 6:
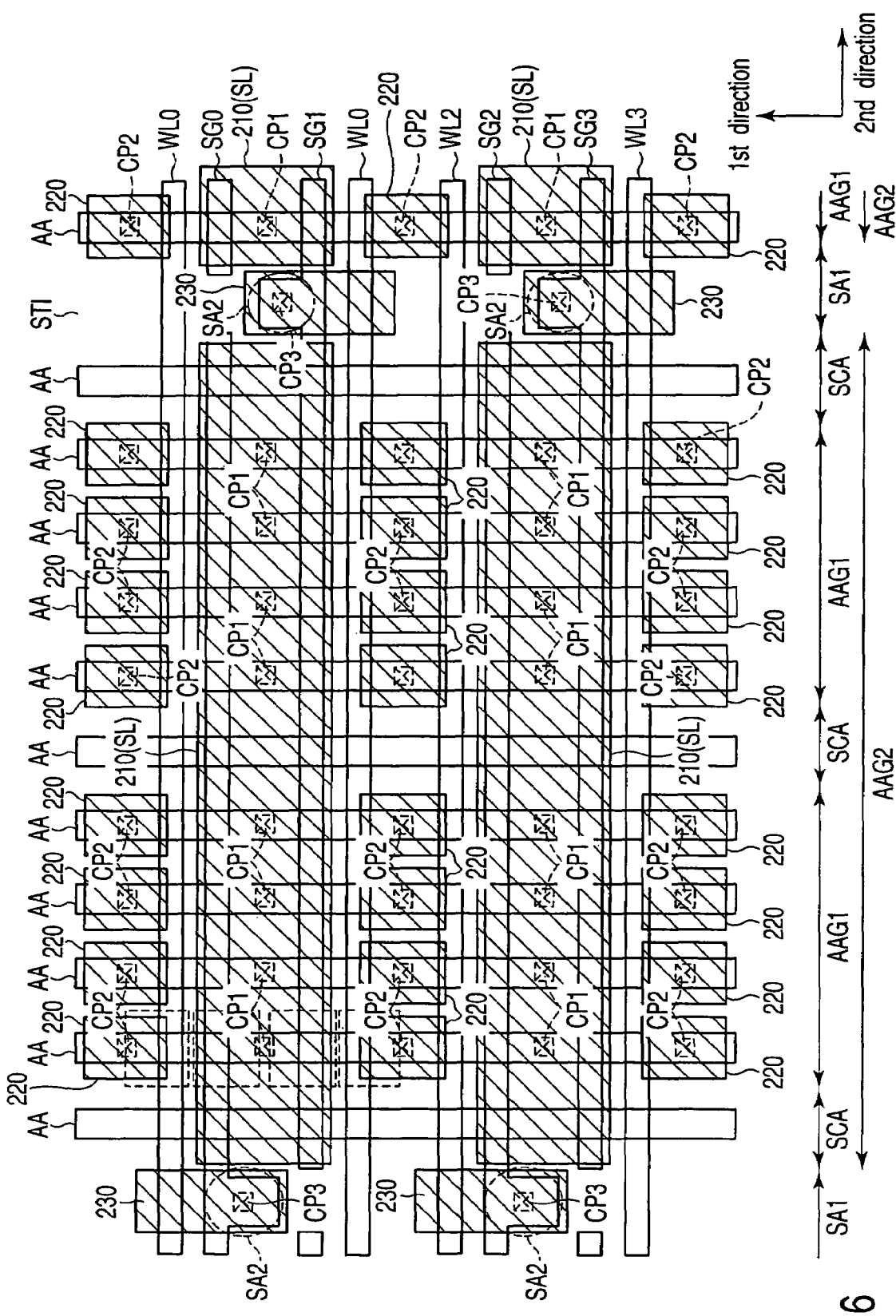
FIG. 6 is a plan view of the memory cell array of the 2Tr flash memory according to the first embodiment, showing a pattern of a first-layer metal wiring layer.

Next, using FIGS. 5 and 6, a pattern of a first-layer metal wiring layer existing on word lines WL0 to WL(4m−1) and select gate lines SG0 to SG(4m−1) will be explained. In FIG. 6, the shaded region is a first-layer metal wiring layer.

As shown in FIG. 6, between adjacent select gate lines SG (between SG0 and SG1, between SG2 and SG3, . . . ), a strip-shaped metal wiring layer 210 extending in the second direction is formed. The metal wiring layer 210 is a part of a source line SL. The metal wiring layers 210 are separated from one another by stitch regions SA1 in its longitudinal direction (or the second direction). That is, the metal wiring layers 210 are independent on a second element region group AAG2 basis. Each of the metal wiring layers 210 is connected to the source region of a select transistor ST by a contact plug CP1. In the first embodiment, in the source contact region SCA, no contact plug CP1 is formed, with the result that the metal wiring layer 210 is not electrically connected to the source region of the memory cell in the source contact region SCA. On the drain region of the memory cell transistor MT in the first element region group AAG1, an insular pattern of metal wiring layer 220 is formed. The metal wiring layers 220 are separated from one another. Each of the metal wiring layers 220 is connected to the drain of the corresponding memory cell transistor MT by a contact plug CP2. Therefore, a plurality of metal wiring layers 220 arranged in the second direction and a plurality of strip-shaped metal wiring layers 210 arranged in the second direction are provided alternately in the first direction. On the shunt region SA2, an island shaped metal wiring layer 230 is formed. The metal wiring layer 230 is connected to the shunt region SA2 of the corresponding select gate line SG by a contact plug CP3. The metal wiring layer 230 is extended in the first direction from the top of the corresponding select gate line SG to the top of the corresponding word line WL.

Next, using FIGS. 5 and 7, a pattern of a second-layer metal wiring layer existing on the first-layer metal wiring layers 210 to 230 will be explained. In FIG. 7, the shaded region is the second-layer metal wiring layer.

As shown in FIG. 7, in a first element region group AAG1, strip-shaped metal wiring layers 240 are formed in the first direction on element regions AA. The metal wiring layers 240, which function as local bit lines LBL0, LBL1, are connected to the first-layer metal wiring layers 220 by contact plugs CP4. In source contact regions SCA, metal wiring layers 250 whose pattern is similar to that of the metal wiring layers 240 are formed. Therefore, the line width of the metal wiring layers 250 is the same as that of the metal wiring layers 240. The metal wiring layers 250 function as part of the source lines SL. The metal wiring layers 250 are connected to the first-layer metal wiring layers 210 by contact plugs CP5. That is, a plurality of metal wiring layers 210 isolated in the first direction are connected to one another by a metal wiring layer 250. In the stitch region SA1, metal wiring layers 260 with an island shape are formed. The metal wiring layers 260 are formed so as to correspond to the first-layer metal wiring layers 230. The shape of a metal wiring layer 260 has almost the same pattern as that of the metal wiring layer 230. The metal wiring layer 260 overlaps with the metal wiring layer 230. The metal wiring layers 260 are connected to the metal wiring layers 230 by contact plugs CP6. While in FIGS. 5 and 7, the contact plugs CP6 are directly above the word lines WL, the present embodiment is not limited to this, as long as the contact plugs CP6 are provided in positions where the metal wiring layers 230 and 260 can be connected.

Figure 8:
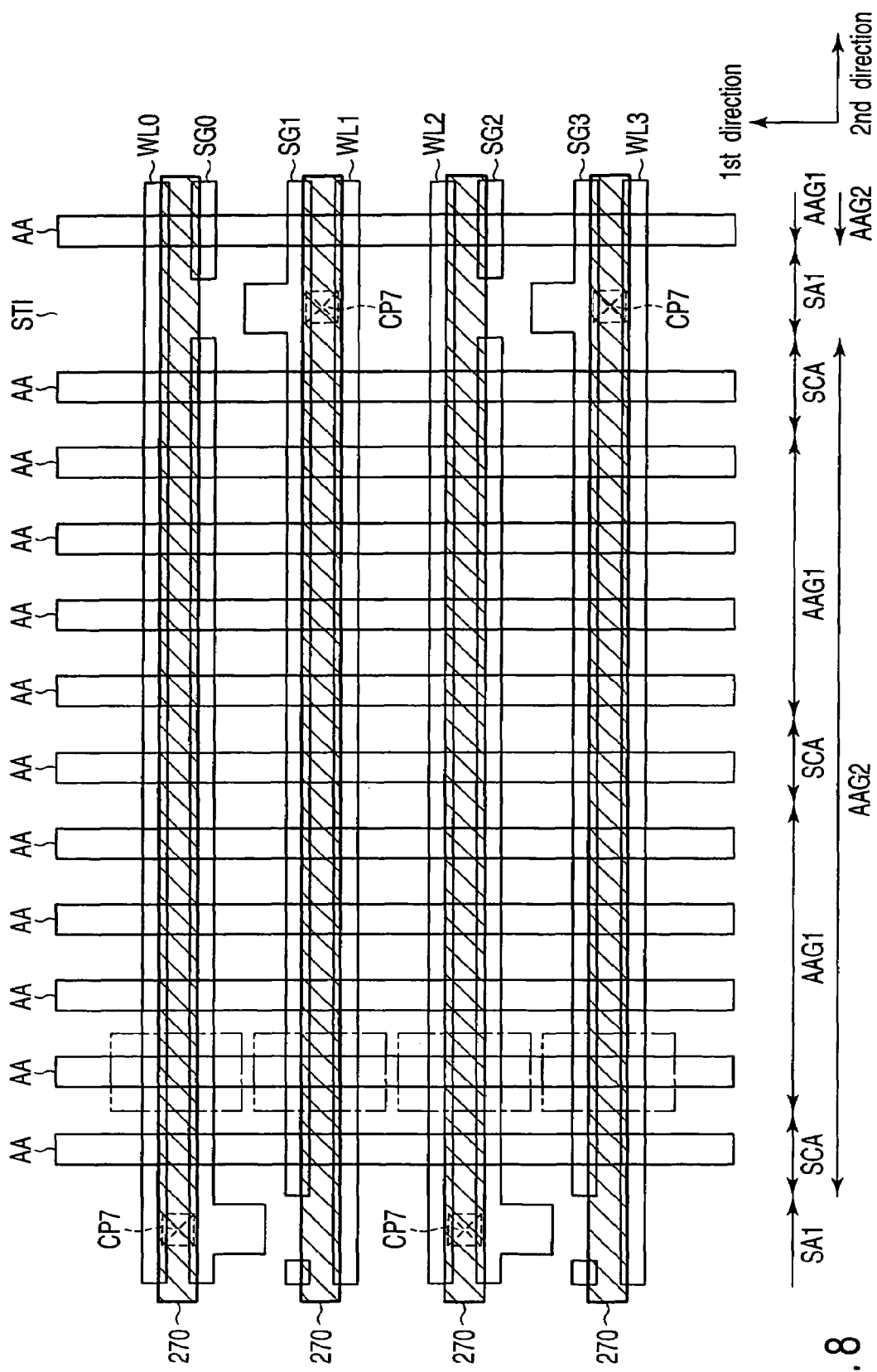
FIG. 8 is a plan view of the memory cell array of the 2Tr flash memory according to the first embodiment, showing a pattern of a third-layer metal wiring layer.

Next, using FIGS. 5 and 8, a pattern of a third-layer metal wiring layer existing on the second-layer metal wiring layers 240 to 260 will be explained. In FIG. 8, the shaded region is the third-layer metal wiring layer.

As shown in FIG. 8, strip-shaped metal wiring layers 270 are formed in the second direction. The metal wiring layers 270 are formed for sets of a word line and a select gate line (a set of WL0 and SG1, a set of WL1 and SG1, . . . ) in a one-to-one correspondence. The metal wiring layers 270 are connected by contact plugs CP7 to the second-layer metal wiring layers 260 electrically connected to the corresponding select gate lines. Specifically, each of the metal wiring layers 260 function as a shunt wire for each of the select gate lines SG0 to SG(4m–1). Each of the metal wiring layers 260 is formed in a region between the central part of a word line WL and the central part of the select gate line SG corresponding to the word line WL. In other words, the metal wiring layer 270 runs through the central part of the memory cell MC. Therefore, the metal wiring layers 270 are arranged at equal intervals in the first direction. The metal wiring layers 270 are connected to each other between second element region groups AAG2 adjoining each other in the second direction.

Figure 9:
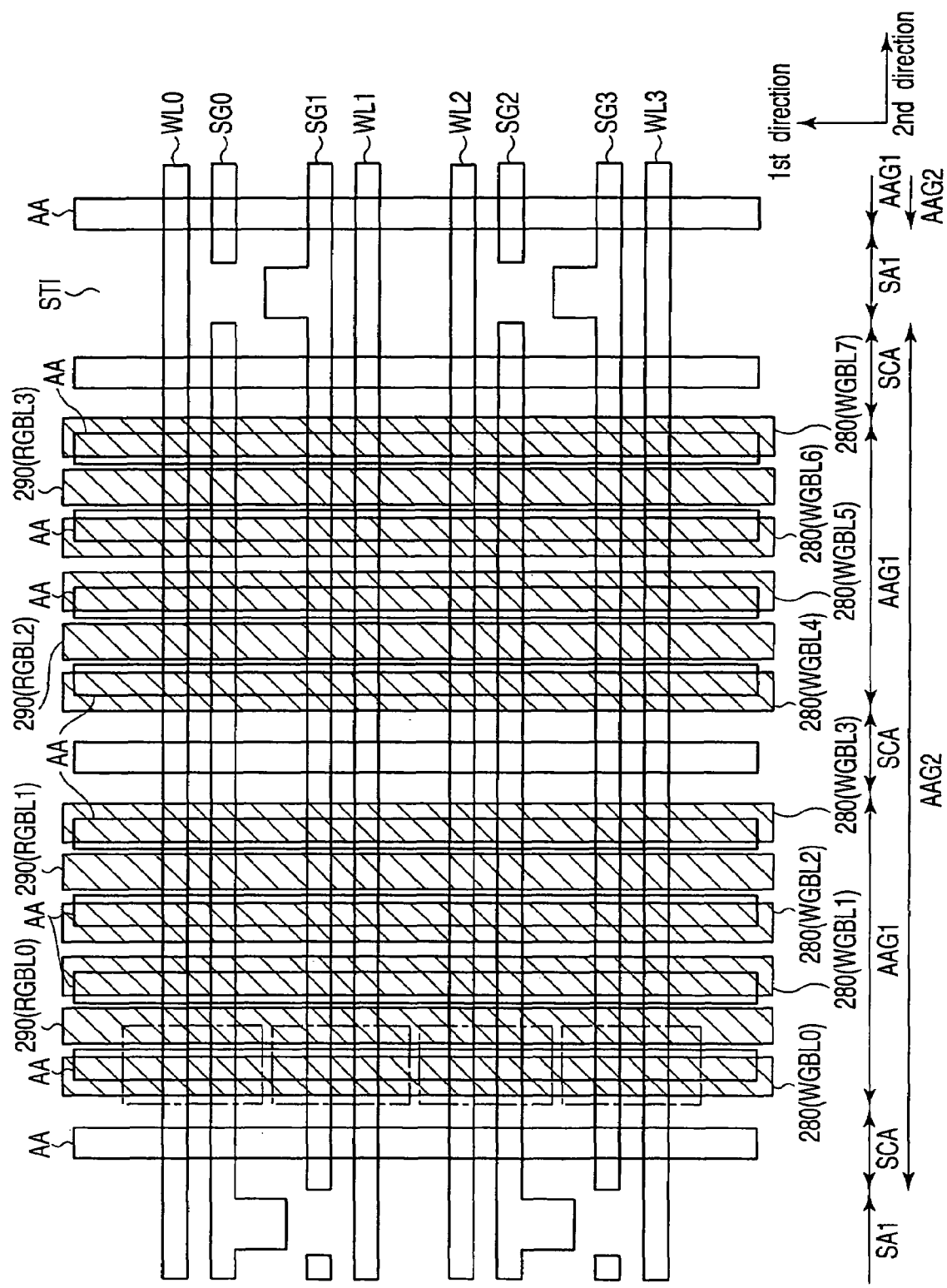
FIG. 9 is a plan view of the memory cell array of the 2Tr flash memory according to the first embodiment, showing a pattern of a fourth-layer metal wiring layer.

Next, using FIGS. 5 and 9, a pattern of a fourth-layer metal wiring layer existing on the third-layer metal wiring layers 270 will be explained. In FIG. 9, the shaded region is the fourth-layer metal wiring layer.

As shown in FIG. 9, strip-shaped metal wiring layers 280, 290 are formed in the first direction. The metal wiring layers 280 function as write global bit lines WGBL(4m–1). The metal wiring layers 290 function as read global bit lines RGBL(2m–1). Two metal wiring layers 280 and one metal wiring layer 290 form a set. The two metal wiring layers 280 are provided for local bit lines LBL0, LBL1, respectively. The metal wiring layer 290 is provided between two metal wiring layers 280 adjacent to each other. The metal wiring layers 280, 290 are connected to the corresponding local bit lines LBL0, LBL1 in the selector (not shown).

Figure 14:
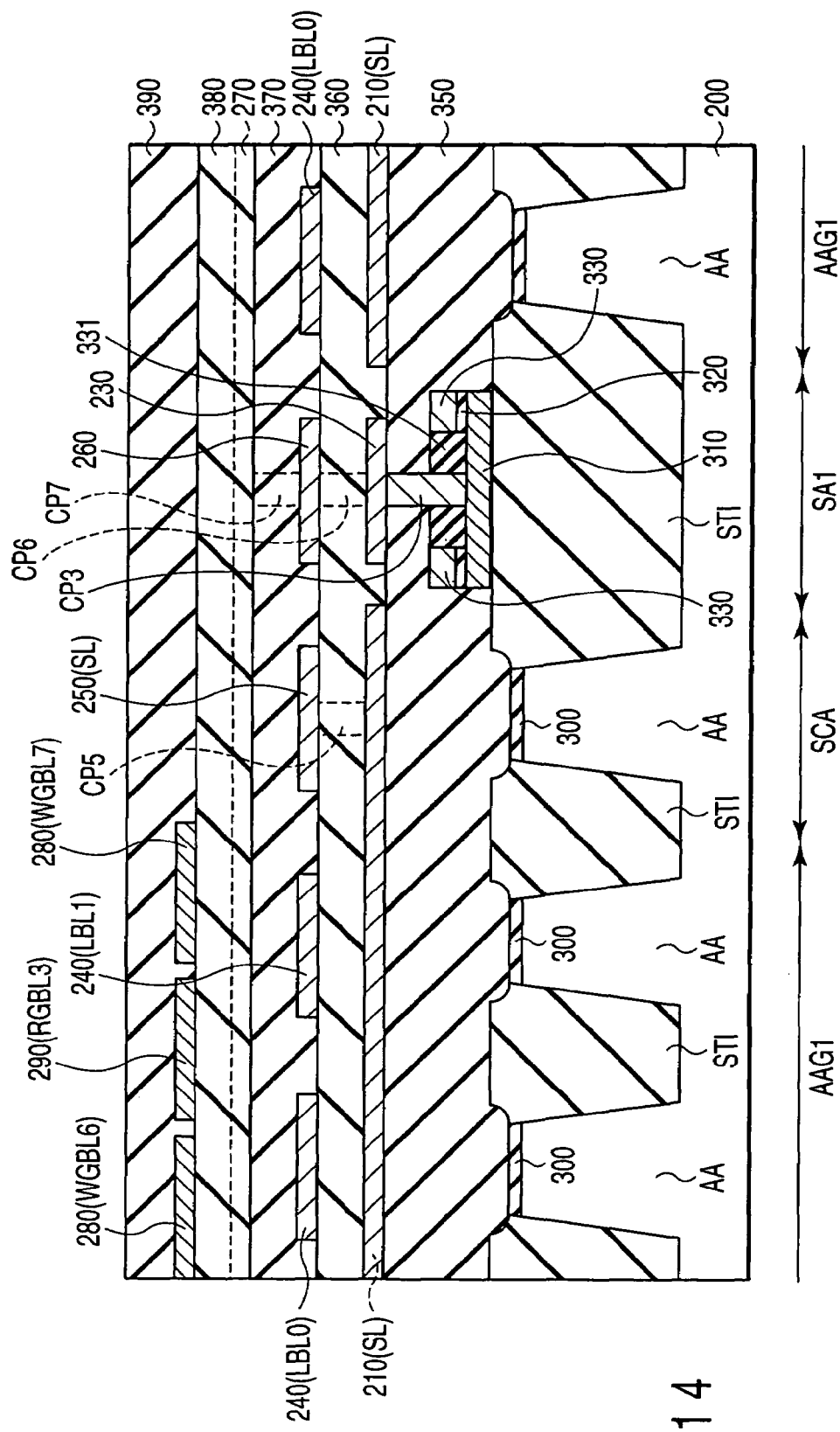
FIG. 14 is a sectional view taken along line 14—14 of FIG. 6.
Figure 15:
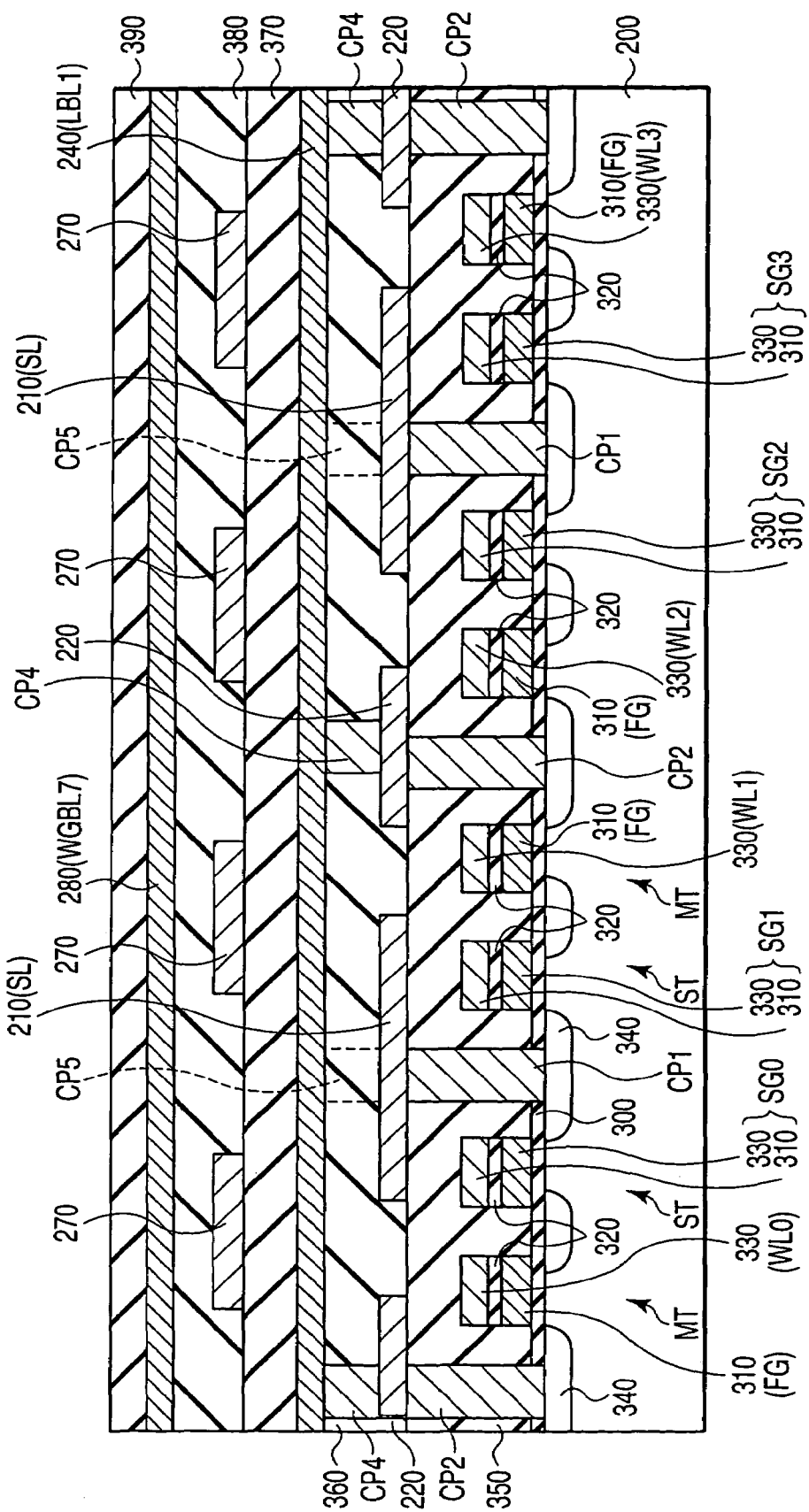
FIG. 15 is a sectional view taken along line 15—15 of FIG. 6.
Figure 16:
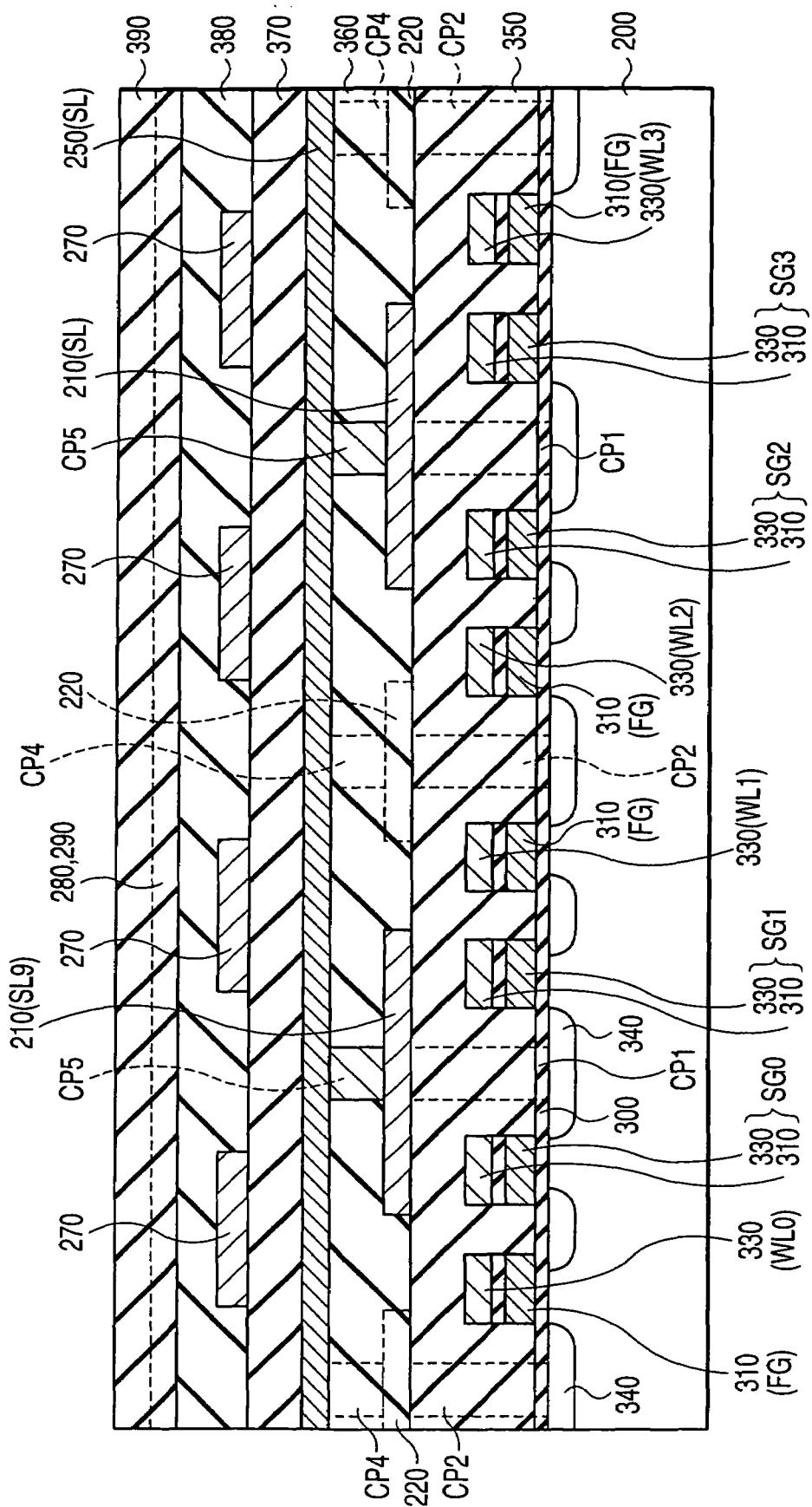
FIG. 16 is a sectional view taken along line 16—16 of FIG. 6.

Next, a sectional structure of the flash memory configured as described above will be explained. Using FIGS. 10 to 16, a sectional structure of the second element region group AAG2 will be explained. FIGS. 10 to 14 are sectional views taken along line 10—10, along line 11—11, along line 12—12, along line 13—13, and along line 14—14 in FIG. 5, respectively. FIGS. 15 and 16 are sectional views taken along line 15—15 and along line 16—16 in FIG. 6, respectively.

As shown in the figures, in the semiconductor substrate (p-well region) 200, an element isolating region STI is formed. The region surrounded by the element isolating region STI is an element region AA. On the element region AA of the semiconductor substrate 100, a gate insulating film 300 is formed. On the gate insulating film 300, the gate electrodes of a memory cell transistor MT and a select transistor ST are formed. Each of the gate electrodes of the memory cell transistor MT and select transistor ST includes a polysilicon layer 310 formed on the gate insulating film 300, an inter-gate insulating film 320 formed on the polysilicon layer 310, and a polysilicon layer 330 formed on the inter-gate insulating film 320. The inter-gate insulating film 320 is made of, for example, a silicon oxide film, or an ON film, NO film, or ONO film having a stacked structure of a silicon oxide film and a silicon nitride film.

Figure 10:
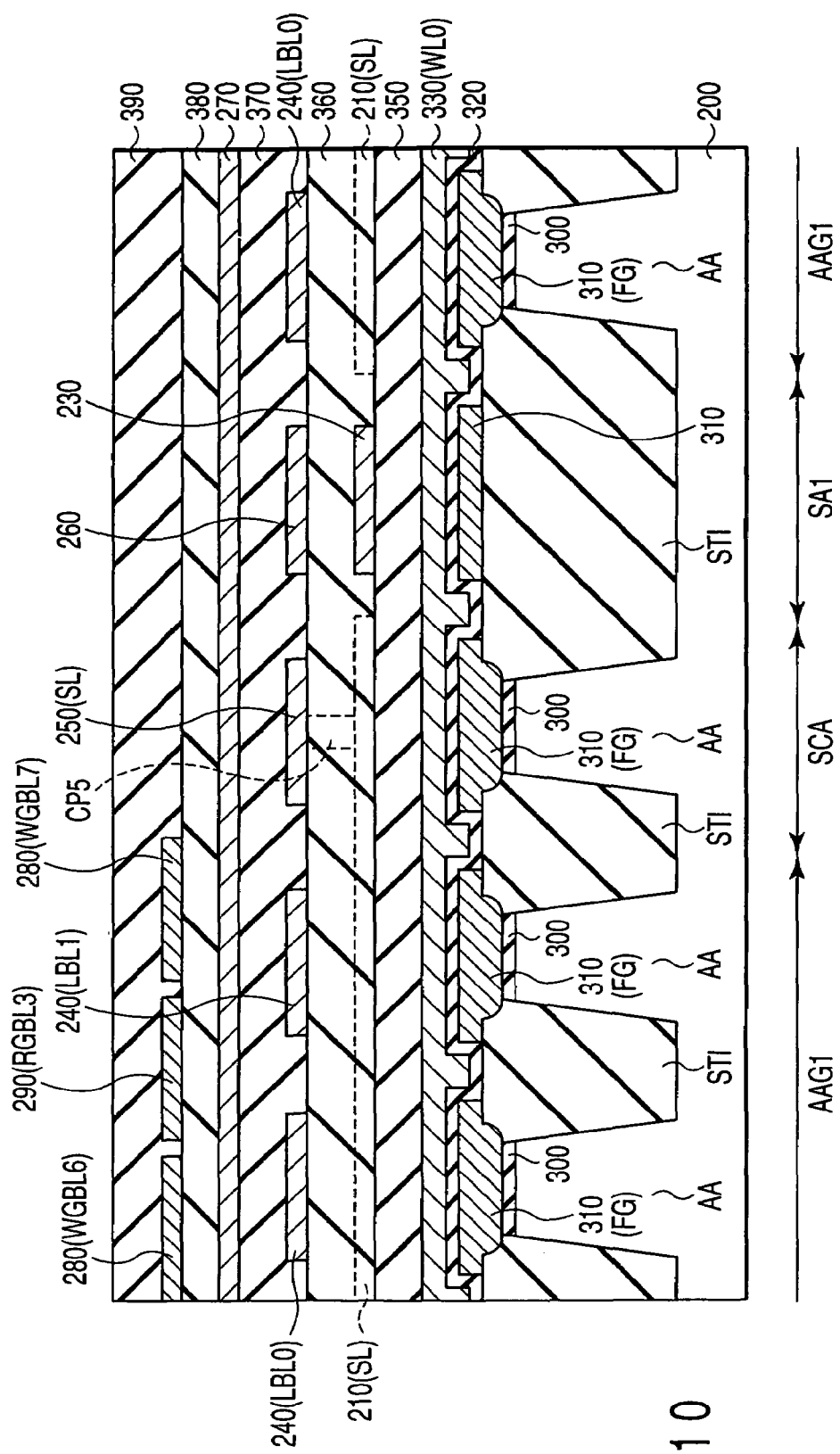
FIG. 10 is a sectional view taken along line 10—10 of FIG. 6.
Figure 13:
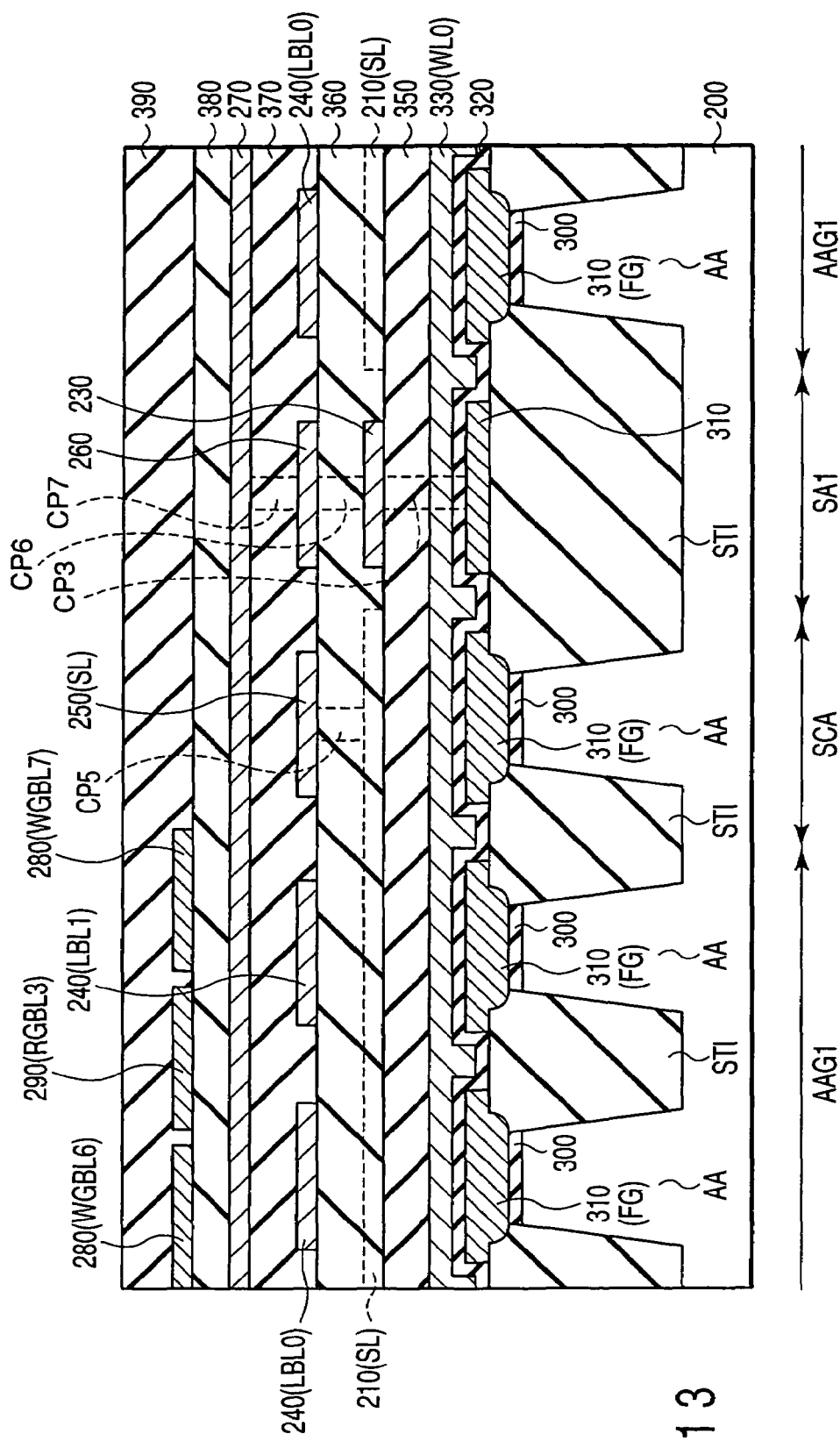
FIG. 13 is a sectional view taken along line 13—13 of FIG. 6.

As shown in FIGS. 10 and 13, in a memory cell transistor MT, the polysilicon layers 310, which are separated from each other between adjacent element regions AA, function as floating gates. The polysilicon layers 330, which are connected to one another between adjacent element regions AA, function as control gates (or word lines WL).

Figure 11:
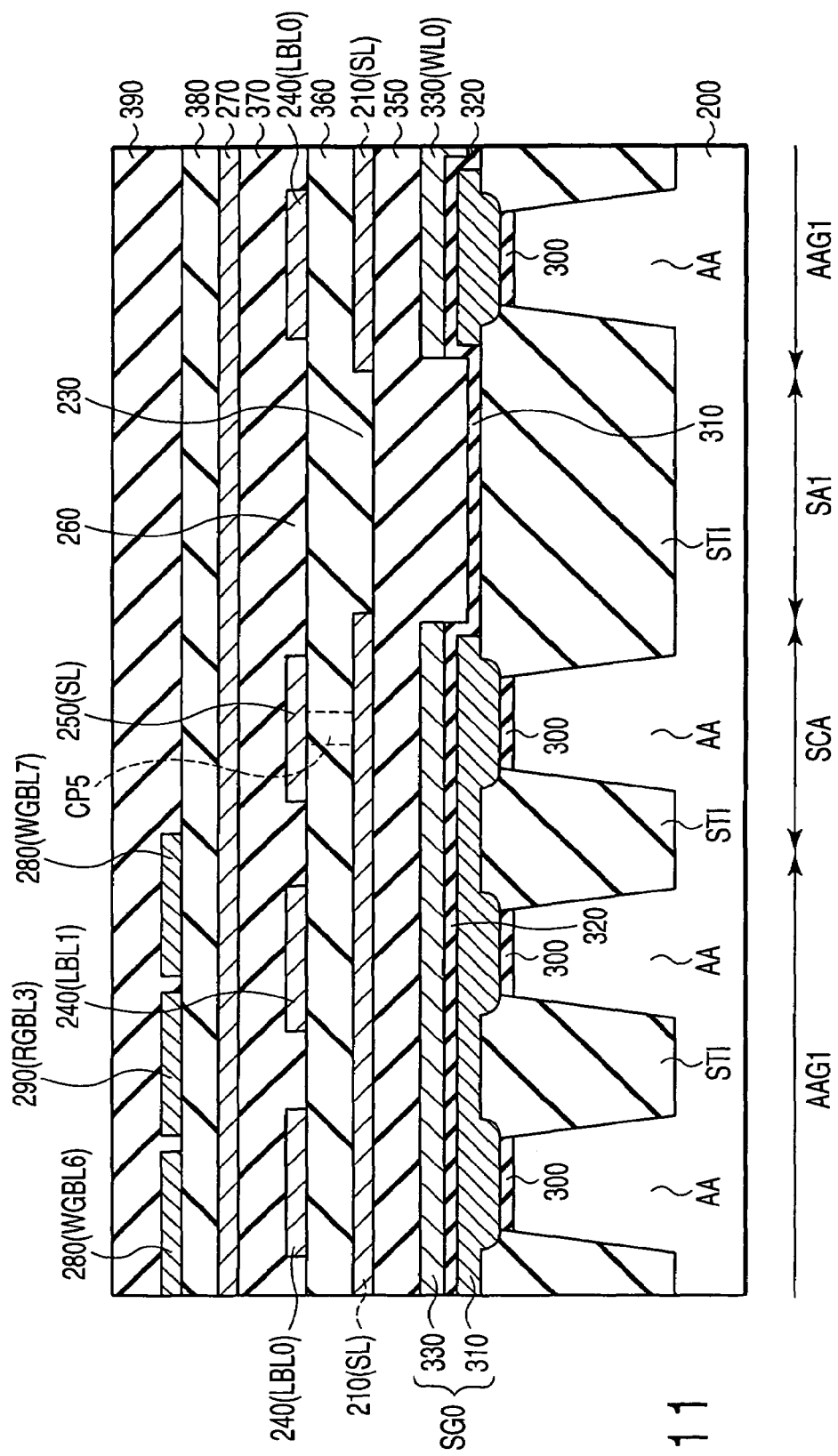
FIG. 11 is a sectional view taken along line 11—11 of FIG. 6.
Figure 12:
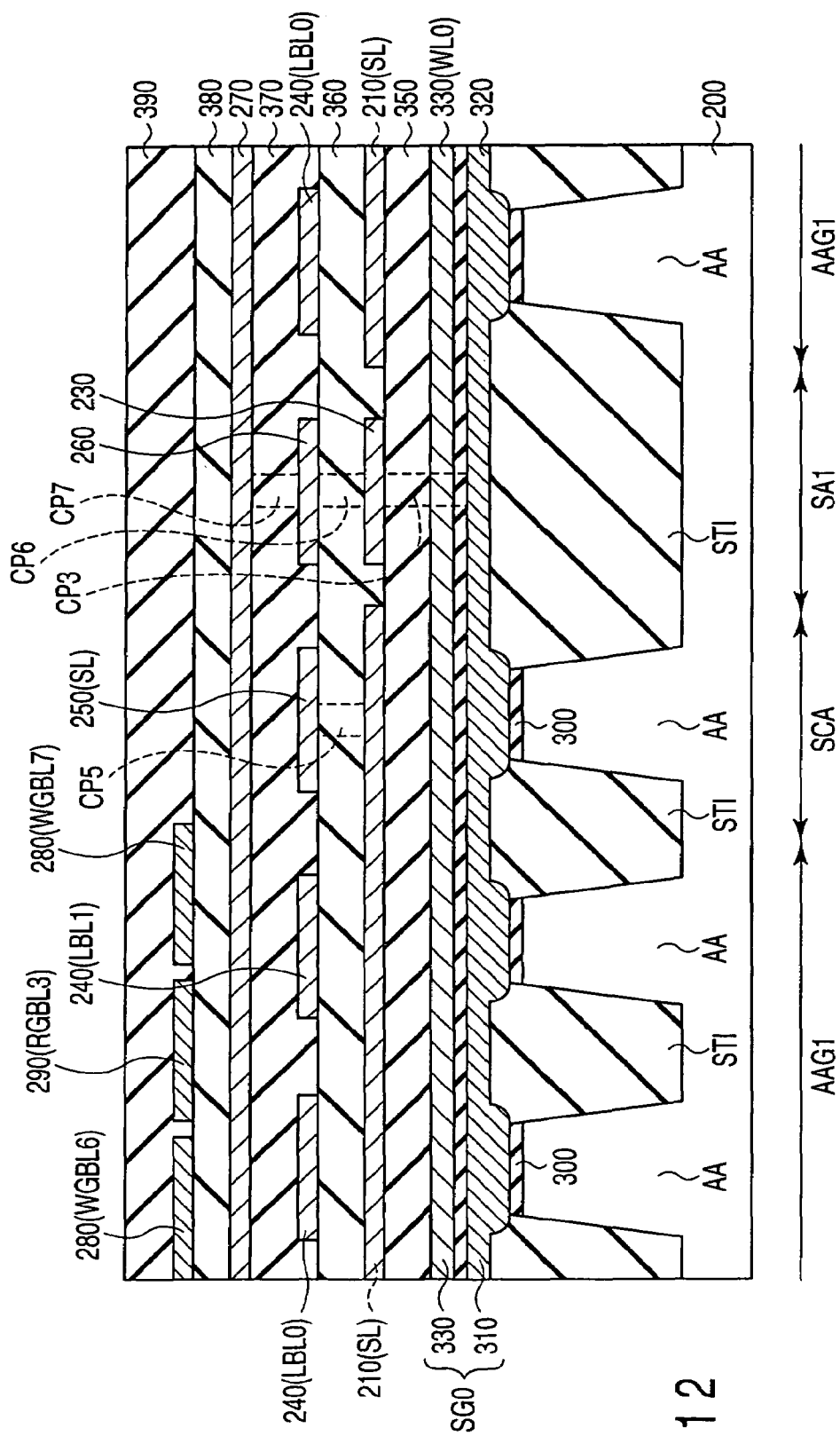
FIG. 12 is a sectional view taken along line 12—12 of FIG. 6.

As shown in FIGS. 11 and 12, in a select transistor ST, the polysilicon layers 310 are connected to one another between adjacent element regions AA, and the polysilicon layers 320 are connected to one another between adjacent element region AA. Then, the polysilicon layers 310, 330 function as select gate lines SG. Of these polysilicon layers, only the polysilicon layers 310 practically function as select gate lines, which will be explained in detail later.

At the surface of the well region 200 between adjacent gate electrodes, an impurity diffused layer 340 is formed. The impurity diffused layer 340 is shared by adjacent transistors.

As described above, a memory cell MC including a memory cell transistor MT and a select transistor ST is formed so as to have the following relationship. In adjacent memory cells MC, their select transistors ST or their memory cell transistors MT are adjacent to each other. The adjacent select transistors or memory cell transistors share the impurity diffused layer 340. Therefore, two adjacent memory cells MC, MC, when their select transistors ST are adjacent to each other, are arranged symmetrically with the impurity diffused layer 340 shared by the two select transistors ST, ST. Conversely, when their memory cell transistors MT are adjacent to each other, two adjacent memory cells MC, MC are arranged symmetrically with the impurity diffused layer 340 shared by the two memory cell transistors MT, MT.

Then, on the well region 200, an interlayer insulating film 350 is formed so as to cover the memory cell transistor MT and select transistor ST. In the interlayer insulating film 350, a contact plug CP1 reaching the impurity diffused layer (or source region) 340 shared by two select transistors ST, ST is formed. On the interlayer insulating film 350, a metal wiring layer 210 connected to the contact plug CP1 is formed. The metal wiring layer 210 functions as a source line SL. Further in the interlayer film 350, a contact plug CP2 reaching the impurity diffused layer (or drain region) 340 shared by two memory cell transistors MT, MT is formed. On the interlayer insulating film 350, a metal wiring layer 220 connected to the contact plug CP2 is further formed.

On the interlayer insulating film 350, an interlayer insulating film 360 is formed so as to cover the metal wiring layers 210, 220. In the interlayer insulating film 360, a contact plug CP4 reaching the metal wiring layer 220 is formed (see FIG. 15). On the interlayer insulating film 360, a metal wiring layer 240 connected commonly to a plurality of contact plugs CP4 is formed (see FIG. 15). The metal wiring layer 240 functions as local bit lines LBL0, LBL1. In the interlayer insulating film 360, a contact plug CP5 reaching the metal wiring layer 210 is formed (see FIG. 16, source contact region SCA). On the interlayer insulating film 360, a metal wiring layer 250 is formed which connects a plurality of contact plugs CP5 to one another in the bit line direction (see FIG. 16, source contact region SCA). The metal wiring layer 250 functions as a part of the source line SL.

On the interlayer insulating film 360, an interlayer insulating film 370 is formed so as to cover the metal wiring layers 240, 250. On the interlayer insulating film 370, a metal wiring layer 270 is formed. The metal wiring layer 270 functions as a shunt wire for a select gate line. The interconnections of the metal wiring layers 270 are arranged at equal intervals. On the interlayer insulating film 370, an interlayer insulating film 380 is formed so as to cover the metal wiring layer 270.

On the interlayer insulating film 380, metal wiring layers 280, 290 functioning as a write global bit line and a read global bit line are formed. In addition, an interlayer insulating film 390 is also formed.

Figure 17:
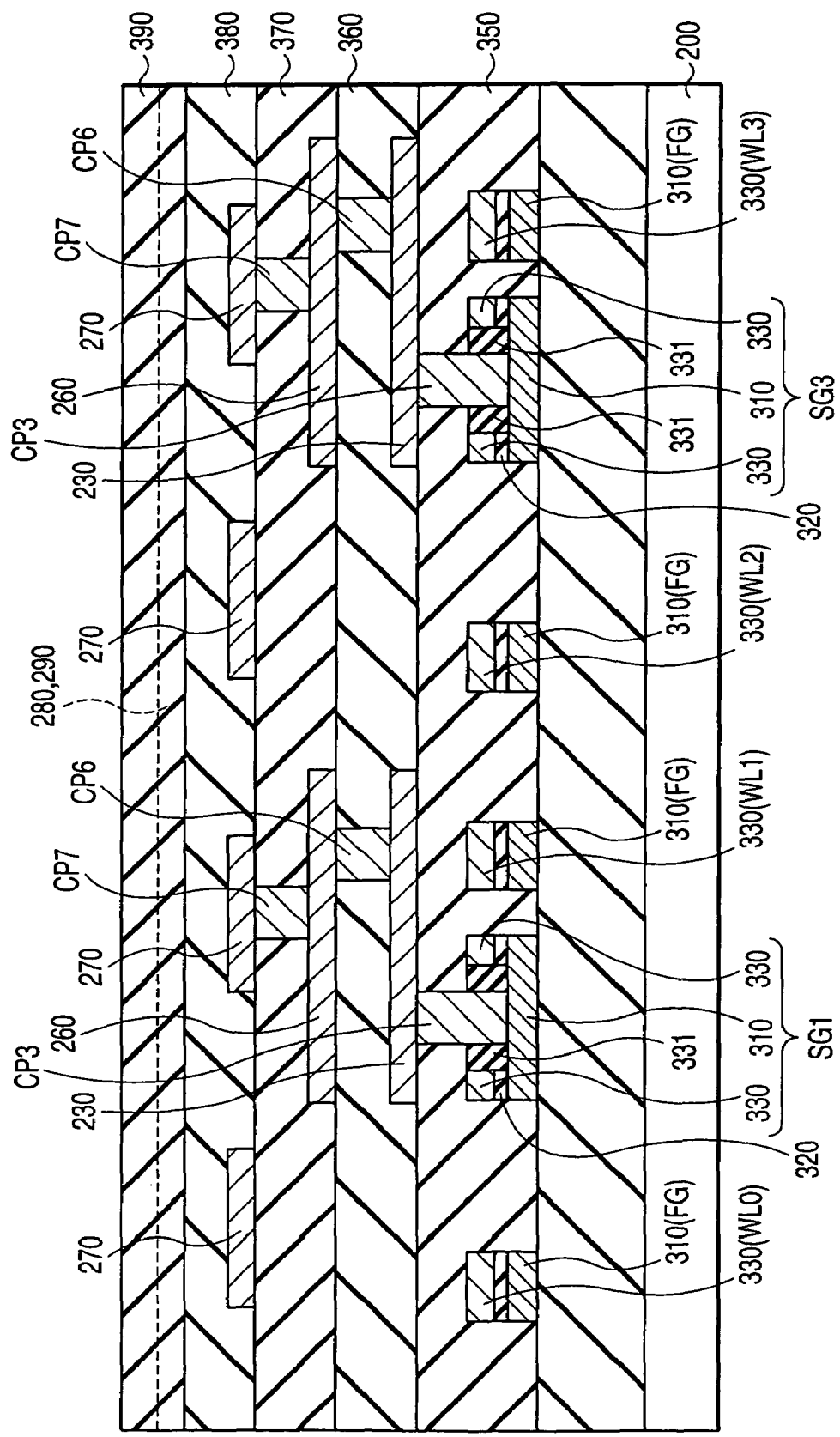
FIG. 17 is a sectional view taken along line 17—17 of FIG. 6.

Next, using FIGS. 11, 14, and 17, a sectional structure of a stitch region SA1 will be explained. FIG. 17 is a sectional view taken along line 17—17 of FIG. 5.

As shown in the figures, an element isolating region STI is formed in the p-well region 200. On the element isolating region STI, the floating gate 310 and control gate 330 of a memory cell transistor MT are formed. The polysilicon layers 310, 330 have been removed from the select gate lines which have no shunt region SA2 in the stitch region SA1 (see FIG. 11). That is, the select gate lines are divided by the stitch regions SA1. In each of the select gate lines which have a shunt region SA2, a stacked gate including the polysilicon layers 310, 330 has been formed even in the stitch region. The stacked gate has been formed so as to project toward the adjacent select gate lines (see FIG. 17). As shown in FIGS. 14 and 17, in the shunt region SA2, the polysilicon layer 330 and inter-gate insulating film 320 are removed, thereby exposing the polysilicon layer 310. Then, a contact plug CP3 is formed so as to contact the top of the polysilicon layer 310 in the region. An insulating film 331 electrically isolates the contact plug CP3 from the polysilicon layer 330 (see FIGS. 14 and 17). The contact plug CP3 is formed from the surface of the interlayer insulating film 350 so as to reach the polysilicon layer 310.

The metal wiring layer 230 has been formed on the interlayer insulating film 350. The metal wiring layer 230 is extended so as to cover not only the top of the gate electrode of the corresponding select transistor ST but also the top of the stacked gate electrode of the memory cell transistor MT corresponding to the select transistor (see FIG. 17). Then, the metal wiring layer 230 is connected to the contact plug CP3 connected to the corresponding select transistor ST. On the interlayer insulating film 350, an interlayer insulating film 360 is formed so as to cover the metal wiring layer 230. In the interlayer insulating film 360, a contact plug CP6 reaching the metal wiring layer 230 is formed. On the interlayer insulating film 360, the metal wiring layer 260 connected to the contact plug CP6 has been formed. The metal wiring layer 260 is also extended so as to cover not only the top of the gate electrode of the corresponding select transistor ST but also the top of the stacked gate electrode of the memory cell transistor MT corresponding to the select transistor ST (see FIG. 17). On the interlayer insulating film 360, an interlayer insulating film 370 is formed. In the interlayer insulating film 370, a contact plug CP7 reaching the metal wiring layer 260 is formed. As shown in FIG. 17, the contact plug CP7 is located in the central part of a memory cell. In other words, the contact plug CP7 is formed in a region between the central part of the stacked gate of the memory cell transistor MT and the central part of the gate electrode of the select transistor ST. On the interlayer insulating film 370, a metal wiring layer 270 connected to the contact plug CP7 is formed. As shown in FIG. 17, a plurality of metal wiring layers 270 are arranged at equal intervals on the interlayer insulating film 370. Then, on the interlayer insulating film 370, interlayer insulating films 380, 390 are formed so as to cover the metal wiring layers 270.

Figure 18:
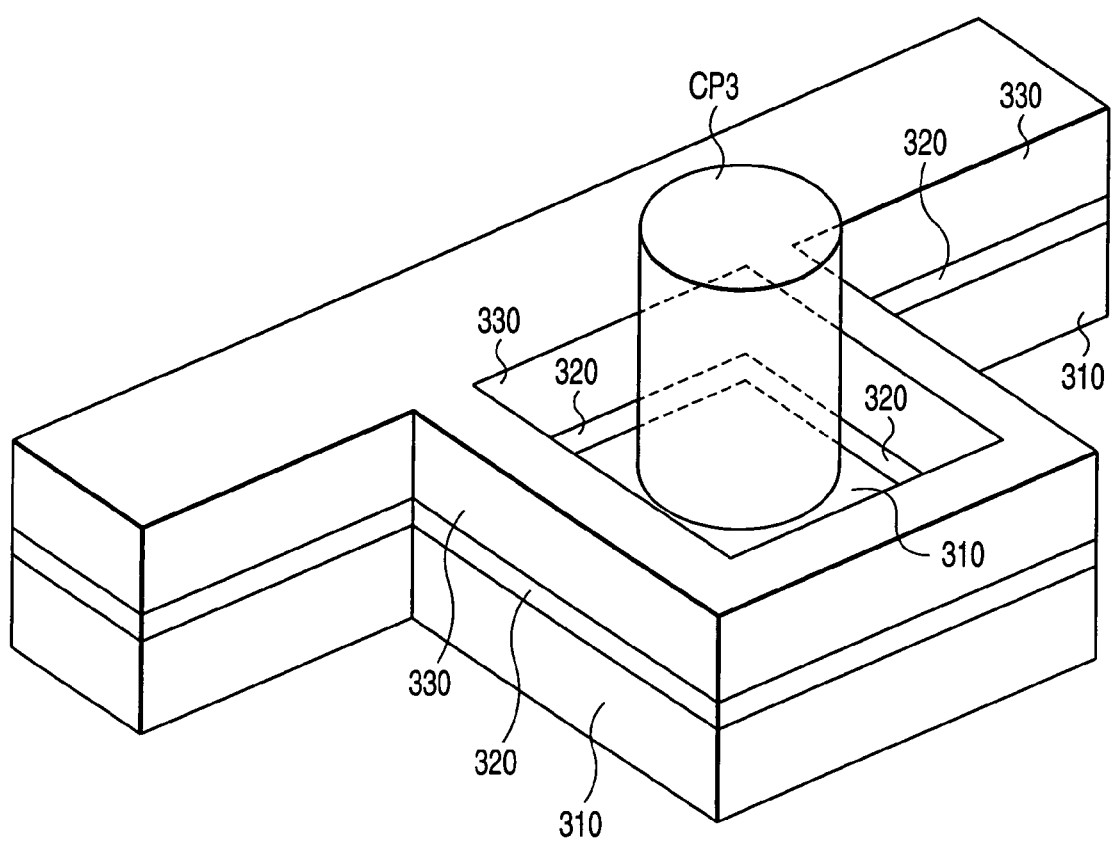
FIG. 18 is a perspective view of a shunt region of the memory cell array included in the 2Tr flash memory of the first embodiment.

FIG. 18 is a perspective view of a shunt region SA2. As shown in FIG. 18, a stacked gate structure forming a select gate line is made wider in part. Then, the polysilicon layer 330 and inter-gate insulating film 320 in a part of the wider region are removed, thereby exposing the polysilicon layer 310. A contact plug CP3 is formed so as to touch the exposed polysilicon layer 310. The contact plug CP3 is electrically isolated from the polysilicon layer 330. That is, the polysilicon layer 330 is electrically isolated from the shunt wire 270.

Next, the operation of the 2Tr flash memory configured as described above will be explained.

<Write Operation>

Data is written simultaneously into all of the memory cells connected to any one of the word lines. That is, data is written in pages. Either "0" data or "1" data is written, depending on whether electrons are injected into the floating gate of the memory cell transistor MT. Electrons are injected into the floating gate by Fowler-Nordheim (FN) tunneling.

First, in FIG. 1, write data ("1" or "0") is input from the CPU 2. Then, the write data is input via the switch group 90 to each of the latch circuits 51 of the write circuit 50. If "1" data is stored in the latch circuit 51, the output of the latch circuit 51 goes to the high-voltage side, or 0V. Conversely, if "0" data is stored in the latch circuit 51, the output of the latch circuit 51 goes to the low-voltage side, or VBB (−6V). These voltages are applied to the corresponding write global bit lines WGBL.

Then, the write decoder 20 not only selects any one of the word lines WL0 to WL(4m−1) but also turns off the MOS transistor 12. To the selected word line, VPP1 (10V) is applied. In addition, the write decoder 20 applies the negative voltage VBB to all of the select gate lines SG0 to SG(4m−1). As a result, all of the select transistors ST are turned off.

Furthermore, the write decoder 20 turns on the MOS transistors 13, 16 in the selector SEL corresponding to the memory cell block BLK including the selected word line. As a result, the write global bit line WGBL and the local bit line LBL are connected electrically. However, the MOS transistors 13, 16 in the selectors SEL corresponding to the memory cell blocks BLK not including the selected word line are turned off. On the other hand, the column decoder 40 turns off the MOS transistors 14, 15 in all of the selectors SEL. Thus, the read global bit lines RGBL are isolated electrically from the local bit lines LBL. Moreover, the write decoder 20 sets the potential VPW of the p-well region in which memory cells have been formed to VBB.

As a result, a potential corresponding to "1" data or "0" data is applied from the write global bit line to the local bit line LBL of the memory cell block BLK including the selected word line via the MOS transistors 13, 16 in the selector SEL. The potential is applied to the drain region of the memory cell transistor MT via the contact plug CP2. Then, VPP1 is applied to the selected word line WL, 0V is applied to the drain region of the memory cell MC into which "1" data is to be written, and VBB is applied to the drain region of the memory cell MC into which "0" data is to be written. Therefore, since the potential difference (10V) between the gate and drain of the memory cell MC into which "1" data is to be written is insufficient, no electron is injected into the floating gate, with the result that the memory cell MC keeps the negative threshold value. On the other hand, since the potential difference between the gate and drain of the memory cell MC into which "0" data is to be written is large (16V), electrons are injected into the floating gate by FN tunneling, with the result that the threshold value of the memory cell MC changes to positive.

Figure 19:
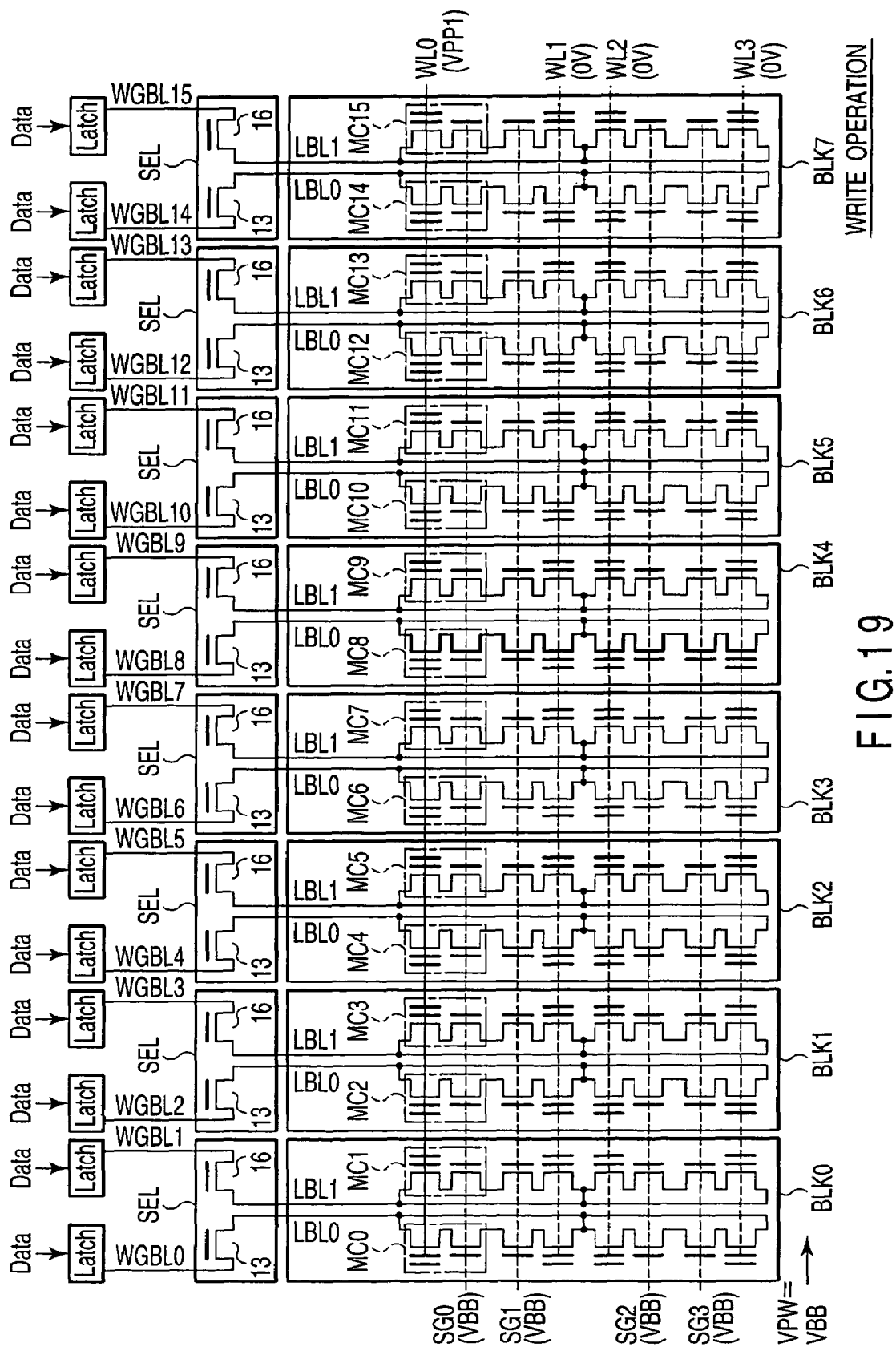
FIG. 19 is a circuit diagram of the memory cell array included in the 2Tr flash memory of the first embodiment, which helps explain a write operation.

In this way, the memory cells are written into. FIG. 19 is a circuit diagram to help explain the way the data is written into the memory cells MCs connected to word line WL0. There are eight memory cell blocks BLK in the word line direction. The eight memory cell blocks BLK which include word line WL0 are referred to as BLK0 to BLK7. The memory cells MC connected to word line WL0 are referred to as MC0 to MC15 in sequence.

As shown in FIG. 19, the data to be written into the memory cells MC0 to MC15 are written into the corresponding latch circuits 51. Then, the MOS transistors 13, 16 in the selectors SEL are turned on, thereby connecting the write global bit lines WGBL0 to WGBL15 to the local bit lines LBL0, LBL1. As a result, the potential (0V or VBB) corresponding to the write data is applied to the drain regions of the memory cells MC0 to MC15. Since the memory cell blocks excluding the memory cell blocks BLK0 to BLK7 are separated electrically from the write global bit lines WGBL0 to WGBL15, they cannot be seen from the write global bit lines WGBL0 to WGBL15.

Then, VPP1 is applied to word line WL0 and the other word lines WL0 to WL3 are set to GND. As a result, the data held in the latch circuits 51 are written simultaneously into all of the memory cells MC0 to MC15 connected to word line WL0.

<Read Operation>

In a read operation, data can be read simultaneously from a plurality of memory cells connected to any one of the word lines. Data is read from one memory cell MC per block.

First, in FIG. 1, the select gate decoder 30 selects any one of the select gate lines SG0 to SG(4m−1). The select gate decoder 30 applies VPP2 (3V) to the selected select gate line. The unselected select gate lines are all made 0V. Thus, the select transistor ST connected to the selected select gate line is turned on, whereas the select transistors ST connected to the unselected select gate lines are tuned off. In addition, the write decoder 20 not only applies 0V to all of the word lines WL0 to WL(4m−1) but also turns off the MOS transistor 12. The source line driver 80 makes the potential of the source line 0V. In addition, the potential of the p-well region 202 is also made 0V.

Furthermore, the column decoder 40 turns on one of the MOS transistors 14, 15 in the selector SEL corresponding to the memory cell block BLK including the selected select gate line. As a result, read global bit lines RGGL0 to RGBL(n−1) are connected to local bit line LBL0 or LBL1 electrically. The MOS transistors 14, 15 in the selectors SELs corresponding to the memory cell blocks BLK not including the selected select gate line are turned off. The write decoder 20 turns off the MOS transistors 13, 16 in all of the selectors SEL. As a result, the write global bit lines WGBL are isolated from the local bit lines LBL electrically. The column decoder 40 turns on the MOS transistor 11.

As a result, local bit line LBL0 or LBL1 is electrically connected to the sense amplifier 70 via the MOS transistor 14 or MOS transistor 15 in the selector SEL, read global bit lines RGBL0 to RGBL(n−1), and column selector 60.

Then, for example, about 1V is supplied to read global bit lines RGBL0 to RGBL(n−1). Then, since the memory cell transistor MT in the memory cell MC in which "1" data has been written has a negative threshold voltage, it turns on. Therefore, in the memory cell MC connected to the selected select gate line, current flows from the read global bit line RGBL to the source line SL via the local bit line LBL, memory cell transistor MT, and select transistor ST. On the other hand, since the memory cell transistor MT in the memory cell MC in which "0" data has been written has a positive threshold voltage, it turns off. Thus, no current flows in the read global bit line RGBL.

Figure 20:
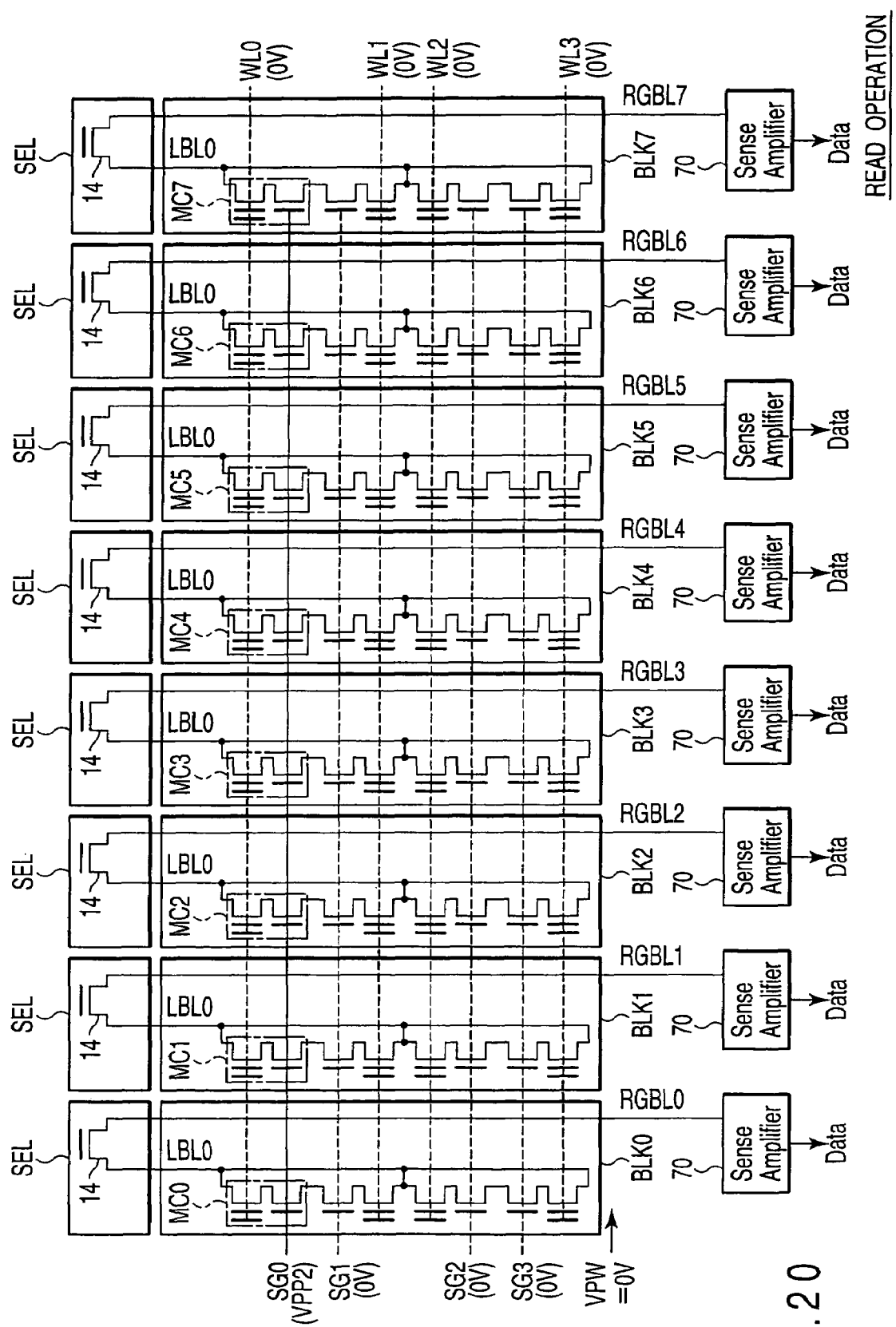
FIG. 20 is a circuit diagram of the memory cell array included in the 2Tr flash memory of the first embodiment, which helps explain a read operation.

As described above, the potential on the read global bit line RGBL varies. The variation is amplified by the sense amplifier 70, thereby carrying out the read operation. FIG. 20 is a circuit diagram showing the way the data is read from the memory cells MC connected to word line WL0 and local bit line LBL0. There are eight memory cell blocks BLK in the word line direction. The eight memory cell blocks BLK which include word line WL0 are referred to as BLK0 to BLK7. The memory cells MC connected to word line WL0 and to local bit line LBL0 are referred to as MC0 to MC7 in sequence.

As shown in FIG. 20, the MOS transistors 14 in the selectors SEL are turned on, thereby connecting each of read global bit lines RGBL0 to RGBL7 to local bit line LBL0. Then, a potential of about 1V is applied to read global bit lines RGBL0 to RGBL7. Since the memory cell blocks excluding the memory cell blocks BLK0 to BLK7 are separated electrically from read global bit lines RGBL0 to RGBL7, they cannot be seen from read global bit lines RGBL0 to RGBL7. Furthermore, in memory cell blocks BLK0 to BLK7, too, since local bit line LBL1 is separated electrically from read global bit lines RGBL0 to RGBL7, the memory cells MCs connected to local bit line LBL1 cannot be seen from read global bit lines RGBL0 to RGBL7.

Then, VPP2 is applied to select gate line SG0 and 0V is applied to the other select gate lines SG1 to SG3. Current flows through the read global bit lines RGBL connected to those of memory cells MC0 to MC7 in which "0" data has been written, with the result that the potentials on the read global bit lines drop. On the other hand, no current flows through the read global bit lines RGBL connected to the memory cells in which "0" data has been written, with the result that the potentials on the read global bit lines remain unchanged. As a result, the data are read simultaneously from all of the memory cells MC0 to MC7 connected to word line WL0 and to local bit line LBL0.

In the above example, the data has been read from the memory cells connected to local bit line LBL0. In a case where the data is read from the memory cells connected to local bit line LBL1, the MOS transistors 15 are turned on and the MOS transistors 14 are turned off in the selectors SEL.

<Erase Operation>

The data in all of the memory cells sharing a well region is erased at the same time. Therefore, in the example of FIG.

1, all the memory cells included in the memory cell array 10 are erased from simultaneously.

In FIG. 1, the write decoder 20 sets all of the word lines WL0 to WL(4m−1) to VBB and the potential of the p-well region 202 to VPP1. As a result, electrons are pulled out of the floating gates of the memory cell transistors of the memory cells MCs into the semiconductor substrate by FN tunneling. Consequently, the threshold voltages of all of the memory cells MCs become negative, thereby erasing the data. At this time, the write decoder 20 applies VBB to all of the select gate lines.

As described above, the flash memory of the first embodiment produces the following effects.

(1) The Operation Speed of the Flash Memory can be Improved (Part 1)

This will be explained using FIGS. 21 and 22. FIGS. 21 and 22 are schematic sectional views of a memory cell. FIG. 21 shows a structure of a conventional memory cell. FIG. 22 is a structure of a memory cell according to the first embodiment.

As shown in FIG. 21, in the conventional structure, the select transistor ST has a multilayer gate structure of polysilicon layers 310, 330. The polysilicon layers 310, 330 are electrically connected to each other. The control gate CG of the memory cell transistor MT adjacent to the select transistor ST has parasitic capacitances Ccs, Csc, Ccf between the polysilicon layer 310 of the select transistor ST and itself, between the polysilicon layer 330 of the select transistor ST and itself, and between the floating gate FG and itself, respectively.

In contrast, as shown in FIG. 22, in the configuration of the first embodiment, although the select transistor ST has a multilayer gate structure as in the conventional one, the polysilicon layers 310, 330 are isolated from each other and the polysilicon layer 330 is kept in an electrically floating state. The control gate CG of the memory cell transistor MT adjacent to the select transistor ST has parasitic capacitances Ccs, Cfc, Ccf between the polysilicon layer 310 of the select transistor ST and itself, between the polysilicon layer 330 of the select transistor ST and itself, and between the floating gate FG and itself, respectively. Moreover, there is a parasitic capacitance of Cfs between the polysilicon layers 310, 330 of the select transistor ST.

When a voltage is applied to the select gate line in a read operation, the voltage is applied to both of the polysilicon layers 330, 310 of the select transistor ST in the conventional structure. Accordingly, the control gate 330 of the memory cell transistor MT is directly influenced by coupling between the polysilicon layer 330, 310 of the select transistor ST.

In the first embodiment, however, the polysilicon layer 330 of the select transistor ST is in the floating state. Therefore, it is only by the polysilicon layer 310 of the select transistor ST that the control gate 330 of the memory cell transistor MT is directly influenced. Naturally, the control gate 330 is also influenced by the polysilicon layer 330 of the select transistor ST, but the magnitude of the influence is small. The reason is that the potential of the polysilicon layer 330 of the select transistor ST varies as a result of coupling with the polysilicon layer 310 of the select transistor ST and the control gate is just influenced by the coupling caused by the variation. That is, it can be said that coupling with the polysilicon layer 330 of the select transistor ST means indirect influence of coupling with the polysilicon layer 310 of the select transistor ST. Therefore, a variation in the potential of the control gate CG becomes smaller than that in coupling with the polysilicon layer 330 whose potential varies as in the conventional structure.

Then, the potential of the floating gate FG varies as a result of coupling with the control gate CG. As described above, since a variation in the potential of the control gate due to coupling with the select gate is smaller in the first embodiment than in the prior art, a variation in the floating gate due to coupling with the control gate can be made smaller.

Figure 23:
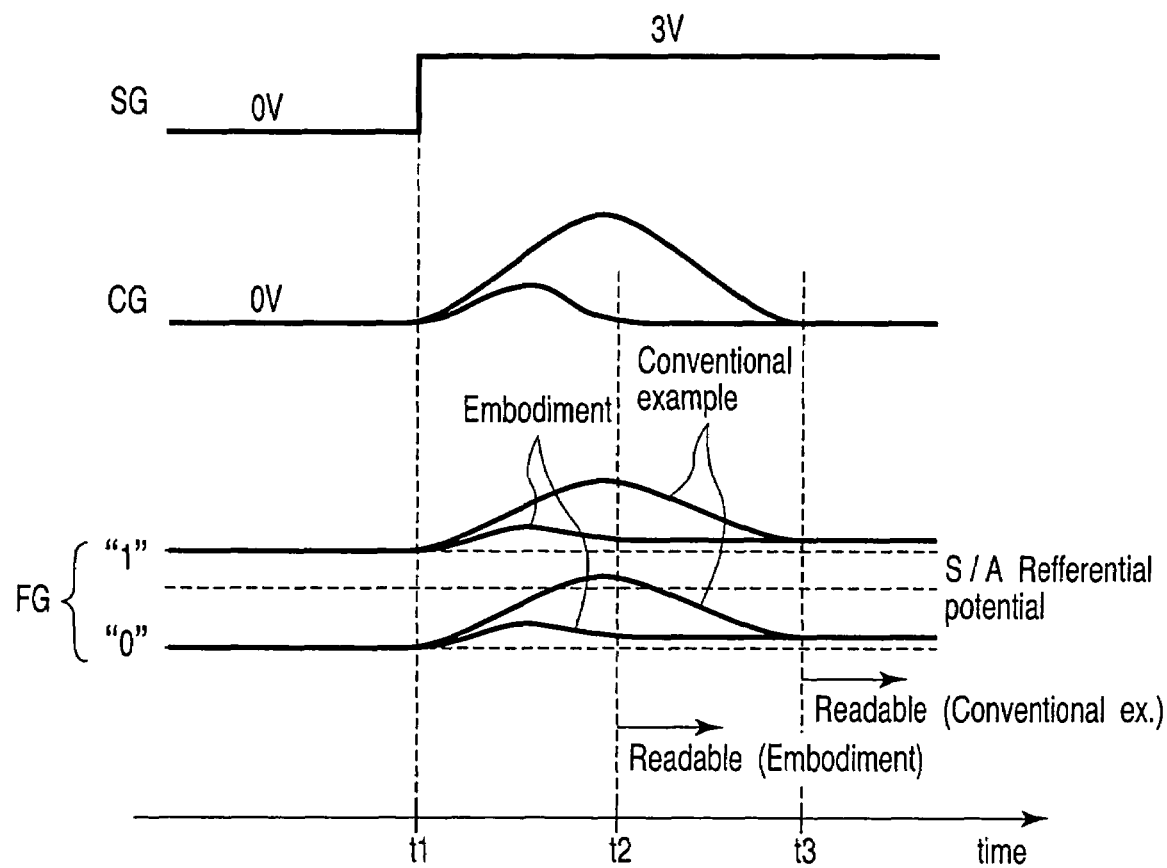
FIG. 23 is a time chart showing the way the select gate line voltage and control gate voltage of each of the 2Tr flash memory of the first embodiment and the conventional flash memory change with respect to time.

FIG. 23 is a timing chart to help explain potential variations on the select gate line, at the control gate, and the floating gate. When the potential on the select gate line fluctuates, the potential of the control gate fluctuates as a result of coupling with the select gate. However, with the configuration of the first embodiment, since the effect of coupling can be made smaller than in the prior art, the potential of the control gate is determined in a shorter time than in the prior art. As shown in FIG. 23, since the effect of coupling is larger in the conventional structure, if the potential of the select gate is fluctuates at time t1, the potential of the control gate is determined at time t3. However, with the configuration of the first embodiment, since the effect of coupling is smaller than in the prior art, the potential of the control gate is determined at time t2 earlier than t3. The same holds true for the potential of the floating gate. In the first embodiment, the potential of the floating gate is determined at time t2.

To actually start a write operation or a read operation, it is necessary that the influence of coupling should subside and the potential should be determined. In this respect, with the configuration of the first embodiment, the potential of the control gate and that of the floating gate can be determined faster than in the conventional structure, which enables a write operation or a read operation to be started faster than in the conventional structure. As a result, the operation speed of the flash memory can be improved.

Although not shown in FIG. 22, there is a parasitic capacitance C (FG-SG) between the polysilicon layers 310, 330 of the select transistor ST and the floating gate. The floating gate is also influenced by the coupling of these parasitic capacitances C (FG-SG). Therefore, in a read operation, the potential of the floating gate does not return to the potential at the time when SG=0V. Since this phenomenon takes place in both a memory cell which holds "0" data and a memory cell which holds "1" data, there is no problem in an actual operation. However, with the first embodiment, after the potential of the control gate CG has been determined, the floating gate FG is influenced only by the coupling with the polysilicon layer 310 of the select transistor ST (in the case of FIG. 21, also influenced by the coupling with the polysilicon layer 330). That is, with the configuration of the first embodiment, C (FG-SG) can be made smaller than in the prior art. Therefore, the potential difference between the potential of the floating gate when SG=0V and the potential when SG is selected and the potential of the floating gate is determined is smaller than in the prior art.

Figure 24:
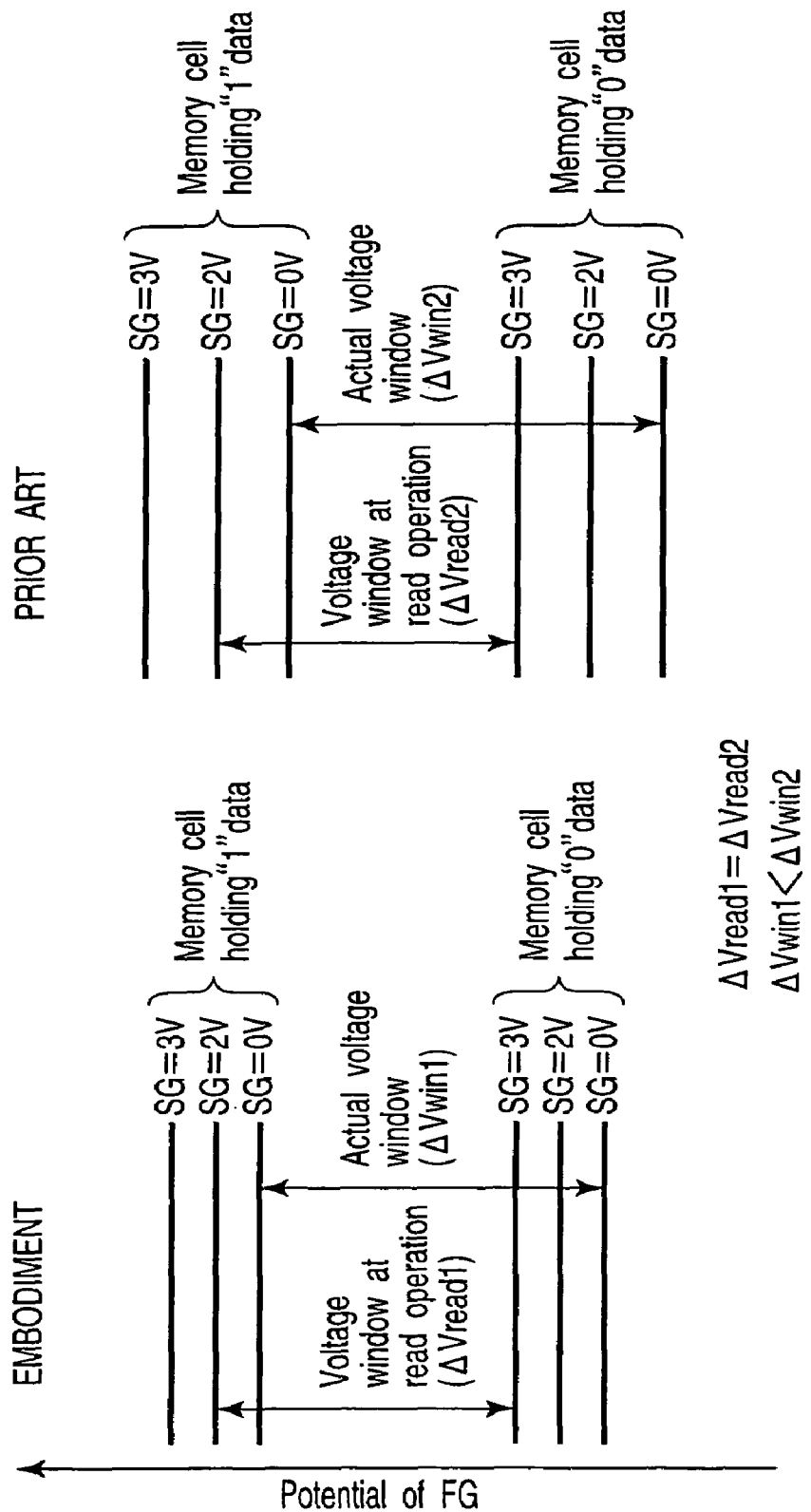
FIG. 24 is a diagram to help explain the voltage relations in the floating gate of each of the 2Tr flash memory of the first embodiment and the conventional flash memory.

As described above, since the effect of a fluctuation in the potential on the select gate line on the floating gate is smaller, the voltage window width can be made smaller. This will be explained using FIG. 24. FIG. 24 shows the potential relations of the floating gate of a memory cell which holds "0" data and of a memory cell which holds "1" data in the cases of the first embodiment and a conventional equivalent. In FIG. 24, the SA reference potential means a threshold voltage for determining whether data is "0" data or "1" data in the sense amplifier.

While the potential applied to the select gate line SG is normally about 3V, it is not necessary constant and can fluctuate due to various causes. Hereinafter, a case where the potential applied to the select gate line SG fluctuates in the range of 2 to 3V will be explained. Naturally, the magnitude of the effect of coupling on the floating gate is larger when SG=3V than when SG=2V. That is, as shown in FIG. 24, the potential of the floating gate FG fluctuates more when SG=2V and SG=3V in that order than when SG=0. However, with the structure of the embodiment, the fluctuation width is smaller than in the prior art, which has been explained above.

When data is written or erased, electrons have to be injected and discharged, while securing a margin to prevent erroneous reading and erroneous writing, taking into account a fluctuation in the potential on the select gate line. For example, a memory cell which holds "1" data has to be turned on when SG=2V and a memory cell which holds "0" data has to be turned off even when SG=3V. The voltage range is referred to as "the voltage window in a read operation". The potential difference between the potential of the floating gate FG of a memory cell into which "0" data has been written when SG=0V and the potential of the floating gate FG of a memory cell into which "1" data has been written in realizing the voltage window in a read operation is referred to as "actual voltage window."

Since the voltage window in a read operation is determined by, for example, the specification or the like of the flash memory, the voltage window (ΔVread1) in a read operation in the conventional configuration has the same potential difference as the voltage window (ΔVread2) in a read operation in the first embodiment, if their specifications are the same. In the conventional configuration, to realize the voltage window in the same read operation results in an increase in the actual voltage window (ΔVwin2), since a fluctuation in the potential of the floating gate is large due to a fluctuation in the potential on the select gate line. However, in the first embodiment, the potential of the floating gate is less liable to be influenced by a fluctuation in the potential of the select gate. Therefore, the actual voltage window (ΔVwin1) can be made smaller than in the prior art. This helps shorten the write time and alleviate damage to the memory cells caused by the application of a voltage.

Furthermore, in the select transistor ST, the second polysilicon layer 330 does not function as a select gate line and the polysilicon layer 310 practically functions as a select gate line. The row select signal supplied from the decode circuit is transmitted by the polysilicon layer 310.

(2) The Read Operation Reliability can be Improved (Part 1)

In the configuration of the first embodiment, the metal wiring layers 270 are formed as the shunt wires for the select gate lines SG. That is, the row select signal is transmitted by the low-resistance metal wiring layers 270 made of metal material. As a result, the operation speed of the select transistors can be improved.

(3) The Read Operation Reliability can be Improved (Part 2)

The metal wiring layers 270 are arranged at equal intervals. Accordingly, the coupling capacitance between adjacent metal wiring layers 270 can be reduced. Therefore, the operation speed of the select transistor ST can be improved and therefore the read operation reliability of the flash memory can be improved.

(4) The Read Operation Reliability can be Improved (Part 3)

In the configuration of the first embodiment, the metal wiring layers 210 (part of the source lines) separated from one another in the bit line direction are connected to one another by the metal wiring layers 250 (part of the source lines) as shown in FIGS. 6 and 7. Therefore, since the metal wiring layers 210 are all connected to one another electrically in the bit line direction, the resistance values of the source lines can be reduced.

In a read operation, 0V is applied to the source lines SL. In this respect, if the resistance values of the source lines are high, the potentials on the source lines rise. As a result, it is difficult to cause a large read current to flow to the memory cells.

However, in the first embodiment, since the resistances of the source lines are low, the rise of the potentials on the source lines can be suppressed. Therefore, a large read current is caused to flow. As a result, the operation reliability of the flash memory can be improved.

(5) The Manufacturing Processes Become Simpler (Part 1)

In the first embodiment, the metal wiring layers 230, 260 are formed so as to connect the shunt wire 270 and select gate line SG to each other in the stitch region SA1.

The metal wiring layers formed in isolated patterns with a small area are liable to be skipped over in carrying out a wiring process, which makes the process unstable and contributes to a decrease in the yield.

As shown in FIGS. 6 and 7, the metal wiring layers 230, 260 are extended from the top of the select gate line toward the top of the control gate of the memory cell transistor. That is, the metal wiring layers 230, 260 making isolated patterns are extended in the bit line direction, thereby increasing their area. Accordingly, it is possible to suppress the loss of the metal wiring layers 230, 260 at the time of processing, which improves the manufacturing process reliability.

Furthermore, in the configuration of the first embodiment, to increase the area of each of the metal wiring layers 230, 26, the metal wiring layers 230, 260 are extended in the bit line direction, not in the word line direction. Therefore, an increase in the area of the memory cell array 10 can be prevented.

Moreover, this effect becomes noticeable when adjacent memory cells MC share a bit line contact as in the first embodiment. The reason is that the metal wiring layers 230, 260 are extended in the bit line direction and toward the adjacent control gate. Therefore, it is possible to suppress the short-circuiting of adjacent metal wiring layer 230 or metal wiring layer 260. As a result, the manufacturing process can be carried out easily.

(6) The Manufacturing Processes Become Simpler (Part 2)

In the first embodiment, dummy memory cells are formed in the source contact region SCA, too. The dummy memory cells have the same pattern as that of the memory cells MC in the first element region group AA1. That is, in the source contact region SCA and the first element region group AA1, a specific regularity is maintained. In the stitch region SA1, too, select gate lines and word lines are formed. That is, in the stitch region SA1, too, the polysilicon film 310, inter-gate insulating film 320, and polysilicon film 330 which have the same pattern as that of a memory cell MC are formed. Therefore, in the memory cell array, a uniform regularity is maintained. The regularity is not disturbed in the source contact region SCA and stitch region SA1. Consequently, the processing of each layer in the memory cell array can be performed easily without increasing the area unnecessary, which contributes to the facilitation of the manufacturing processes.

(7) The Manufacturing Processes Become Simpler (Part 3)

In the first embodiment, the metal wiring layers 250 which connect the metal wiring layers 120 are formed at the same level as that of the local bit lines 240 and have the same pattern as that of the local bit lines (see FIG. 7). Therefore, the regularity of the metal wiring layers at the level where the local bit lines are formed is not disturbed in the source contact region, too. The metal wiring layers 240, 250 can be patterned by the same lithographic process. Consequently, the processing of the metal wiring layers 250 serving as source lines can be performed easily without increasing the area unnecessarily and the metal wiring layers 250 can be connected in the bit line direction easily.

(8) The Operation Speed of the Flash Memory can be Improved (Part 2)

In the configuration of the first embodiment, the bit lines are hierarchized into the local bit lines and the global bit lines (including the read global bit lines and write global bit lines).

In a write operation, only the local bit line LBL to which the selected memory cell is connected is connected to the write global bit line WGBL, whereas the local bit lines to which the selected memory cell is not connected are electrically isolated from the write global bit line WGBL by the selector SEL. Thus, none of the memory cells connected to the local bit lines not connected to the selected memory cell are seen from the write global bit line. That is, the unselected memory cells which are in the same column as the selected memory cell and are connected to the local bit lines LBL different from the local bit line to which the selected memory cell is connected do not contribute to the parasitic capacitance of the write global bit line. Therefore, the parasitic capacitance of the write global bit line can be reduced remarkably.

The same holds true for a read operation. Accordingly, the parasitic capacitances of the write global bit line and read global bit line can be reduced, which enables the operation speed of the flash memory to be improved.

(9) The Read Speed can be Improved (Part 1)

In a 2Tr flash memory, when data is written, a relatively high voltage, such as 6V used in "0" writing, has to be handled. To meet this requirement, a high-withstand-voltage MOS transistor with a thick gate insulating film has to be used. On the other hand, the voltage used in a read operation is lower than a write operation. Therefore, when only a read operation is considered, a low-withstand-voltage MOS transistor with a thin gate insulating film can be used. From the viewpoint of operation speed, it is preferable to use a low-withstand-voltage MOS transistor.

In the configuration of the first embodiment, the local bit lines are connected to the write global bit line and the read global bit line. The memory cells are connected via the write global bit line to the latch circuit 51 and via the read global bit line to the sense amplifier 70. That is, the signal route in a write operation differs from the signal route in a read operation. Therefore, in the signal route in a read operation, it is not necessary to consider measures to cope with a high voltage used in a write operation. Accordingly, low-withstand-voltage MOS transistors (e.g., MOS transistor 11) can be used in the signal route in a read operation. As a result, the read operation speed can be improved.

(10) The Reliability of a Write Operation can be Improved.

As explained in item (8), the bit lines are hierarchized. When particular attention is focused on the write route, a plurality of local bit lines are connected to a single write global bit line. In a write operation, only one local bit line including the selected memory cell is electrically connected to the write global bit line and the remaining local bit lines are electrically separated from the write global bit line. Accordingly, a voltage corresponding to the write data from the latch circuit is not applied to the local bit lines to which the selected memory cell is not connected. As a result, the erroneous writing of data into the memory cells connected to these local bit lines can be prevented effectively, which enables the reliability of write operations to be improved.

Figure 25:
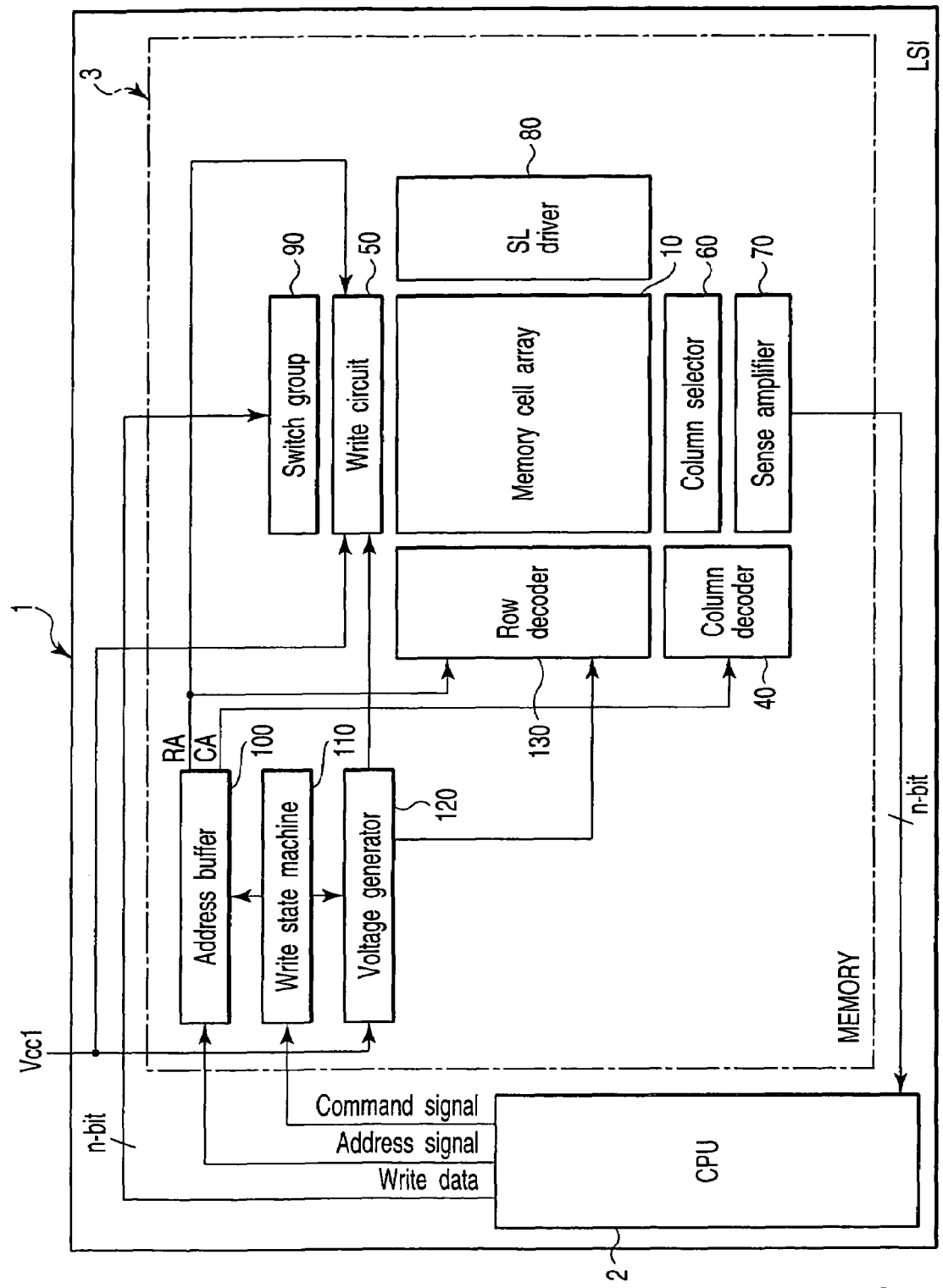
FIG. 25 is a block diagram of a system LSI according to a second embodiment of the present invention.

Next, using FIG. 25, a semiconductor memory device according to a second embodiment of the present invention will be explained. FIG. 25 is a block diagram of a system LSI according to the second embodiment. The second embodiment is such that the first embodiment is applied to a 3Tr-NAND flash memory. Hereinafter, only what differs from the first embodiment will be explained.

As shown in FIG. 25, the system LSI 1 of the second embodiment is such that the write decoder 20 and select gate decoder 30 are eliminated in the configuration of FIG. 1 explained in the first embodiment and a row decoder 130 is provided.

Figure 26:
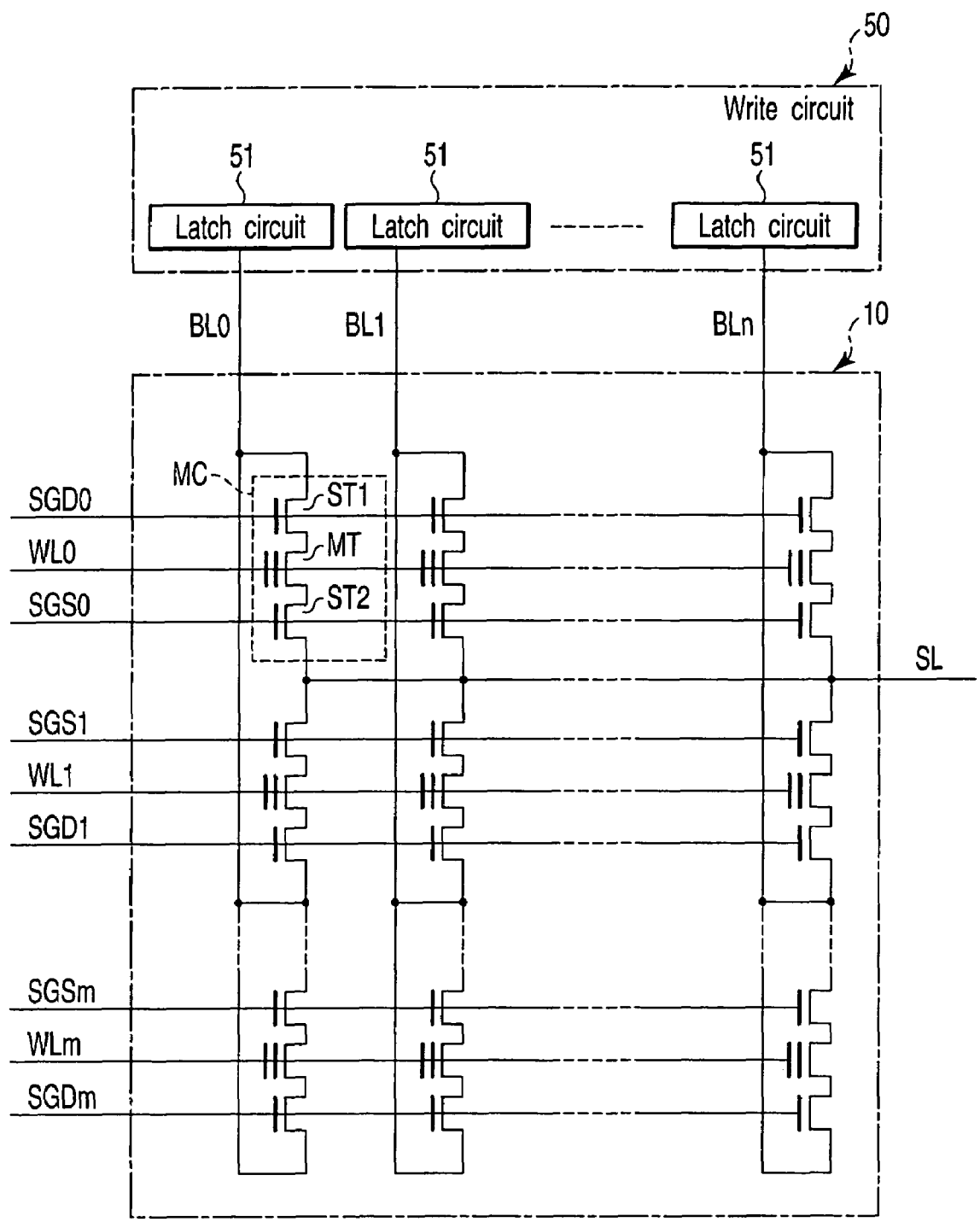
FIG. 26 is a circuit diagram of a memory cell array included in a 3Tr-NAND flash memory according to the second embodiment of the present invention.

FIG. 26 is a circuit diagram of the memory cell array 10. As shown in FIG. 26, the memory cell array 10 has a plurality of ((m+1)×(n+1)) memory cells MC (m and n are natural numbers) arranged in a matrix. Each of the memory cell MC includes a memory cell transistor MT and select transistors ST1, ST2, which have their current paths connected in series with one another. The current path of the memory cell transistor MT is connected between the current paths of the select transistors ST1, ST2. The memory cell transistor MT has a stacked gate structure that includes a floating gate formed above a semiconductor substrate via a gate insulating film and a control gate above the floating gate via an inter-gate insulating film. Each of the select transistors ST1, ST2 has a multilayer gate structure that includes a first polysilicon layer formed above the semiconductor substrate via a gate insulating film and a second polysilicon layer formed above the first polysilicon layer via an inter-gate insulating film. The source region of the select transistor ST1 is connected to the drain region of the memory cell transistor MT. The source region of the memory cell transistor MT is connected to the drain region of the select transistor ST2. Memory cells MC adjoining each other in the column direction share the drain region of the select transistor ST1 or the source region of the select transistor ST2.

The control gates of the memory cell transistors MT of the memory cells MC in a same row are connected commonly to any one of word lines WL0 to WLm. The gates of the select transistors ST1 of the memory cells in a same row are connected commonly to any one of select gate lines SGD0 to SGDm. The gates of the select transistors ST2 in a same row are connected commonly to any one of select gate lines SGS0 to SGSm. The drain regions of the select transistors ST1 of the memory cells MC in a same column are connected commonly to any one of bit lines BL0 to BLn. Bit lines BL0 to BLn are connected to the corresponding latch circuits 51, respectively. The sources of the select transistors ST2 of the memory cells MC are connected commonly to a source line SL and then connected to the source line driver 80.

The row decoder 130 decodes a row address signal, thereby producing a row address decode signal. Then, on the basis of the row address decode signal, the row decoder 130 selects a word line and a select gate line.

The voltage generator circuit 120 generates a plurality of internal voltages on the basis of the voltage Vcc1 externally input. The voltage generator circuit 120, which has a positive charge pump circuit, generates positive voltages VPP2 (e.g., 3V), VPP3 (e.g., 18V), and VPP4 (e.g., 4.5V).

The write circuit 50 latches write data. As described above, the write circuit 50 includes latch circuits 51 provided for the bit lines in a one-to-one correspondence. FIG. 27 is a circuit diagram of a configuration of the latch circuit 51. As shown in FIG. 27, the latch circuit 51 is as explained in the first embodiment except that, in the inverters 52, 53, the high-voltage-side power supply voltage is VPP2 (3V) and the low-voltage-side power supply voltage is 0V.

Figure 28:
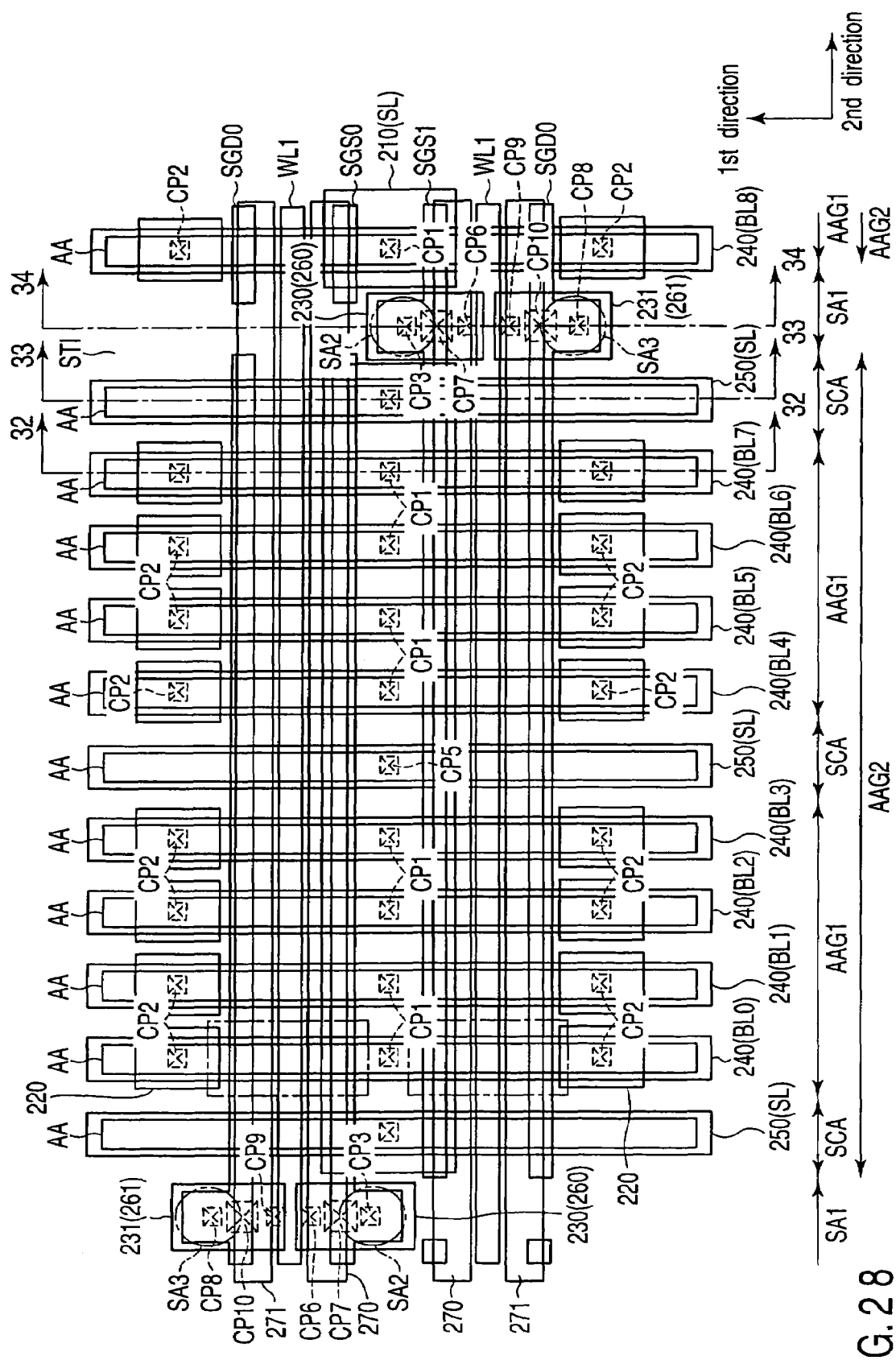
FIG. 28 is a plan view of the memory cell array of the 3Tr-NAND flash memory according to the second embodiment.
Figure 29:
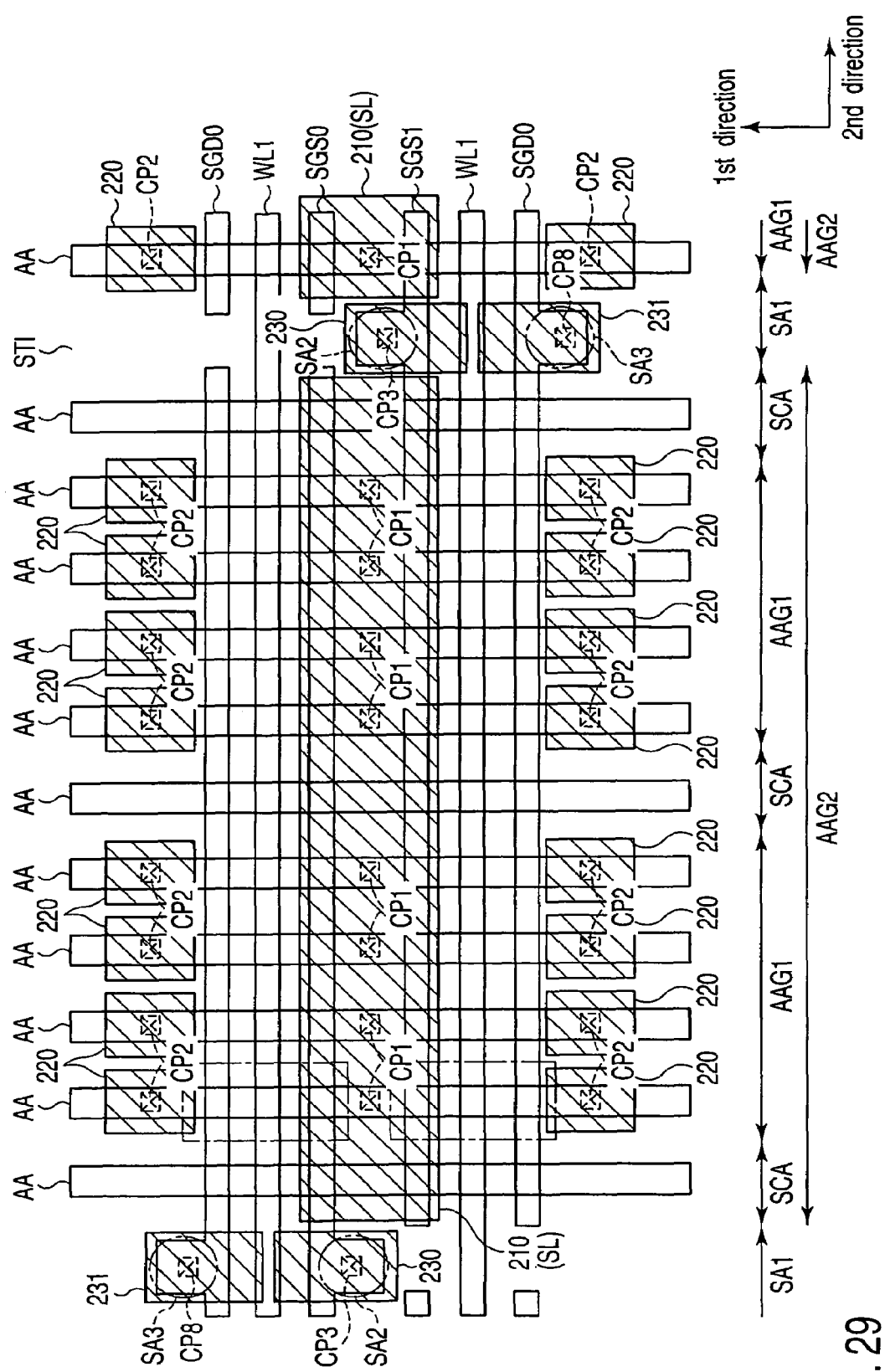
FIG. 29 is a plan view of the memory cell array of the 3Tr-NAND flash memory according to the second embodiment, showing a pattern of a first-layer metal wiring layer.
Figure 30:
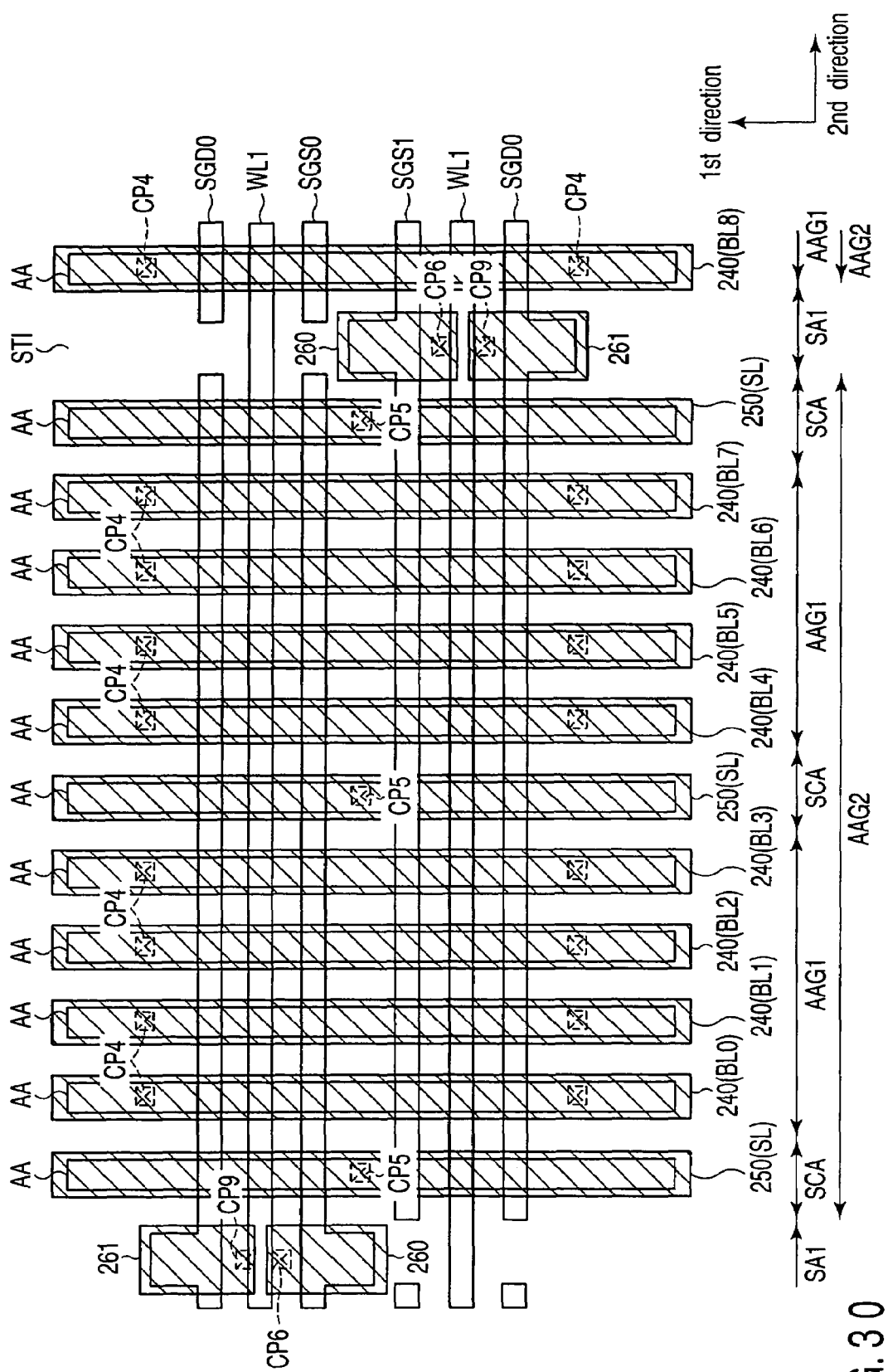
FIG. 30 is a plan view of the memory cell array of the 3Tr-NAND flash memory according to the second embodiment, showing a pattern of a second-layer metal wiring layer.
Figure 31:
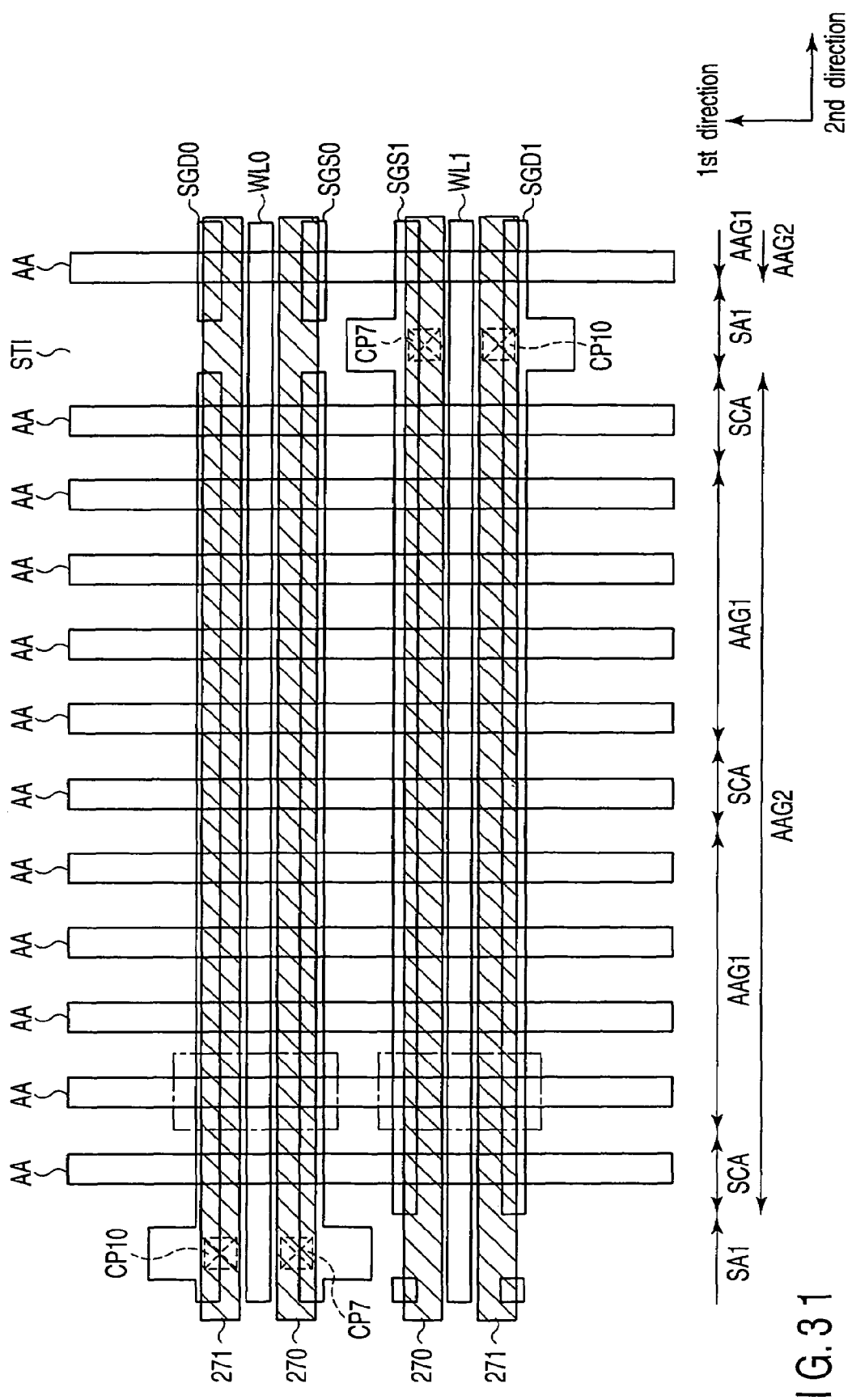
FIG. 31 is a plan view of the memory cell array of the 3Tr-NAND flash memory according to the second embodiment, showing a pattern of a third-layer metal wiring layer.

Next, using FIGS. 28 to 31, a plane structure of the memory cell array 10 included in the 3Tr-NAND flash memory 3 will be explained. FIG. 28 is a plan view of a part of the memory cell array 10. FIGS. 29 to 31 are plan views showing plane patterns of a first-layer to fourth-layer metal wiring layers, respectively, together with element regions, word lines, and select gate lines. In FIGS. 29 to 31, the regions shown correspond to those in FIG. 28. The plane structure of the second embodiment is such that select gate lines SGD and shunt regions SA3 for the select gate lines SGD and shunt wires 271 are provided in the configuration of the first embodiment. Hereinafter, what differs from the first embodiment will be explained.

As shown in FIGS. 28 to 31, in the p-well region 200, a plurality of strip-shaped element regions AA extending in a first direction are formed in a second direction perpendicular to the first direction. Strip-shaped word lines WL0 to WLm and select gate lines SGD0 to SGDm, SGS0 to SGSm, which extend in the second direction, are formed so as to cross the element regions AA. In the regions where word lines WL0 to WLm cross the element regions AA, memory cell transistors MT are formed. In the regions where select gate lines SGD0 to SGDm cross the element regions AA, select transistors ST1 are formed. In the regions where select gate lines SGS0 to SGSm cross the element regions AA, select transistors ST2 are formed. Moreover, in the regions where word lines WL0 to WLm cross the element regions AA, floating gates (not shown) are formed in such a manner that they are separated from one another on a memory cell transistor basis. Word lines WL0 to WLm are so arranged that they are sandwiched between select gate lines SGD0 to SGDm and select gate lines SGS0 to SGSm, respectively. In addition, adjacent memory cells MC have their select gate lines SGD or SGS adjoining each other.

In the stitch region SA1, a part of each of the select gate lines SGD0 to SGDm, SGS0 to SGSm is made wider, particularly so as to project toward the adjacent select gate line. Hereinafter, the region made wider in a select gate line SGS is referred to as a shunt region SA2. The region made wider in a select gate line SGD is referred to as a shunt region SA3. The shunt regions SA3, SA2 are provided in select gate line SGD0 to SGDm, SGS0 to SGSm alternately. Specifically, in a stitch region SA1, shunt regions SA3, SA2 are formed in select gate lines SGD0, SGS0, SGD2, SGS2, SGD4, SGS4, . . . . In another stitch region SA1 adjacent to the stitch region, shunt regions SA3, SA2 are formed in select gate lines SGD1, SGS1, SGD3, SGS3, SGD5, SGS5 . . . . The select gate lines where none of shunt regions SA2, SA3 are formed are partially removed in the stitch region SA1.

Next, using FIGS. 28 and 29, a pattern of a first-layer metal wiring layer existing on the word lines and select gate lines will be explained. In FIG. 29, the shaded region is a first-layer metal wiring layer.

As shown in FIG. 29, between adjacent select gate lines SGS (between SGS0 and SGS1, between SGS2 and SGS3, . . . ), a strip-shaped metal wiring layer 210 extending in the second direction is formed. The metal wiring layer 210 is a part of a source line SL. The metal wiring layers 210 are separated from one another by stitch regions SA1 in its longitudinal direction (or the second direction). That is, the metal wiring layers 210 are independent on a second element region group AAG2 basis. Each of the metal wiring layers 210 is connected to the source region of a select transistor ST by a contact plug CP1. On the drain region of the select transistor ST1 in the first element region group AAG1, an island shaped metal wiring layer 220 is formed. The metal wiring layers 220 are separated from one another. Each of the metal wiring layers 220 is connected to the drain of the corresponding select transistor ST1 by a contact plug CP2. Therefore, a plurality of metal wiring layers 220 arranged in the second direction and a plurality of strip-like metal wiring layers 210 arranged in the second direction are provided alternately in the first direction. On the shunt region SA2, an island shaped metal wiring layer 230 is formed. On the shunt region SA3, an island shaped metal wiring layer 231 is formed. The metal wiring layer 230 is connected to the shunt region SA2 of the corresponding select gate line SGS by a contact plug CP3. The metal wiring layer 231 is connected to the shunt region SA3 of the corresponding select gate line SGD by a contact plug CP8. The metal wiring layers 230, 231 are extended in the first direction from the top of the corresponding select gate lines SG to the top of the corresponding word lines WL.

Next, using FIGS. 28 and 30, a pattern of a second-layer metal wiring layer existing on the first-layer metal wiring layers 210, 220, 230, 231 will be explained. In FIG. 30, the shaded region is the second-layer metal wiring layer.

As shown in FIG. 30, in a first element region group AAG1, strip-shaped metal wiring layers 240 are formed in the first direction on element regions AA. The metal wiring layers 240, which function as bit lines BL0 to BLn, are connected to the first-layer metal wiring layers 220 by contact plugs CP4. In source contact regions SCA, metal wiring layers 250 whose pattern is similar to that of the metal wiring layers 240 are formed. Therefore, the line width of the metal wiring layers 250 is the same as that of the metal wiring layers 240. The metal wiring layers 250 function as part of the source lines SL. The metal wiring layers 250 are connected to the first-layer metal wiring layers 210 by contact plugs CP5. In the stitch region SA1, metal wiring layers 260, 261 with an island pattern are formed. The metal wiring layers 260, 261 are formed so as to correspond to the first-layer metal wiring layers 230, 231, respectively. The shape of a metal wiring layer 260 has almost the same pattern as that of the metal wiring layer 230. The shape of a metal wiring layer 261 has almost the same pattern as that of the metal wiring layer 231. The metal wiring layer 260 overlaps with the metal wiring layer 230. The metal wiring layer 261 overlaps with the metal wiring layer 231. The metal wiring layers 260 are connected to the metal wiring layers 230 by contact plugs CP6. The metal wiring layers 261 are connected to the metal wiring layers 231 by contact plugs CP9. While in FIGS. 28 and 30, the contact plugs CP6, CP9 are directly above the word lines WL, the present embodiment is not limited to this, as long as the contact plugs CP6, CP9 are provided in positions where the metal wiring layers 230 and 260 can be connected and the metal wiring layers 231 and 261 can be connected.

Next, using FIGS. 28 and 31, a pattern of a third-layer metal wiring layer existing on the second-layer metal wiring layers 240, 250, 260, 261 will be explained. In FIG. 31, the shaded region is the third-layer metal wiring layer.

As shown in FIG. 31, strip-shaped metal wiring layers 270, 271 are formed in the second direction. The metal wiring layers 270, 271 are formed for sets of a word line and a select gate line (a set of WL0 and SGS0, SGD0, a set of WL1 and SGS1, SGD1, . . . ) in a one-to-one correspondence. The metal wiring layers 270 are connected by contact plugs CP7 to the second-layer metal wiring layers 260 electrically connected to the corresponding select gate lines. The metal wiring layers 271 are connected by contact plugs CP10 to the second-layer metal wiring layers 261 electrically connected to the corresponding select gate lines. Specifically, each of the metal wiring layers 260 function as a shunt wire for each of the select gate lines SGS0 to SGSm. Each of the metal wiring layers 261 function as a shunt wire for each of the select gate lines SGD0 to SGDM. Although in FIG. 31, the metal wiring layers 270, 271 are not arranged at equal intervals, it is desirable that they should be arranged at equal intervals from the view point of parasitic capacitance. The metal wiring layers 270, 271 are connected to each other between second element region groups AAG2 adjoining each other in the second direction.

Next, a sectional structure of the flash memory configured as described above will be explained. Since the sectional structure taken along a word line is almost the same as that in the first embodiment, the sectional structure taken along a bit line will be explained using FIGS. 32 to 34. FIGS. 32 to 44 are sectional views taken along line 32—32, along line 33—33, and along line 34—34 in FIG. 28, respectively.

Figure 32:
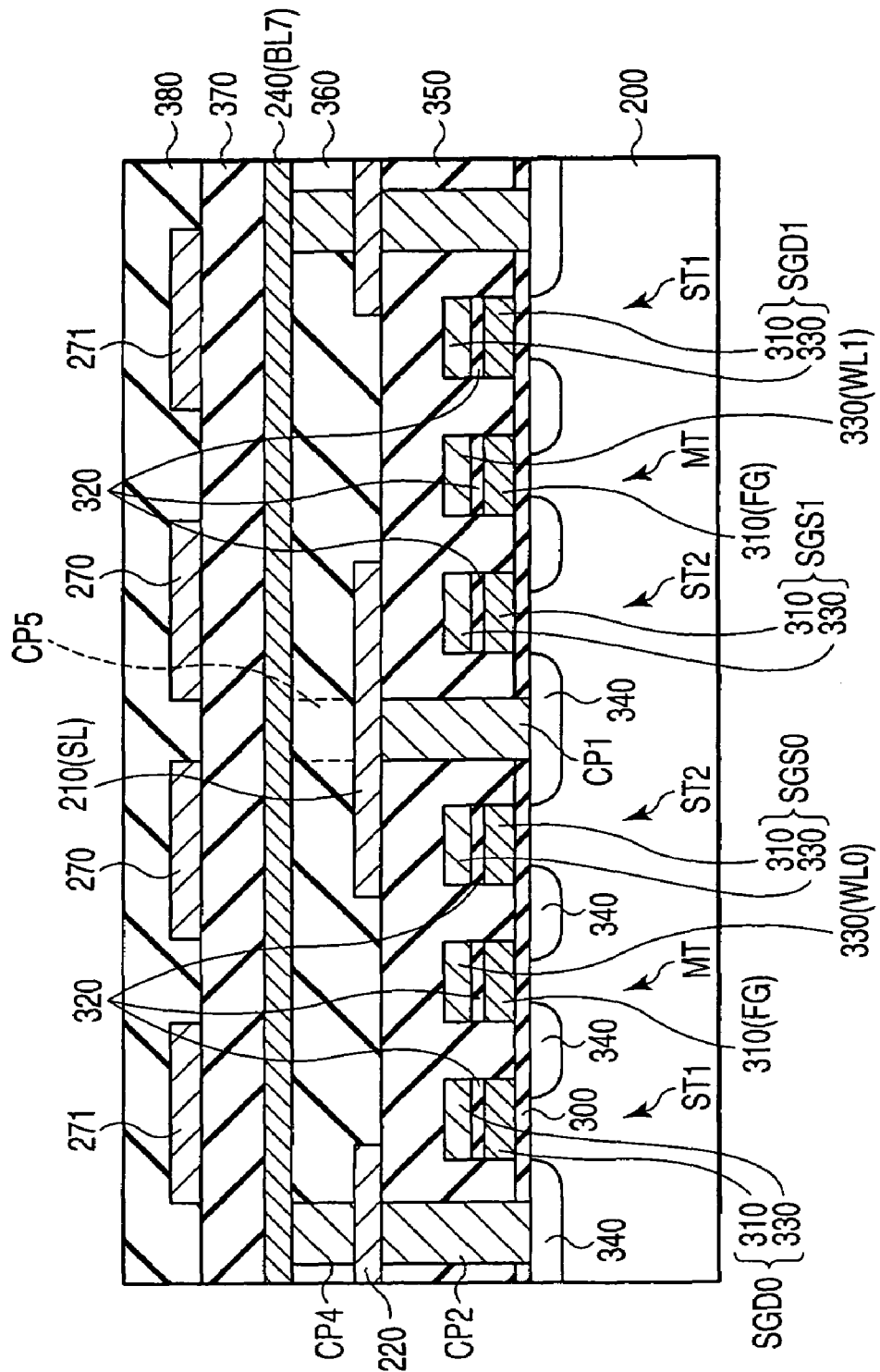
FIG. 32 is a sectional view taken along line 32—32 of FIG. 28.
Figure 33:
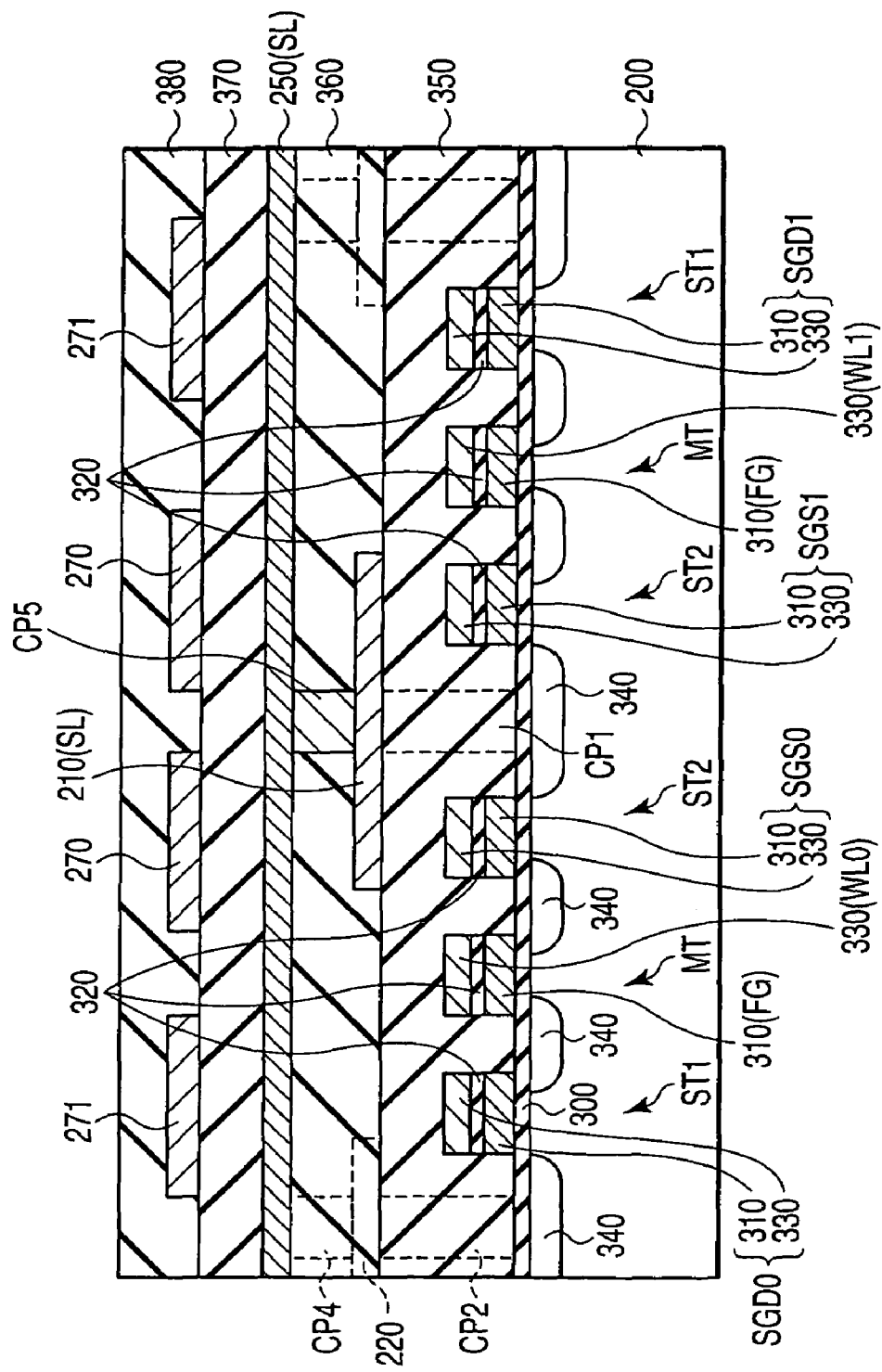
FIG. 33 is a sectional view taken along line 33—33 of FIG. 28.

First, using FIGS. 32 and 33, a sectional structure of the second element region group AAG2 will be explained. As shown in the figures, above the element region AA of the p-well region 200, the gate electrodes of a memory cell transistor MT and select transistors ST1, ST2 are formed via a gate insulating film 300. As in the first embodiment, each of the gate electrodes of the memory cell transistor MT and select transistors ST1, ST2 includes a polysilicon layer 310 formed on the gate insulating film 300, an inter-gate insulating film 320 formed on the polysilicon layer 310, and a polysilicon layer 330 formed on the inter-gate insulating film 320.

In the memory cell transistor MT, the polysilicon layers 310, which are separated from each other between adjacent element regions AA, function as floating gates. The polysilicon layers 330, which are connected to one another between adjacent element regions AA, function as control gates (or word lines WL).

In the select transistors ST1, ST2, the polysilicon layers 310 are connected to one another between adjacent element regions AA, and the polysilicon layers 320 are connected to one another between adjacent element regions AA. Then, the polysilicon layers 310, 330 function as select gate lines SGS, SGD. As explained in the first embodiment, the polysilicon layers 330 of the select transistors ST1, ST2 are in the electrically floating state. Thus, it is only the polysilicon layers 310 that practically function as select gate lines SGS, SGD.

At the surface of the well region 200 between adjacent gate electrodes, an impurity diffused layer 340 is formed. The impurity diffused layer 340 is shared by adjacent transistors.

As described above, a memory cell MC including a memory cell transistor MT and select transistors ST is formed so as to have the following relationship. In adjacent memory cells MC, their select transistors ST1 or their select transistors ST2 are adjacent to each other. The adjacent select transistors share the impurity diffused layer 340.

Then, on the well region 200, an interlayer insulating film 350 is formed so as to cover the memory cell transistor MT and select transistors ST. In the interlayer insulating film 350, a contact plug CP1 reaching the impurity diffused layer (or source region) 340 shared by two select transistors ST2, ST2 is formed. On the interlayer insulating film 350, a metal wiring layer 210 connected to the contact plug CP1 is formed. The metal wiring layer 210 functions as a source line SL. Further in the interlayer film 350, a contact plug CP2 reaching the impurity diffused layer (or drain region) 340 shared by two select transistors ST2, ST2 is formed. On the interlayer insulating film 350, a metal wiring layer 220 connected to the contact plug CP2 is further formed.

On the interlayer insulating film 350, an interlayer insulating film 360 is formed so as to cover the metal wiring layers 210, 220. In the interlayer insulating film 360, a contact plug CP4 reaching the metal wiring layer 220 is formed (see FIG. 32). On the interlayer insulating film 360, a metal wiring layer 240 connected commonly to a plurality of contact plugs CP4 is formed (see FIG. 32). The metal wiring layer 240 functions as local bit lines BL0 to BLn. In the interlayer insulating film 360, a contact plug CP5 reaching the metal wiring layer 210 is formed (see FIG. 33, source contact region SCA). On the interlayer insulating film 360, a metal wiring layer 250 is formed which connects a plurality of contact plugs CP5 to one another in the bit line direction (see FIG. 33, source contact region SCA). The metal wiring layer 250 functions as a part of the source line SL.

On the interlayer insulating film 360, an interlayer insulating film 370 is formed so as to cover the metal wiring layers 240, 250. On the interlayer insulating film 370, metal wiring layers 270, 271 are formed. The metal wiring layer 270 functions as a shunt wire for a select gate line SGS. The metal wiring layer 271 functions as a shunt wire for a select gate line SGD. The interconnections of the metal wiring layers 270, 271 are arranged at equal intervals as shown in FIGS. 32 and 33. On the interlayer insulating film 370, an interlayer insulating film 380 is formed so as to cover the metal wiring layers 270, 271.

Next, using FIG. 34, a sectional structure of a stitch region SA1 will be explained.

Figure 34:
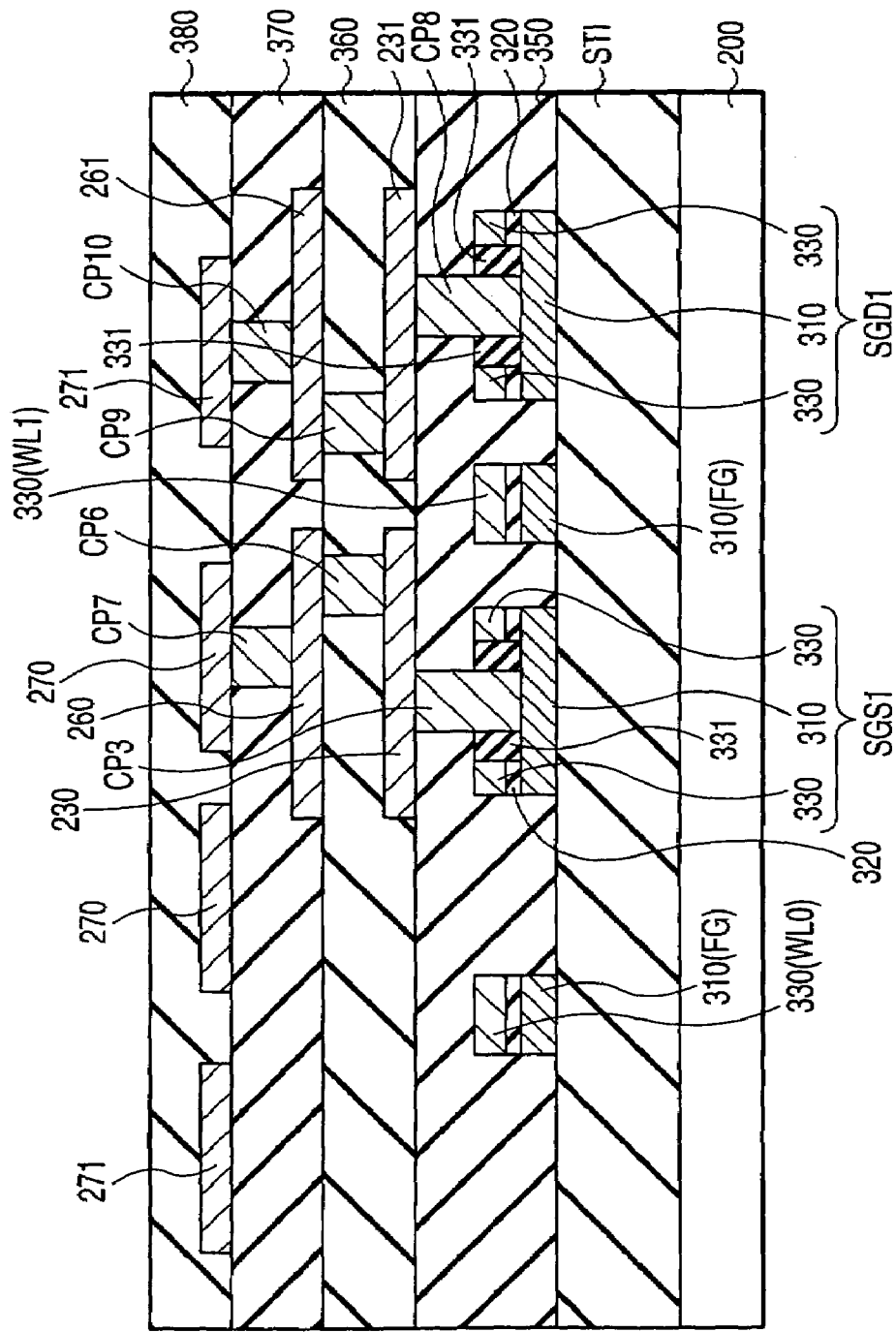
FIG. 34 is a sectional view taken along line 34—34 of FIG. 28.

As shown in FIG. 34, an element isolating region STI is formed in the p-well region 200. On the element isolating region STI, the floating gate 310 and control gate 330 of a memory cell transistor MT are formed. The polysilicon layers 310, 330 have been removed from the select gate lines SGS, SGD which have no shunt region SA2 in the stitch region SA1. That is, the select gate lines are isolated by the stitch regions SA1. In the select gate lines SGS, SGD which have shunt regions SA2, SA3, a stacked gate including the polysilicon layers 310, 330 has been formed even in the stitch region. The stacked gate has been formed so as to project toward the adjacent select gate lines. As shown in FIG. 34, in the stitch region SA1, the multilayer gate structure of select gate lines SGS0, SGD0 is removed, thereby forming a multilayer gate structure of select gate lines SGS1, SGD1.

Furthermore, in the shunt regions SA2, SA3, the polysilicon layer 330 and inter-gate insulating film 320 are removed, thereby exposing the polysilicon layer 310. Then, contact plugs CP3, CP8 are formed so as to contact the top of the polysilicon layer 310 in the region. An insulating film 331 electrically isolates the contact plugs CP3, CP8 from the polysilicon layer 330. The contact plugs CP3, CP8 are formed from the surface of the interlayer insulating film 350 so as to reach the polysilicon layer 310.

The metal wiring layers 230, 231 have been formed on the interlayer insulating film 350. The metal wiring layer 230 is extended so as to cover not only the top of the gate electrode of the corresponding select transistor ST2 but also a part of the top of the stacked gate electrode of the memory cell transistor MT corresponding to the select transistor ST2. Then, the metal wiring layer 230 is connected to the contact plug CP3 connected to the corresponding select transistor ST2. The metal wiring layer 231 is extended so as to cover not only the top of the gate electrode of the corresponding select transistor ST1 but also a part of the top of the stacked gate electrode of the memory cell transistor MT corresponding to the select transistor ST1. Then, the metal wiring layer 231 is connected to the contact plug CP8 connected to the corresponding select transistor ST1.

On the interlayer insulating film 350, an interlayer insulating film 360 is formed so as to cover the metal wiring layers 230, 231. In the interlayer insulating film 360, a contact plug CP6 and a contact plug CP9 reaching the metal wiring layers 230, 231 respectively are formed. On the interlayer insulating film 360, the metal wiring layers 260, 261 connected to the contact plugs CP6, CP9 respectively have been formed. Like the metal wiring layer 230, the metal wiring layer 260 is extended so as to cover not only the top of the gate electrode of the corresponding select transistor ST2 but also the top of the stacked gate electrode of the memory cell transistor MT corresponding to the select transistor ST2. Like the metal wiring layer 231, the metal wiring layer 261 is extended so as to cover not only the top of the gate electrode of the corresponding select transistor ST1 but also the top of the stacked gate electrode of the memory cell transistor MT corresponding to the select transistor ST1.

On the interlayer insulating film 360, an interlayer insulating film 370 is formed. In the interlayer insulating film 370, contact plugs CP7, CP10 reaching the metal wiring layers 260, 261 respectively are formed. On the interlayer insulating film 370, metal wiring layers 270, 271 connected to the contact plugs CP7, CP10 respectively are formed. As shown in FIG. 34, the metal wiring layers 270, 271 are arranged at equal intervals on the interlayer insulating film 370. Then, on the interlayer insulating film 370, an interlayer insulating film 380 is formed so as to cover the metal wiring layers 270, 271.

The configuration of each of the shunt regions SA2, SA3 is the same as that of FIG. 18 explained in the first embodiment.

Next, the operation of the 3Tr-NAND flash memory configured as described above will be explained.

<Write Operation>

Figure 35:
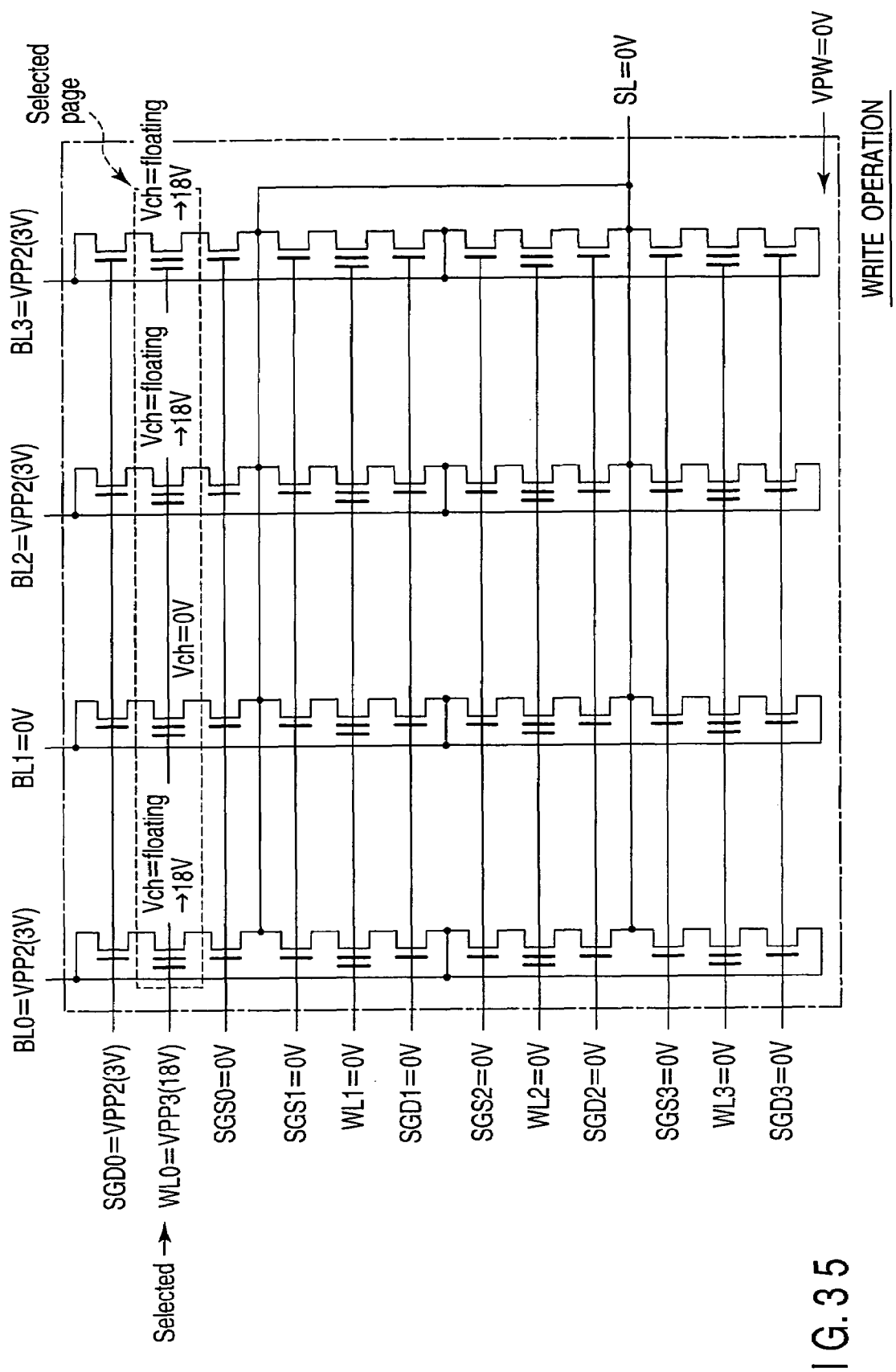
FIG. 35 is a circuit diagram of the memory cell array included in the 3Tr-NAND flash memory of the second embodiment, which helps explain a write operation.

First, using FIGS. 25 and 35, a write operation will be explained. FIG. 35 is a circuit diagram of the memory cell array 10 of the 3Tr-NAND flash memory 3. For simplification, FIG. 35 shows a case where the number of memory cells is (4×4). Data is written simultaneously into all of the memory cell transistors connected to any one of the word lines. Either "0" data or "1" data is written, depending on whether electrons are injected into the floating gate of a memory cell transistor MT. Electrons are injected into the floating gate by FN tunneling. In FIG. 35, it is assumed that data is written into the memory cell transistors MT connected to word line WL0 and that, of the memory cell transistors MT, "0" data is written into the memory cell transistors MT connected to bit line BL1 and "1" data is written into the memory cell transistors MT connected to bit lines BL0, BL2, BL3.

First, in FIG. 25, write data ("1" or "0") is input from the CPU 2. Then, the latch circuits 51 of the write circuit 50 latch the write data on a bit line basis. If "1" data is input, the latch circuit 51 applies VPP2 (e.g., 3V) to the bit line. If "0" data is input, the latch circuit 51 applies 0V to the bit line. That is, as shown in FIG. 35, the latch circuits 51 apply VPP2 to bit lines BL0, BL2, BL3 and 0V to bit line BL1.

Then, the row decoder 130 selects any one of the select gate lines SGD and applies VPP2 to the selected select gate line SGD and applies 0V to the unselected select gate lines SGD and all of the select gate lines SGS. That is, as shown in FIG. 35, the row decoder 130 selects select gate line SGD0 and applies VPP2 to the selected select gate line SGD0. Moreover, the row decoder 130 applies 0V to the other select gate lines SGS0, SGD1, SGS1, SGD2, SGS2, SGD3, and SGS3.

Then, of the select transistors ST1 connected to the selected select gate line SGD, the transistors ST1 connected to the bit line BL to which VPP2 is applied are in the cut-off state. The select transistors ST1 connected to the bit line BL to which 0V is applied are in the on state.

Furthermore, the row decoder 130 selects any one of the word lines WL and applies VPP3 (18V) to the selected word line WL. In addition, the row decoder 130 applies 0V to all of the unselected word lines WL1 to WL3. The word line WL selected here is the one connected to the memory cell MC including the selected select gate line SGD. As a result, a channel region is formed in the memory cell transistor MT connected to the selected word line WL. Then, since the select transistor ST1 connected to the selected select gate line SGD and the bit line to which VPP2 is applied is in the cut-off state, the channel potential of the memory cell transistor MT connected to the select transistor ST1 is floating. As a result of coupling with the word line WL, the channel potential rises to about 18V. On the other hand, since the select transistor ST2 connected to the selected select gate line SGD and the bit line to which 0V is applied is in the on state, the channel potential of the memory cell transistor MT connected to the select transistor ST1 is 0V.

Specifically, as shown in FIG. 35, the row decoder 130 not only selects word line WL0 and applies VPP3 to the selected word line WL0 but also applies 0V to the unselected word lines WL1 to WL3. As a result, a channel region is formed in the memory cell transistor MT connected to word line WL0. Since 0V is applied to bit line BL1, the channel potential Vch of the memory cell transistor MT in the memory cell including the select transistor ST1 connected to bit line BL1 is 0V. On the other hand, since VPP2 is applied to bit lines BL0, BL2, and BL3, the channel potential Vch of the memory cell transistor MT in the memory cell including the select transistor ST1 connected to each of bit lines BL0, BL2, and BL3 rises to about 18V.

Furthermore, the row decoder 130 applies 0V to the substrate (p-well region 200) in which the memory cells have been formed.

As a result, in the memory cell transistor MT in the memory cell including the cut-off select transistor ST1, the potential difference between the gate and the channel is insufficient, with the result that no electron is injected into the floating gate. Accordingly, the threshold value of the memory cell (or the memory cell into which "1" data is to be written) connected to the bit line to which VPP2 is applied and the selected word line remains negative. In FIG. 35, no electron is injected into the floating gates of the memory cell transistors MT connected to bit lines BL0, BL2, BL3 and word line WL0. In other words, "1" data is written into the memory cell transistors connected to bit lines BL0, BL2, BL3 and the selected word line WL0.

On the other hand, in the memory cell transistor MT in the memory cell including the select transistor ST1 which is connected to the selected select gate line SGD and to the bit line BL to which 0V is applied, since the potential difference between the gate and the channel is 18V, electrons are injected into the floating gate by FN tunneling. As a result, the threshold value of the memory cell transistor MT changes to positive. That is, "0" data is written. In FIG. 35, VPP3 is applied to word line WL0, with the result that the potential difference between the gate and channel of the memory cell transistor MT connected to bit line BL1 and word line WL0 is 18V. Therefore, electrons are injected into the floating gate of the memory cell transistor MT connected to bit line BL1 and word line WL0. The threshold value of the memory cell transistor MT into which electrons have been injected changes to positive, which means that "0" data has been written.

As described above, the data is written into one page of memory cell transistors simultaneously.

<Erase Operation>

Figure 36:
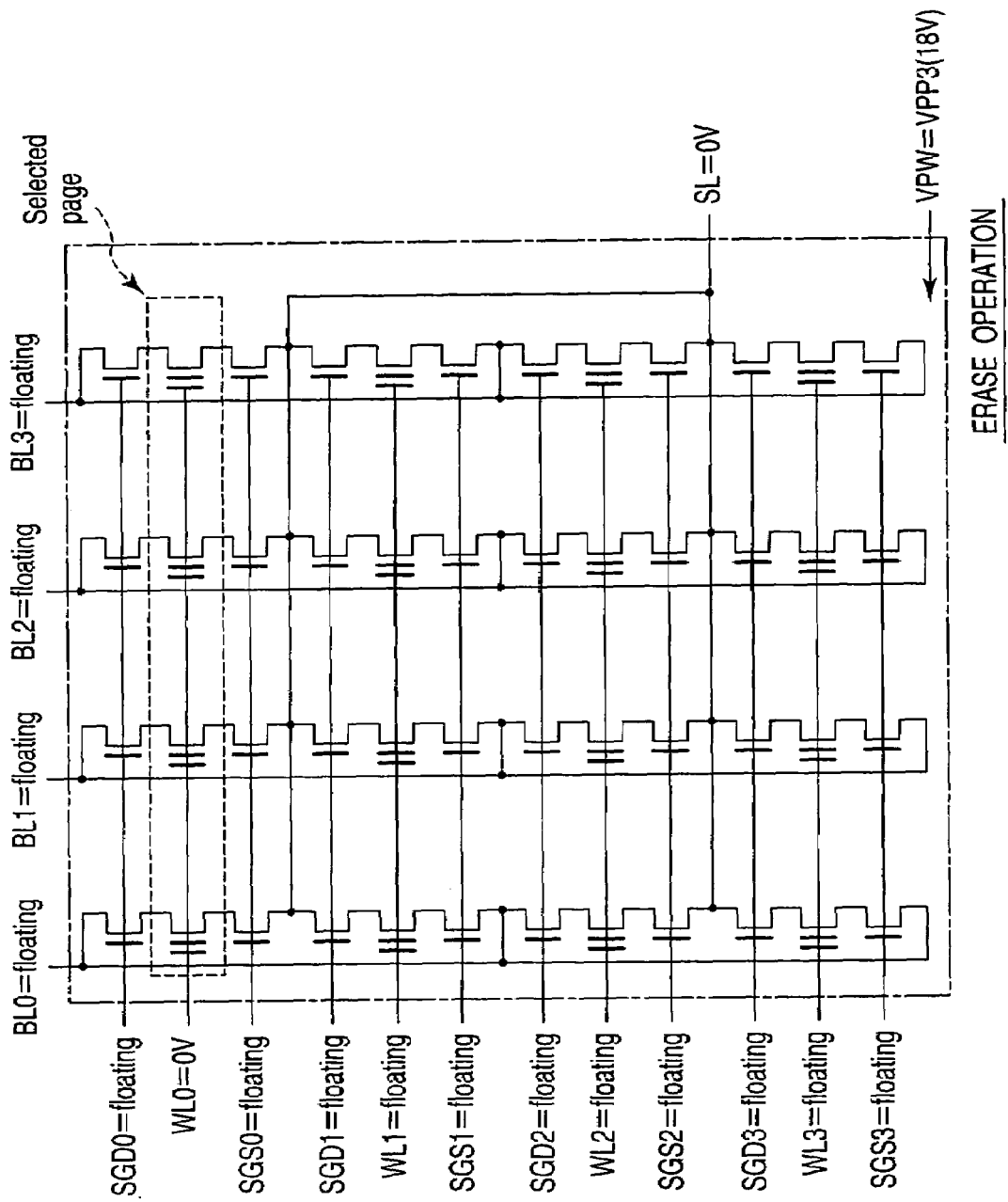
FIG. 36 is a circuit diagram of the memory cell array included in the 3Tr-NAND flash memory of the second embodiment, which helps explain an erase operation.

Next, using FIGS. 25 and 36, an erase operation will be explained. FIG. 36 is a circuit diagram of the memory cell array 10 of the 3Tr-NAND flash memory 3. For simplification, FIG. 36 shows a case where the number of memory cells is (4×4). Data is erased in pages simultaneously as in a write operation. An erase operation is carried out by pulling electrons out of the floating gate by FN tunneling. FIG. 36 shows a case where the data is erased from the memory cell transistors connected to word line WL0.

Before erasing is done, all of the bit lines BL are brought into the floating state. In addition, the row decoder 130 brings all of the select gate lines SGD, SGS into the floating state. Then, the row decoder 130 not only selects any one of the word lines and applies 0V to the selected word line WL but also brings the unselected word lines WL into the floating state. In addition, the row decoder 130 applies VPP3 (18V) to the p-well region 200 in which memory cells have been formed. That is, as shown in FIG. 36, 0V is applied to the selected word line WL0 and the unselected word lines WL1 to WL3 are brought into the floating state. Moreover, all of the select gate lines SGD0, SGS0, SGD1, SGS1 are brought into the floating state.

Then, the potential difference between the memory cell transistors MT connected to the selected word line WL and the well region 200 becomes 18V, causing the electrons in the floating gates to be pulled out into the well region 200. As a result, the data is erased from the memory cell transistors MT connected to the selected word line, with the result that the threshold values of the memory cell transistors MT become negative. That is, as shown in FIG. 36, electrons are pulled out of the floating gates of all the memory cell transistors MT connected to word line WL0 into the semiconductor substrate, thereby erasing the data.

In the memory cell transistors MT connected to the unselected word lines, the potentials of the word lines WL rise to about 18V because of coupling with the semiconductor substrate. As a result, electrons are not pulled out of the floating gates, with the result that the data is not erased. That is, as shown in FIG. 36, the potentials of word lines WL1 to WL3 rise through coupling. As a result, the data is not erased from all of the memory cell transistors MT connected to word lines WL1 to WL3. In addition, the potentials of the select gate lines also rise to about 18V through coupling, which prevents voltage stress from being applied to the gate insulating films of the select transistors ST.

As described above, the data is erased simultaneously from the selected page. In FIG. 36, while the data has been erased from (one page of) the memory cell transistors connected to one word line, the data may be erased simultaneously from the memory cell transistors connected to a plurality of word lines. In this case, the row decoder 130 applies 0V to the word lines.

<Read Operation>

Figure 37:
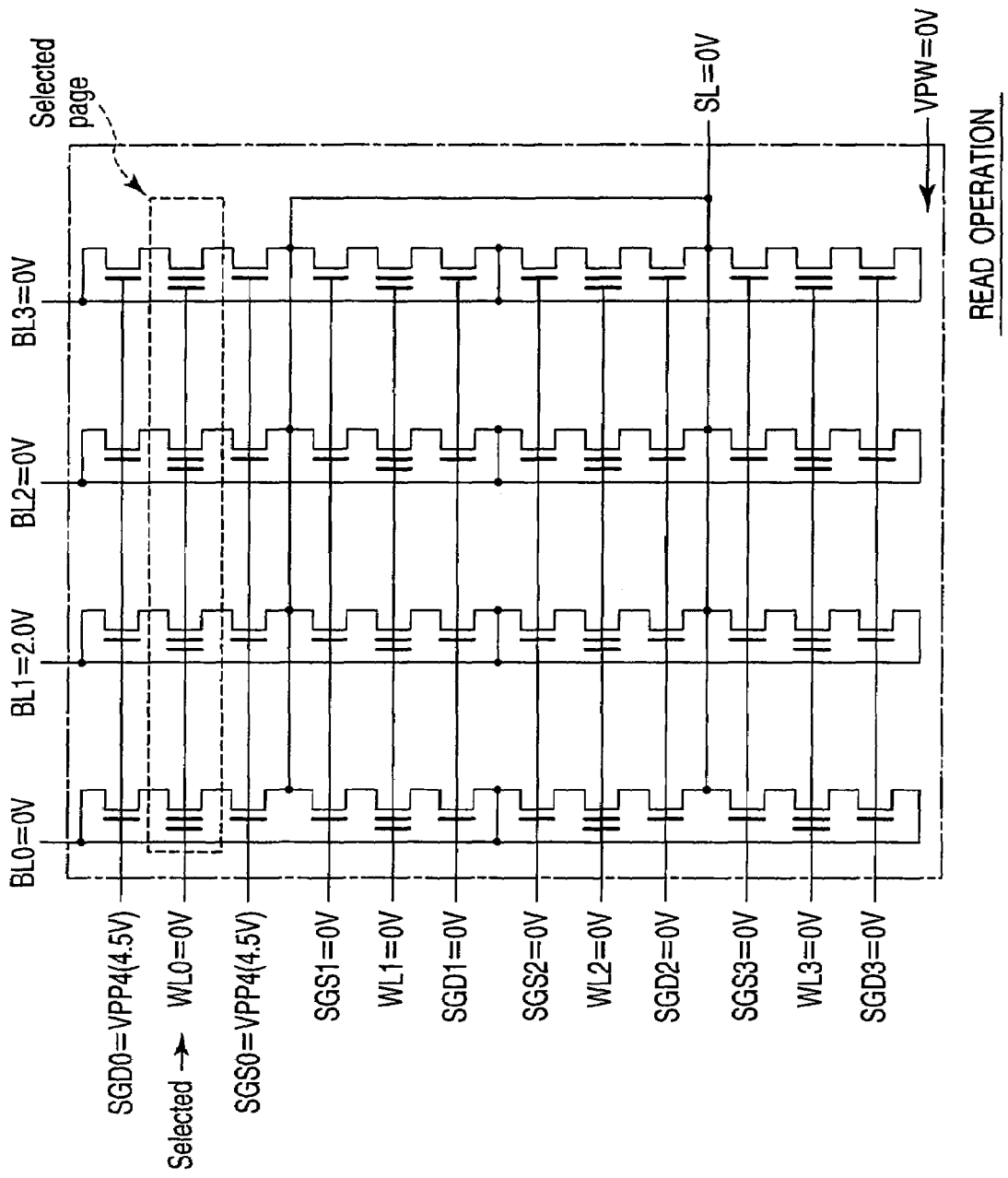
FIG. 37 is a circuit diagram of the memory cell array included in the 3Tr-NAND flash memory of the second embodiment, which helps explain a read operation.

Next, a read operation will be explained by reference to FIG. 25 and FIG. 37. FIG. 37 is a circuit diagram of the memory cell array 10 of the 3Tr-NAND flash memory 3. For simplification, FIG. 37 shows a case where the number of memory cells is (4×4). In FIG. 37, the data is read from the memory cell transistor MT connected to bit line BL1 and word line WL0.

First, the row decoder 130 selects the select gate lines SGD, SGS to which a memory cell to be read from is connected and applies VPP4 (e.g., 4.5V) to the selected select gate lines SGD, SGS. In addition, the row decoder 130 makes unselected the other select gate lines SGD, SGS and applies 0V to the unselected select gate lines SGD, SGS. As a result, the select transistors ST1, ST2 connected to the selected select gate lines SGD, SGS are turned on. Then, the row decoder 130 applies 0V to all of the word lines WL. That is, as shown in FIG. 37, VPP4 is applied to the selected select gate lines SGD0, SGS0 and 0V is applied to the unselected select gate lines SGD1 to SGD3, SGS1 to SGS3. As a result, the select transistors ST1, ST2 connected to the selected select gate lines SGD0, SGS0 are turned on. In addition, 0V is applied to all of word lines WL0 to WL3.

Since the memory cell transistor MT has a negative threshold value if the data written in it is "1," the transistor MT is in the on state. Since the memory cell transistor MT has a positive threshold value if the data written in it is "0," the transistor MT is in the off state.

In this state, for example, 2.0V is applied to the selected bit line BL. Then, if the data written in the memory cell transistor MT connected to the select transistors ST1, ST2 connected to the selected select gate lines SGD, SGS is "1," current flows from the bit line to the source line. On the other hand, if the data written in the memory cell transistor M is "0," no current flows. In the example of FIG. 37, 2.0V is applied to the selected bit line BL1. Then, if the data written in the memory cell transistor MT connected to word line WL0 and the selected bit line BL1 is "1," current flows from bit line BL1 to the source line SL. If the data written in the memory cell transistor M is "0," no current flows.

As described above, the bit line potential varying with the current flowing from the bit line to the source line is amplified by the sense amplifier 700, thereby reading the data. While the data has been read from one bit line in FIG. 37, a potential may be applied to a plurality of bit lines, thereby reading the data from a plurality of memory cell transistors simultaneously.

As described above, the flash memory of the second embodiment produces the effect described below.

(11) The Operation Speed of the Flash Memory can be Improved (Part 3)

This effect, which is the same as the effect in item (1) explained in the first embodiment, will be explained using FIGS. 38 and 39. FIGS. 38 and 39 are schematic sectional views of a memory cell. FIG. 38 shows a conventional structure of a memory cell. FIG. 39 is a structure of a memory cell according to the second embodiment.

As shown in FIG. 38, in the conventional structure, each of the select transistors ST1, ST2 has a multilayer gate structure of polysilicon layers 310, 330. The polysilicon layers 310, 330 are electrically connected to each other. The control gate CG of the memory cell transistor MT adjacent to the select transistors ST1, ST2 has parasitic capacitances Ccs, Csc, Ccf between the polysilicon layer 310 of the select transistor STi and itself, between the polysilicon layer 330 of the select transistor ST1 and itself, and between the floating gate FG and itself, respectively. The control gate CG further has parasitic capacitances Ccs, Csc between the polysilicon layer 310 of the select transistor ST2 and itself and between the polysilicon layer 330 of the select transistor ST2 and itself.

In contrast, as shown in FIG. 39, in the configuration of the second embodiment, although each of the select transistors ST1, ST2 has a multilayer gate structure as in the conventional equivalent, the polysilicon layers 310, 330 are separated from each other and the polysilicon layer 330 is kept in an electrically floating state. The control gate CG of the memory cell transistor MT adjacent to the select transistors ST1, ST2 has parasitic capacitances Ccs, Cfc, Ccf between the polysilicon layer 310 of the select transistor ST1 and itself, between the polysilicon layer 330 of the select transistor ST1 and itself, and between the floating gate FG and itself, respectively. Moreover, the control gate CG further has parasitic capacitances Ccs, Csc between the polysilicon layer 310 of the select transistor ST2 and itself and between the polysilicon layer 330 of the select transistor ST2 and itself. In addition, there is a parasitic capacitance Cfs between the polysilicon layers 310, 330 of the select transistors ST1, ST2.

When a voltage is applied to the select gate line in a read operation, the control gate 330 of the memory cell transistor is directly influences by coupling between the polysilicon layers 330, 310 of the both of the select transistors ST1, ST2.

As explained in the first embodiment, in the second embodiment, coupling with the polysilicon layers 330 of the select transistors ST1, ST2 means indirect influence of coupling with the polysilicon layers 310 of the select transistors ST1, ST2. Therefore, a variation in the potential of the control gate CG becomes smaller than that in coupling with the polysilicon layer 330 whose potential varies as in the conventional structure.

Therefore, as explained in item (1), the potential of the control gate can be determined faster than in the conventional structure, which enables a write operation or a read operation to be started faster than in the conventional structure. Consequently, the operation speed of the flash memory can be improved.

The polysilicon layers 330 of the select transistors ST1, ST2 do not function as select gate lines and the polysilicon layers 310 practically function as select gate lines. The row select signal supplied from the decode circuit is transmitted by the polysilicon layers 310.

Furthermore, the second embodiment produces not only the effect in item (11) but also the effects in items (2), (3), and (5) to (7) explained in the first embodiment.

Figure 40:
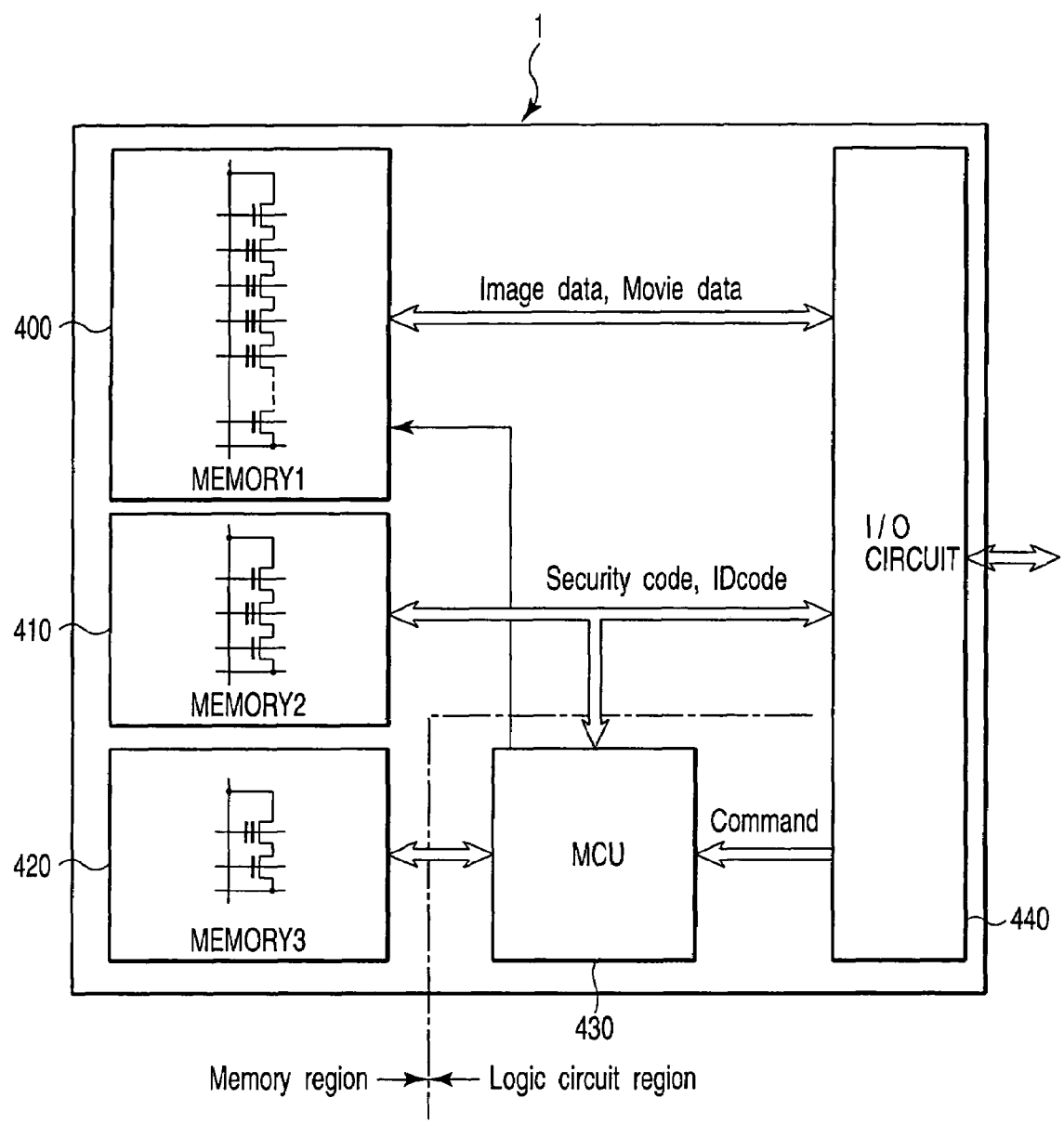
FIG. 40 is a block diagram of a system LSI according to a third embodiment of the present invention.

Next, using FIG. 40, a semiconductor memory device according to a third embodiment of the present invention will be explained. FIG. 40 is a block diagram of a system LSI according to the third embodiment. The third embodiment is such that not only the 2Tr flash memory and 3Tr-NAND flash memory explained in the first and second embodiments but also a NAND flash memory are formed on a single LSI.

As shown in FIG. 40, a system LSI 1 comprises a NAND flash memory 400, a 3Tr-NAND flash memory 410, a 2Tr flash memory 420, an MCU 430, and an I/O circuit 440, which are formed on a semiconductor substrate.

The NAND flash memory 400 is used as a storage memory for storing image data or video data.

The 3Tr-NAND flash memory 410 holds an ID code for accessing the LSI 1 or a security code. Its configuration is as explained in the second embodiment.

The 2Tr flash memory 420 holds program data for the MCU 430 to operate. Its configuration is as explained in the first embodiment.

The MCU 430 does processing on the basis of the program read from the 2Tr flash memory 420, in response to various commands externally input. At this time, the MCU 430 accesses the 2Tr flash memory 420 directly without intervention of an SRAM (Static Random Access Memory) or the like. The processing done by the MCU 430 includes the compression or decompression of the data input to the NAND flash memory 400 and control of an external device. In addition, the MCU 430 reads specific data from the 3Tr-NAND flash memory 410, when the data held in the NAND flash memory 400 is accessed from the outside. Then, the MCU 430 checks the readout data against the externally input ID code or security code. If they coincide with each other, the MCU 430 permits access to the NAND flash memory 400. When access to the NAND flash memory 400 is permitted, the data in the NAND flash memory 400 is accessed from the outside (host). Specifically, the MCU 430 triggers the NAND flash memory 400 in response to the command received from the outside, thereby reading (writing) the data.

The I/O circuit 440 controls the exchange of signals between the LSI 1 and the outside.

Figure 41:
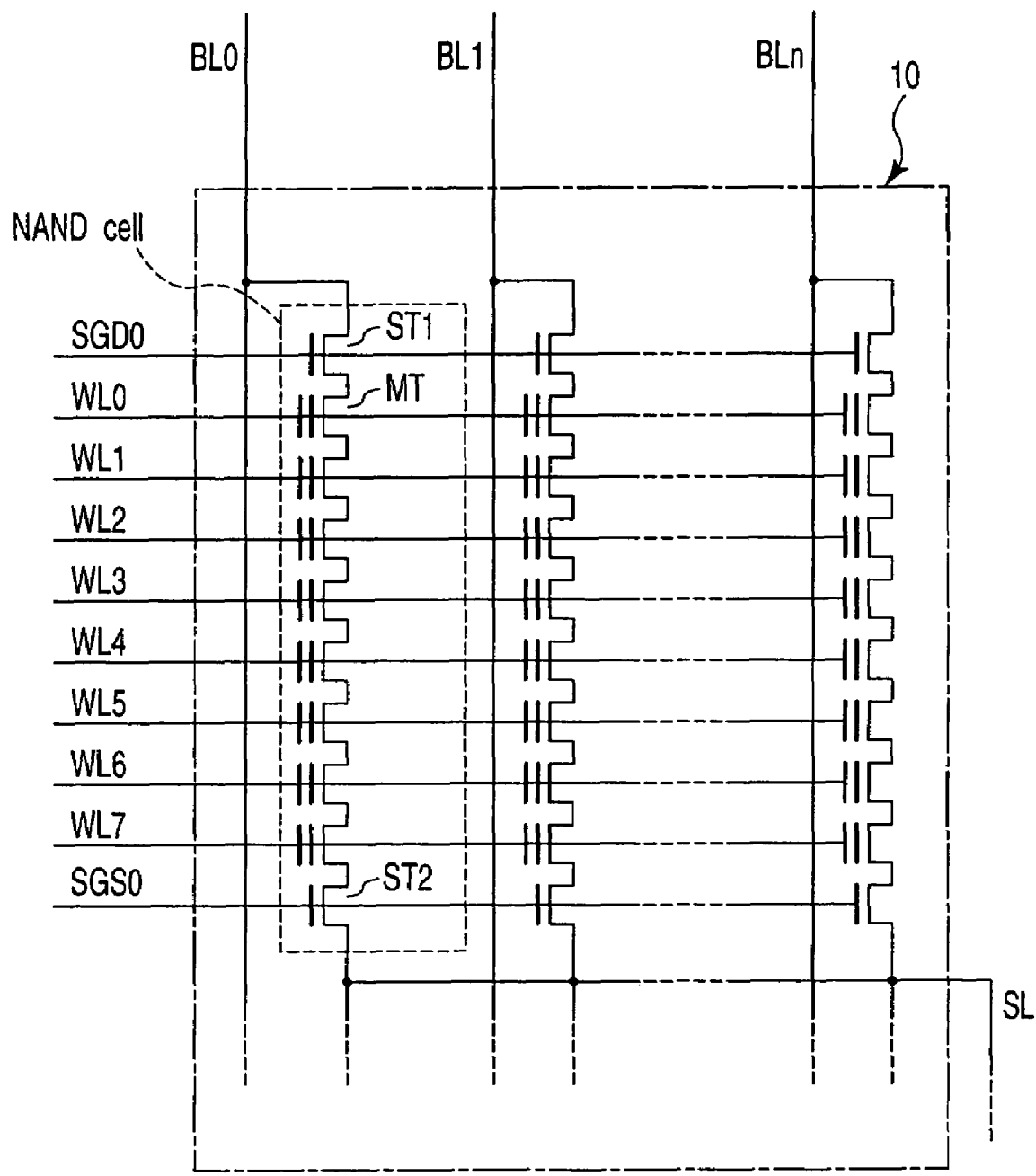
FIG. 41 is a circuit diagram of a memory cell array included in a NAND flash memory according to the third embodiment of the present invention.

The configuration of the 2Tr flash memory and that of the 3Tr-NAND flash memory 41 are as explained in the first and second embodiments. Hereinafter, the configuration of the NAND flash memory 400 will be explained using FIG. 41. FIG. 41 is a circuit diagram of the memory cell included in the NAND flash memory 400.

As shown in FIG. 41, the memory cell array 10 has a plurality of NAND cells arranged in a matrix. Each of the NAND cells includes eight memory cell transistors MT and select transistors ST1, ST2. A memory cell transistor MT has a stacked-gate structure that includes a floating gate formed above a semiconductor substrate via a gate insulating film and a control gate formed above the floating gate via an inter-gate insulating film. The number of memory cell transistors MT is not limited to 8 and may be 16 or 32. The number is illustrative and not restrictive. The adjoining the memory cell transistors MT share their source and drain. They are arranged in such a manner that their current paths are connected in series between the select transistors ST1, ST2. The drain region at one end of the series connection of the memory cell transistors MT is connected to the source region of the select transistor ST1. The source region at the other end is connected to the drain region of the select transistor ST2.

The control gates of the memory cell transistors MT in a same row are connected commonly to any one of word lines WL0 to WLm. The gates of the select transistors ST1, ST2 in the same row are connected commonly to select gate lines SGD, SGS, respectively. The drains of the select transistors ST1 in a column are connected commonly to any one of bit lines BL0 to BLn. The sources of the select transistors ST2 are connected commonly to a source line SL and then connected to a source line driver 15. Both of the select transistors ST1, ST2 are not necessarily needed. Only one of them may be used, provided that it can select a NAND cell.

Figure 42:
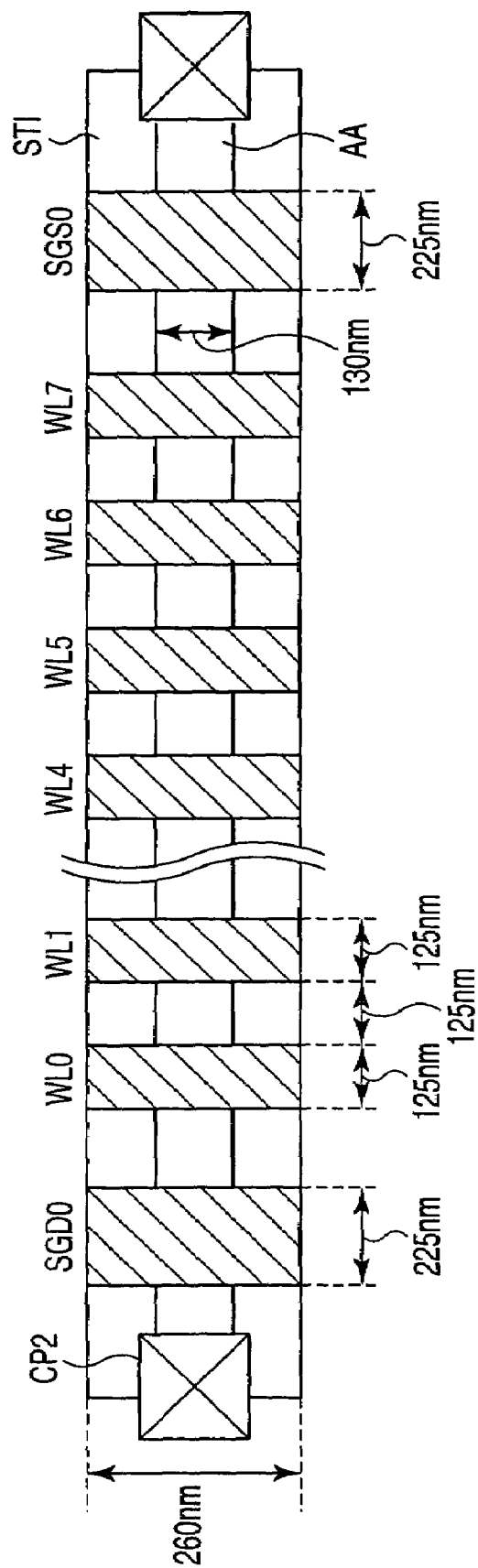
FIG. 42 is a plan view of a NAND cell included in the NAND flash memory of the third embodiment.
Figure 43:
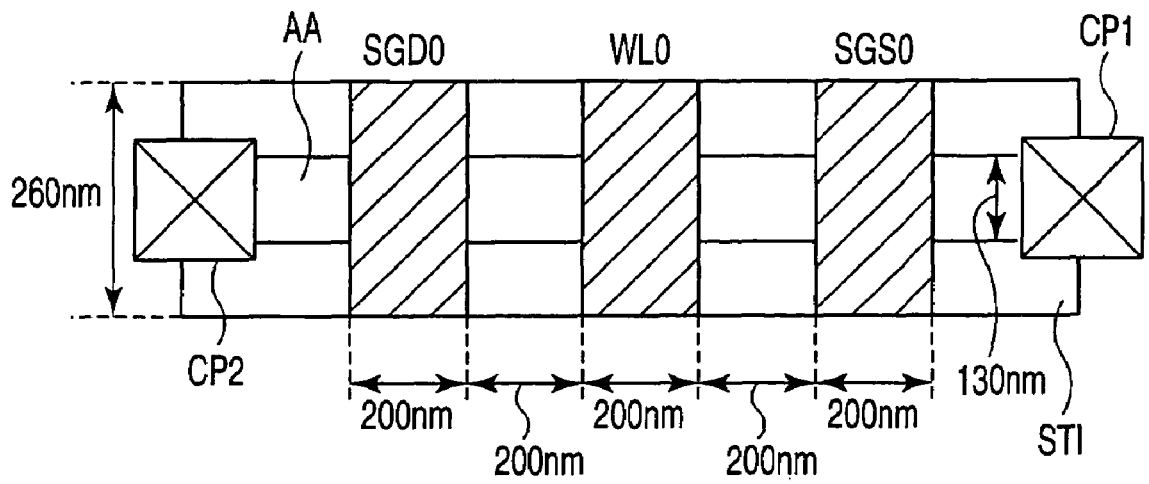
FIG. 43 is a plan view of a memory cell included in a 3Tr-NAND flash memory according to the third embodiment of the present invention.
Figure 44:
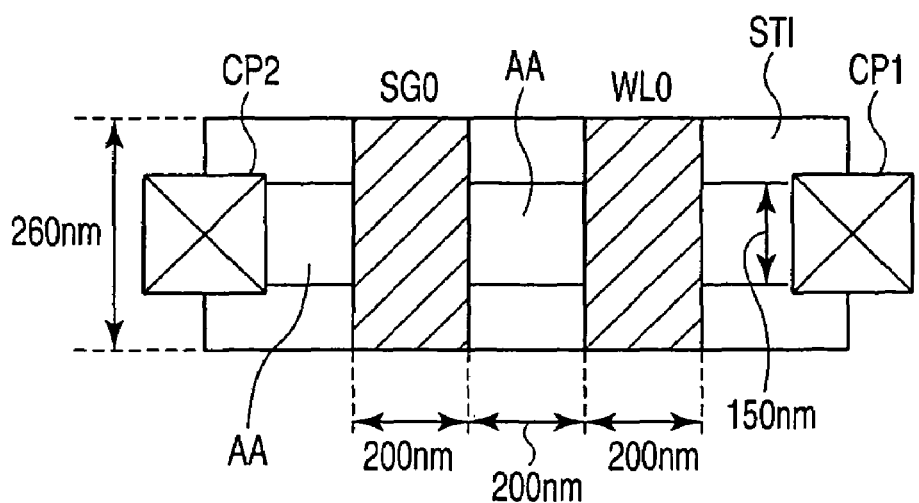
FIG. 44 is a plan view of a memory cell included in a 2Tr flash memory according to the third embodiment of the present invention.

Next, the dimensions of the NAND flash memory 400, 3Tr-NAND flash memory 410, and 2Tr flash memory 420 configured as described above will be explained. FIG. 42 is a plan view of a NAND cell. FIG. 43 is a plan view of a memory cell included in the 3Tr-NAND flash memory 410. FIG. 44 is a plan view of a memory cell included in the 2Tr flash memory.

First, as shown in FIG. 42, a width per NAND cell in the column direction is, for example, 260 nm. The width of an element region AA (or the channel width of each MOS transistor included in a NAND cell) is about 130 nm. The gate length of select gate lines SGS0 to SGSm, SGD0 to SGDm is, for example, 225 nm. The gate length of word lines WL0 to WLm is 125 nm. The distance between adjacent word lines is also 125 nm.

As shown in FIG. 43, a width per memory cell MC in the column direction included in the 3Tr-NAND flash memory 410 is, for example, 260 nm. The width of an element region AA (or the channel width of each MOS transistor included in a memory cell) is about 130 nm. The gate length of word lines WL0 to WLm and the gate length of select gate lines SGS0 to SGSm, SGD0 to SGDm are, for example, 200 nm. The distance between a word line WL and a select gate line SGS and between a word line WL and a select gate line SGD is also 200 nm.

As shown in FIG. 44, a width per memory cell MC in the column direction included in the 2Tr flash memory 420 is, for example, 260 nm. The width of an element region AA (or the channel width of each MOS transistor included in a memory cell) is about 150 nm. The gate length of select gate lines SG0 to SGm is, for example, 200 nm. The gate length of word lines WL0 to WLm and the distance between a word line WL and a select gate line SG are 200 nm.

That is, the widths of the cells included in the three flash memories 400, 410, 420 are the same. However, the channel width of the memory cells included in the 2Tr flash memory 420 is designed to be greater than the channel width of the memory cells included in the other flash memories 400, 410.

Figure 45:
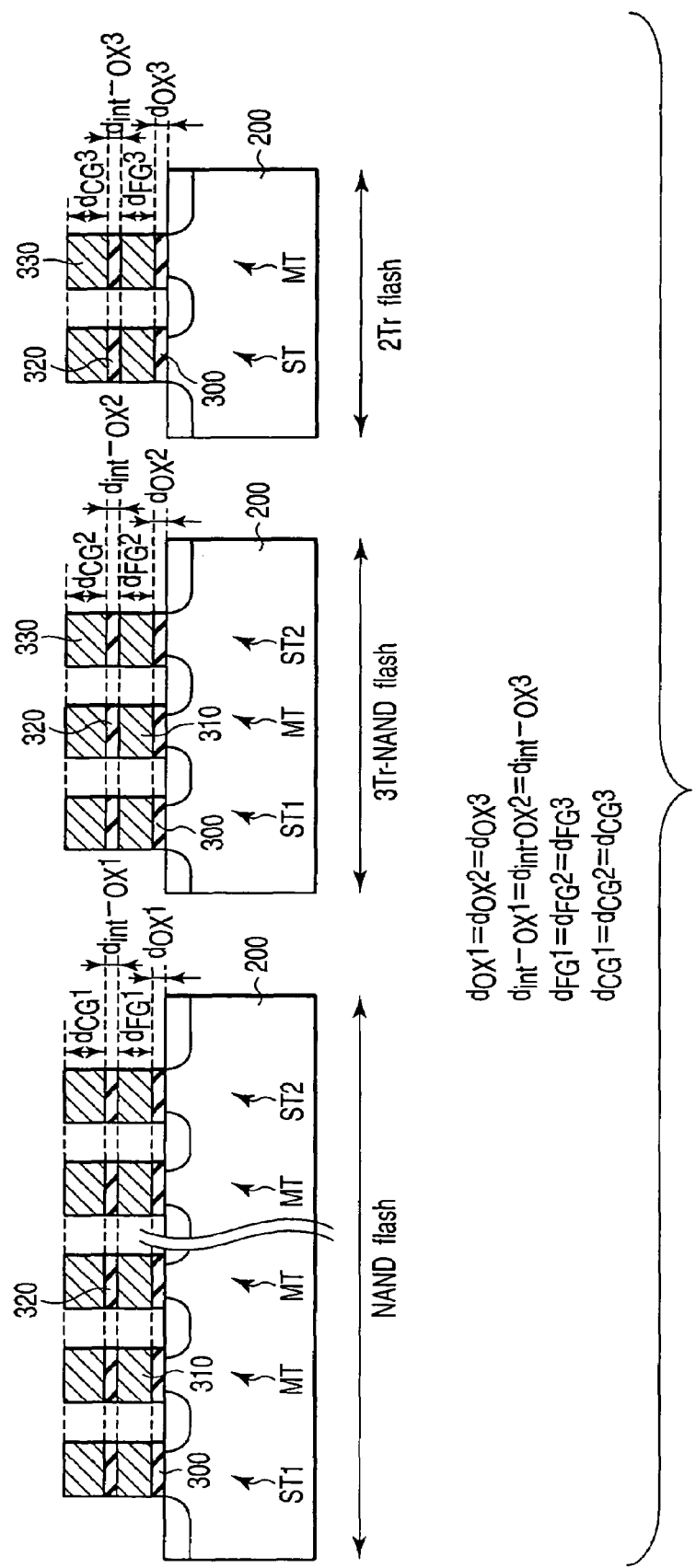
FIG. 45 is a sectional view of a memory cell included in each of the NAND flash memory, 3Tr-NAND flash memory, and 2Tr flash memory according to the third embodiment.

FIG. 45 is a sectional view of a NAND cell, a memory cell included in the 3Tr-NAND flash memory 410, and a memory cell included in the 2Tr flash memory 420.

As shown in FIG. 45, the film thicknesses dox1, dox2, dox3 of the gate insulating films 300 of the flash memories 400, 410, 420 are the same. The respective gate insulating films are formed to a thickness of, for example, 8 nm. In addition, the film thicknesses dFG1, dFG2, dFG3 of the polysilicon film 310 are the same. The respective polysilicon films are formed to a thickness of, for example, 60 nm. Furthermore, the film thicknesses dint-ox1, dint-ox2, dint-ox3 of the inter-gate insulating films 320 are the same. The respective inter-gate insulating films are formed to a thickness of, for example, 15.5 nm. In addition, the film thicknesses dCG1, dCG2, dCG3 of the polysilicon films 330 are the same. The respective polysilicon films are formed to a thickness of, for example, 200 nm.

The LSI of the third embodiment produces not only the effects in item (1) to (11) explained in the first and second embodiments but also the following effect.

(12) It is Possible to Embed a Plurality of Types of Flash Memories on a Single Chip, While Suppressing the Manufacturing Cost.

With the configuration and manufacturing method according to the third embodiment, the memory cell transistors MT and select transistors ST1, ST2, ST included in the NAND flash memory 400, 3Tr-NAND flash memory 410, and 2Tr flash memory 420 are formed in the same processes. That is, the individual MOS transistors are formed in the same oxidizing process, film-forming process, impurity implanting process, and photolithographic etching process. As a result, the gate insulating film 300, inter-gate insulating film 320, the floating gates 310 and control gates 330 of the memory cell transistors MT, and the select gates 310, 330 of the select transistors are the same in the three flash memories 400, 410, 420. In such a manufacturing method, the memory cell arrays of the three flash memories can be formed by the number of processes required to form a single flash memory. Therefore, the manufacturing cost of a system LSI including three types of semiconductor memories can be reduced.

(13) It is Possible to Reduce the Size of the System LSI, While Keeping the High Processing Accuracy of a Plurality of Types of Flash Memories.

With the configuration and manufacturing method according to the third embodiment, the patterning (photolithographic) process in forming the gate electrodes is carried out simultaneously in the three flash memories 400, 410, 420. At this time, the flash memories 400, 410, 420 differ from one another in the pattern of the gate electrode in the memory cell array. Specifically, in the NAND flash memory 400 where a plurality of memory cell transistors MT are connected in series in a NAND cell, the gate electrodes are repeated in a regular pattern. On the other hand, in the 3Tr-NAND flash memory 410 and 2Tr flash memory 420, the gate electrodes are arranged less regularly than in the NAND flash memory 400. Consequently, the optimum photolithographic condition differs from one flash memory to another. For example, if photolithography has been performed under the optimum condition for the 3Tr-NAND flash memory 410, processing is difficult with the minimum processing dimensions for the flash memories 400, 420 other than the 3Tr-NAND flash memory 410.

In the third embodiment, to overcome this problem, photolithography is performed on the NAND flash memory 400 under the optimum condition. Therefore, in the NAND flash memory 400, for example, the gate length of the memory cell transistor MT is formed with the minimum processing dimensions, which enables miniaturization. As in the third embodiment, when the NAND flash memory 400 is used as a data storage memory, the NAND flash memory 400 takes up a large area in the LSI 1. Therefore, miniaturizing the NAND flash memory 400 enables the chip size of the LSI 1 to be reduced effectively.

When the miniaturization of the NAND flash memory 400 is given priority, photolithography is not necessarily performed on the other flash memories 410, 420 under the optimum condition. Thus, the flash memories 410, 420 have to be designed, taking sufficient alignment errors into account. For example, it is desirable that the gate length of the memory cell transistor MT in each of the 3Tr-NAND flash memory 410 and 2Tr flash memory 420 should be 1.5 or more times the gate length of the memory cell transistor MT of the NAND flash memory 400. With this configuration, the NAND flash memory 400, 3Tr-NAND flash memory 410, and 2Tr flash memory 420 can be processed with high accuracy. Accordingly, the integration of the 3Tr-NAND flash memory 410 and 2Tr flash memory 420 is lower than that of the NAND flash memory 400. However, the chip size of the LSI is reduced as a whole, because of the percentage of the area they occupy in the entire LSI.

(14) The Performance of the System LSI can be Made Higher (Part 1)

The system LSI of the third embodiment has the NAND flash memory 400, 3Tr-NAND flash memory 410, and 2Tr flash memory 420.

Unlike the NAND flash memory 400 and 3Tr-NAND flash memory 410, the 2Tr flash memory 420 uses a positive voltage (10V) and a negative voltage (−6V) in a write operation and an erase operation. Thus, the 2Tr flash memory 420 gives a potential difference of 16V between the control gate and the channel. Therefore, the write inhibit voltage can be set to 0V near the midpoint between the 10V and −6V, which makes it easy to apply the write inhibit voltage from the bit line. Because the positive and negative voltages are used, the potential difference applied to the gate insulating films of the MOS transistors used in the row decoder circuit (or write decoder 20) is 10V or −6V. Therefore, the gate insulating films of the MOS transistors used in the row decoder included in the 2Tr flash memory 420 may be thinner than those of the MOS transistors used in the row decoders included in the NAND flash memory 400 and 3Tr-NAND flash memory 410. Therefore, the row decoder of the 2Tr flash memory 420 can be made more compact. In addition, the operating speed of the row decoder can be made faster than that of the row decoders of the NAND flash memory 400 and 3Tr-NAND flash memory 410. Accordingly, the operating speed of the 2Tr flash memory can be improved and the random access can be made faster.

In the third embodiment, the program data for the MCU 430 to operate is stored in the 2Tr flash memory 420. Thus, the 2Tr flash memory can operate at high speed as described above. The data can be read directly from the 2Tr flash memory 420 without the intervention of the MCU 430 or RAM. As a result, a RAM or the like is not needed, which helps simplify the configuration of the system LSI and improve the operating speed.

In addition, the 3Tr-NAND flash memory 410 holds an ID code and a security code. These code data are not so large in the amount of data, but are frequently changed and updated. Thus, the memory to hold the code data is required to operate at some high speed. In this respect, the 3Tr-NAND flash memory 410 has a smaller erase unit than that of the NAND flash memory 400 and can rewrite the data in pages. Therefore, it can be said that the 3Tr-NAND flash memory 410 is the best semiconductor memory to hold the code data.

A conventional LSI including a NAND flash memory requires the following controller to prevent rewriting from concentrating on a specific block. The controller converts addresses input in ware leveling or logic form into physical addresses or, when a block malfunctions, determines the block to be faulty and performs control to prevent the faulty block from being used. In the third embodiment, however, such a controller is not needed. The reason is that the 2Tr flash memory 420 is caused to hold a firmware program to control the blocks in the NAND flash memory 400 and the MCU 430 is caused to perform such control. The MCU 430 performs the control in an interval of time between its original jobs (such as the process of controlling an external device or the process of computing the data input to the NAND flash memory 400). Of course, when the comparison of the capacity of the MCU 430 with the amount of work the MCU 430 has to process has shown that the amount of work has exceeded the capacity, a hardware sequencer or the like may be provided to control the NAND flash memory 400.

Next, using FIGS. 46 and 47, a semiconductor memory device according to a fourth embodiment of the present invention will be explained. The fourth embodiment is such that the dimensions of the 3Tr-NAND flash memory 410 and 2Tr flash memory 420 are changed in the LSI explained in the third embodiment. FIG. 46 is a plan view of a memory cell included in the 3Tr-NAND flash memory 410. FIG. 47 is a plan view of a memory cell included in the 2Tr flash memory. The NAND flash memory 400 is as explained in FIG. 42.

As shown in FIG. 46, a width per memory cell MC in the column direction included in the 3Tr-NAND flash memory 410 is, for example, 260 nm. The width of an element region AA (or the channel width of each MOS transistor included in a memory cell) is about 130 nm. The gate length of word lines WL0 to WLm and the gate length of select gate lines SGS0 to SGSm, SGD0 to SGDm are, for example, 250 nm. The distance between a word line WL and a select gate line SGS and between a word line WL and a select gate line SGD is also 250 nm.

As shown in FIG. 47, a width per memory cell MC in the column direction included in the 2Tr flash memory 420 is, for example, 260 nm. The width of an element region AA (or the channel width of each MOS transistor included in a memory cell) is about 150 nm. The gate length of select gate lines SG0 to SGm is, for example, 250 nm. The gate length of word lines WL0 to WLm and the distance between a word line WL and a select gate line SG are 250 nm.

That is, in the fourth embodiment, the word line width in the 3Tr-NAND flash memory 410 and 2Tr flash memory 420 is designed to be greater than the word line width in the NAND flash memory 400.

The configuration of the fourth embodiment produces not only the effects in items (1) to (14) explained in the first to third embodiments but also the following effect in item (15).

(15) The Operation Reliability of Each Flash Memory can be Improved.

The way the write inhibit voltage is applied in the NAND flash memory 400 and 3Tr-NAND flash memory 410 differs from that in the 2Tr flash memory 420. In the NAND flash memory 400 and 3Tr-NAND flash memory 410, the channel potential of the memory cell transistor MT is raised to the write inhibit voltage through coupling with the word line. On the other hand, in the 2Tr flash memory 420, the write inhibit voltage is applied from the bit line to the channel of the memory cell transistor MT.

In the NAND flash memory 400, to prevent the channel potential raised through coupling from dropping, leakage current in the select transistor has to be suppressed. This holds true for the 3Tr-NAND flash memory 410. In the 3Tr-NAND flash memory 410, the channel capacity is small because the number of memory cell transistors sandwiched between the select transistors ST1, ST2 is small. Therefore, the amount of charge produced by coupling is smaller than in the NAND flash memory 400. Accordingly, the 3Tr-NAND flash memory 410 is more liable to be affected by leakage current than the NAND flash memory 400.

With the configuration of the fourth embodiment, the channel width (select gate line width) of each of the select transistors ST1, ST2 of the 3Tr-NAND flash memory 410 is greater than that of the select transistors ST1, ST2 of the NAND flash memory 400. Therefore, leakage current is less liable to flow in the select transistors ST1, ST2 of the 3Tr-NAND flash memory 410, which improves the operation reliability of the 3Tr-NAND flash memory 410.

In addition, since the write inhibit voltage is applied from the bit line in the 2Tr flash memory 420, the 2Tr flash memory 420 is less liable to be affected by leakage current than the NAND flash memory 400 and 3Tr-NAND flash memory 410. However, from the viewpoint of a margin in photolithographic processing, it is desirable that the channel length of the select transistor ST should be about 250 nm.

Furthermore, the photolithographic processing of word lines is done under the optimum condition in the NAND flash memory 400. Therefore, the channel length of the memory cell transistor MT of the 2Tr flash memory 420 is greater than that of the memory cell transistor of the NAND flash memory 400. In general, as the channel length becomes greater, the cell current decreases, which results in a decrease in the operating speed.

However, with the configuration of the fourth embodiment, as shown in FIG. 47, the channel width of the 2Tr flash memory 420 is designed to be greater than that of each of the NAND flash memory 400 and 3Tr-NAND flash memory 410. As a result, the cell current flowing through the 2Tr flash memory 420 can be increased. That is, making the channel width greater compensates for an adverse effect on the 2Tr flash memory 420 in miniaturizing the NAND flash memory 400, which improves the operating speed of the 2Tr flash memory 420.

Figure 48:
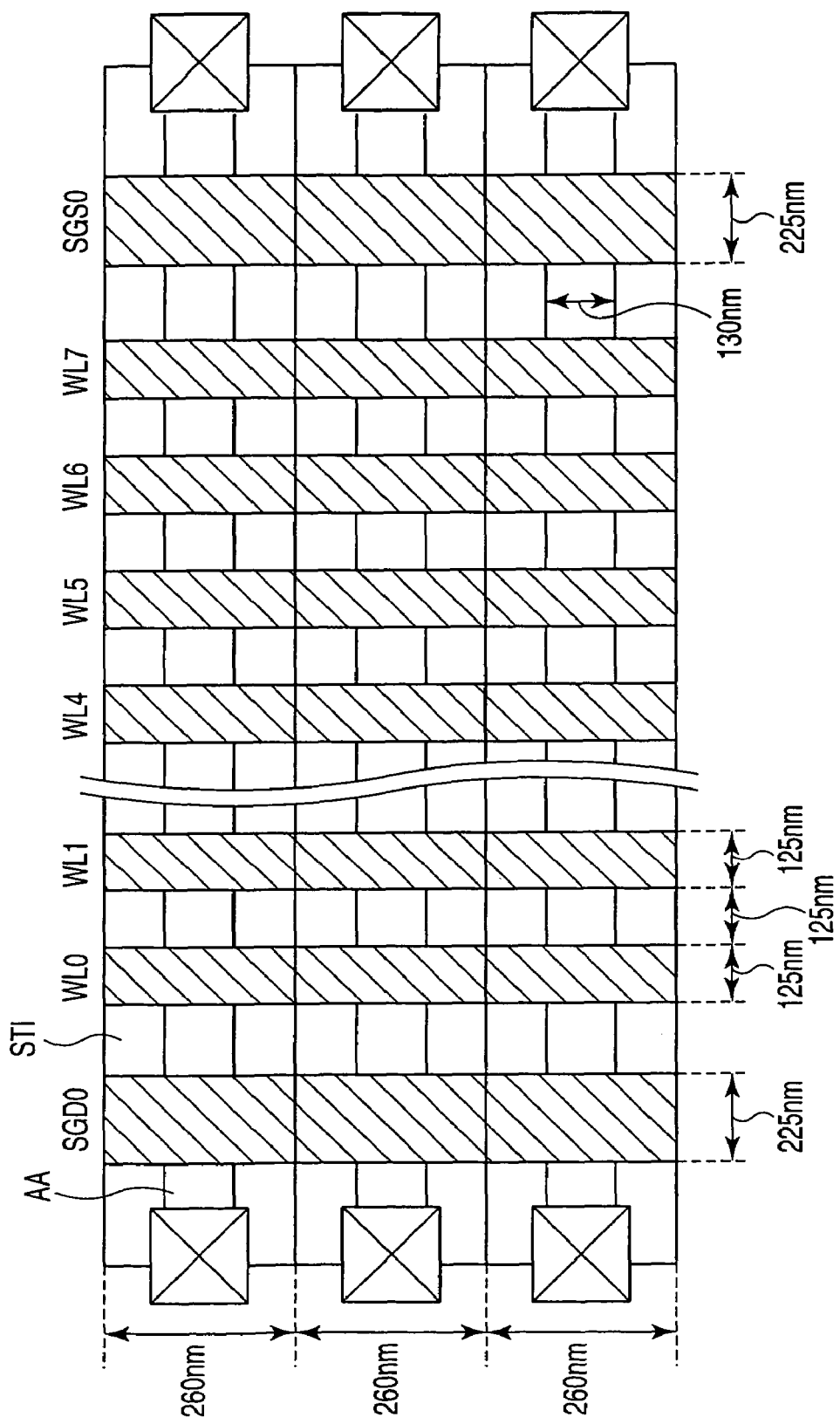
FIG. 48 is a plan view of a NAND cell included in a NAND flash memory according to a fifth embodiment of the present invention.

Next, a semiconductor memory device according to a fifth embodiment of the present invention will be explained. The fifth embodiment is such that the cell width in the column direction is made greater in the memory cell array of the 2Tr flash memory 410 included in the system LSI according to each of the third and fourth embodiments. FIGS. 48 to 50 are plan views of a part of the memory cell array 10 included in each of the NAND flash memory 400, 3Tr-NAND flash memory 410, and 2Tr flash memory 420 included in the system LSI 1 of the fifth embodiment, respectively.

As shown in the figures, the NAND flash memory 400 and 3Tr-NAND flash memory 410 are as explained in the fourth embodiment. Specifically, in the NAND flash memory 400, the width of an element region (or the channel width) is set to, for example, about 130 nm, the width of each of the select gate lines SGS, SGD (the channel length of each of the select transistors ST1, ST2) is set to, for example, 225 nm, the width of a word line WL (the channel width of a memory cell transistor MT) is set to 125 nm, and the distance between adjacent word lines WL is set to, for example, 125 nm. The width per NAND cell in the column direction is, for example 260 nm. Therefore, in a NAND cell, a 130-nm-wide element region AA is flanked with 65-nm-wide element isolating regions STI in the column direction.

In addition, the 3Tr-NAND flash memory 410 is as explained in the fourth embodiment. Specifically, the width of an element region (or the channel width) is set to, for example, about 130 nm, the width of each of the select gate lines SGS, SGD (the channel length of each of the select transistors ST1, ST2) is set to, for example, 250 nm, the width of a word line WL (the channel width of a memory cell transistor MT) is set to 250 nm, and the distance between a select gate line and a word line is set to, for example, 250 nm. The width per memory cell in the column direction is, for example 260 nm. Therefore, in a memory cell, a 130-nm-wide element region AA is flanked with 65-nm-wide element isolating regions STI in the column direction.

In the 2Tr flash memory 420, as shown in FIG. 50, the width of an element region (or the channel width) is set to 150 nm, the width of a select gate lines SG (the channel length of a select transistor ST) is set to, for example, 250 nm, the width of a word line WL (the channel width of a memory cell transistor MT) is set to 250 nm, and the distance between a select gate line and a word line is set to 250 nm. The width per memory cell in the column direction is, for example, 300 nm. Therefore, in a memory cell, a 150-nm-wide element region AA is flanked with 75-nm-wide element isolating regions STI in the column direction.

The LSI of the fifth embodiment produces not only the effects in items (1) to (15) but also the following effect in item (16).

(16) The Performance of the System LSI can be Made Higher (Part 2)

The channel width of the 2Tr flash memory 420 according to each of the third and fourth embodiments is made greater than that in each of the NAND flash memory 400 and 3Tr-NAND flash memory 410. If the 2Tr flash memory 420 has the same cell width as that of each of the NAND flash memory 400 and 3Tr-NAND flash memory 410, the width of an element isolating region becomes narrower. If the channel width is increased too much, this might lead to an insufficient electrical separation between the element regions in an element isolating region or make the formation of element isolating regions difficult.

However, in the 2Tr flash memory 410 of the fifth embodiment, the width in the column direction is made greater than that in each of the NAND flash memory 400 and 3Tr-NAND flash memory 410. Therefore, the width of an element isolating region can be made greater, which simplifies the processes and enables a reliable electrical separation between the element regions. In addition, the width of an element region (or the channel width) can be made greater than in a case where the cell width is the same as that in each of the NAND flash memory 400 and 3Tr-NAND flash memory 410. As a result, the current caused to flow by a memory cell can be increased further, which improves the operating performance of the 2Tr flash memory.

As described above, the 2Tr flash memory 410 holds a program and others needed to operate the MCU 430. Therefore, the capacity of the 2Tr flash memory may be smaller than that of the NAND flash memory 400 used for data storage. For example, if the memory capacity of the NAND flash memory 400 is 128 megabits, the memory capacity of the 2Tr flash memory 420 is about 16 megabits. That is, the area occupied by the 2Tr flash memory 420 in the LSI 1 is much smaller than that occupied by the NAND flash memory 400. Therefore, even if the channel width of a memory cell in the 2Tr flash memory 410 is increased, the increase of the area of the LSI can be kept to a minimum.

Next, using FIG. 51, a semiconductor memory device according to a sixth embodiment of the present invention will be explained. The sixth embodiment relates to a plane pattern of source lines in the first embodiment. FIG. 51 is a plan view of a part of the memory cell array 10 of the 2Tr flash memory, which corresponds to FIG. 6 explained in the first embodiment.

As shown in FIG. 51, in a source contact region SCA, a metal wiring layer 500 is formed which connects adjacent metal wiring layers 210. This metal wiring layer 500 is formed at the same level (the first layer) as that of the metal wiring layer 210. That is, a source line SL includes the metal wiring layers 210 and 500. In other words, the source line SL is shaped like a ladder.

The configuration of the sixth embodiment produces not only the effects in items (1) to (16) but also the following effect in item (17).

(17) The Read Operation Reliability can be Improved (Part 2)

With the configuration of the sixth embodiment, the source line SL includes the metal wiring layers 210, 500. A plurality of metal wiring layers 210, which are provided for the contact plugs CP1 in the same row in a one-to-one correspondence, are connected to one another by the metal wiring layer 500. that is, the source line SL is not separated in the bit line direction. Therefore, the read current can flow not only in the word line direction but also in the bit line direction, which enables the resistance of the source line SL to be decreased.

Accordingly, it is possible to suppress the rise of the potential on the source line SL in a read operation, which improves the read reliability of the flash memory.

Figure 52:
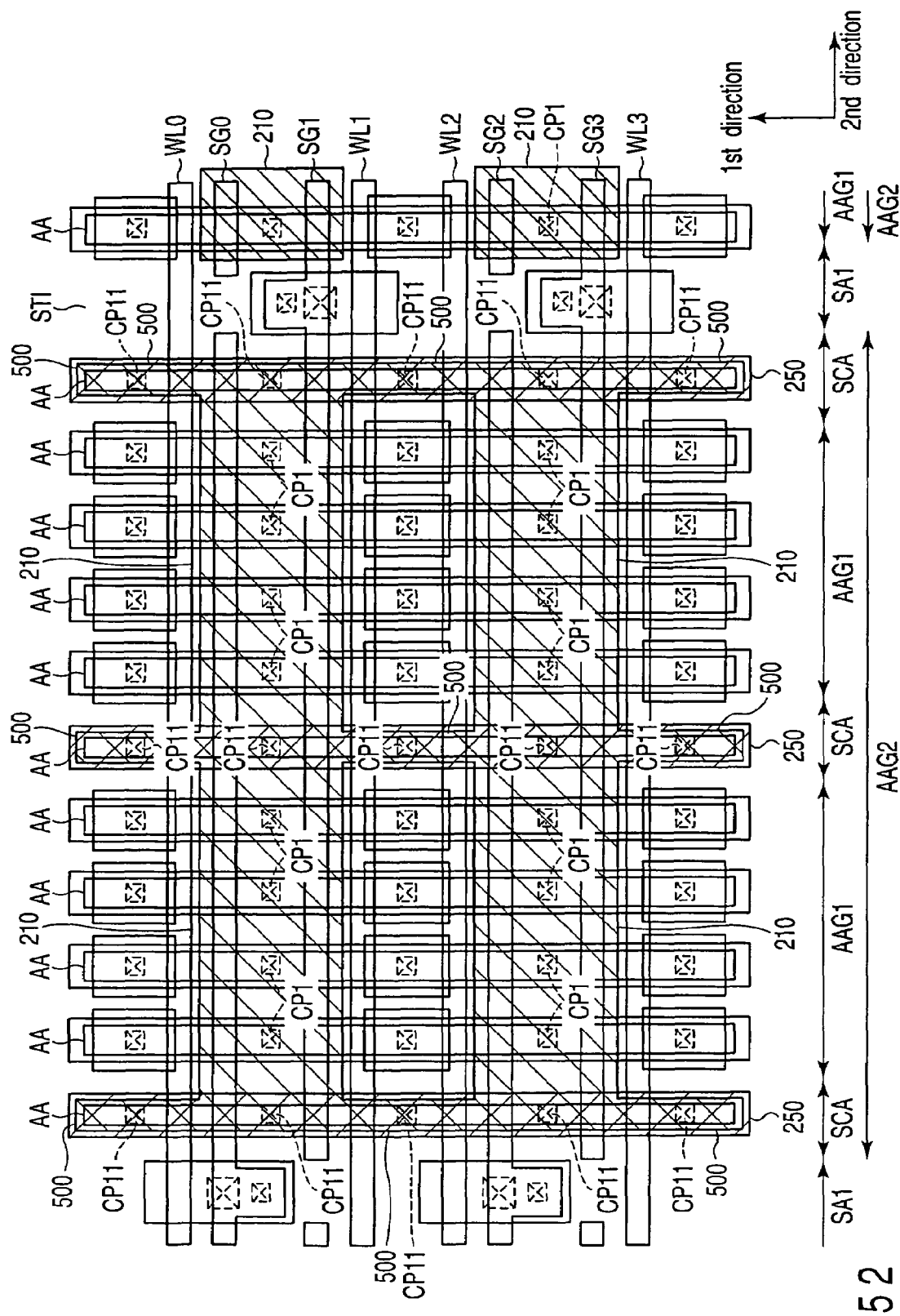
FIG. 52 is a plan view of a memory cell array included in a 2Tr flash memory according to a seventh embodiment of the present invention, particularly focusing on a source line.

Next, using FIG. 52, a semiconductor memory device according to a seventh embodiment of the present invention will be explained. The seventh embodiment, which relates to a plane pattern of source lines in the first embodiment, is a combination of the first and sixth embodiments. FIG. 52 is a plan view of a part of the memory cell array 10 of the 2Tr flash memory, particularly focusing on source lines.

As shown in FIG. 52, the flash memory of the seventh embodiment is such that a metal wiring layer 250 is formed in a source contact region SCA in FIG. 51 explained in the sixth embodiment. In the source contact region SCA, the metal wiring layer 210, 500 are connected to the metal wiring layer 250 by a contact plug CP11. That is, the source line SL includes the metal wiring layers 210, 500, 250.

The configuration of the seventh embodiment produces not only the effects in items (1) to (17) but also the following effect in item (18).

(18) The Read Operation Reliability can be Improved (Part 3)

In the configuration of the seventh embodiment, the source line SL includes the first-layer and second-layer metal wiring layers. The first-layer and second-layer metal wiring layers are connected to each other by a contact plug CP11. The first-layer source line SL includes the metal wiring layers 210, 500. Therefore, in the source contact region SCA, the source line is shaped like a strip extending in the bit line direction. Accordingly, the contact plug CP11 connecting the first-layer metal wiring layers 210, 500 to the second-layer metal wiring layer 250 can be formed anywhere in the source contact region SCA. While in FIG. 52, the number of contact plugs CP 11 is five for every four word lines and select gate lines, the number may be increased suitably.

The contact plug has the property of deteriorating easily as a result of current concentration. Therefore, when the source line is composed of the first-layer and second-layer metal wiring layers, a small number of contact plugs connecting them can result in the concentration of current on the contact plugs, destroying the contact plugs. The destruction of the contact plugs leads to an increase in the resistance of the source line SL.

However, with the configuration of the seventh embodiment, the number of contact plugs CP11 can be increased substantially, which helps prevent the contact plugs 11 from being destroyed. As described above, the resistance of the source line SL is made lower, which improves the read operation reliability.

While in the sixth and seventh embodiments, the explanation has been given using the 2Tr flash memory, the same holds true for a 3Tr-NAND flash memory.

Figure 53:
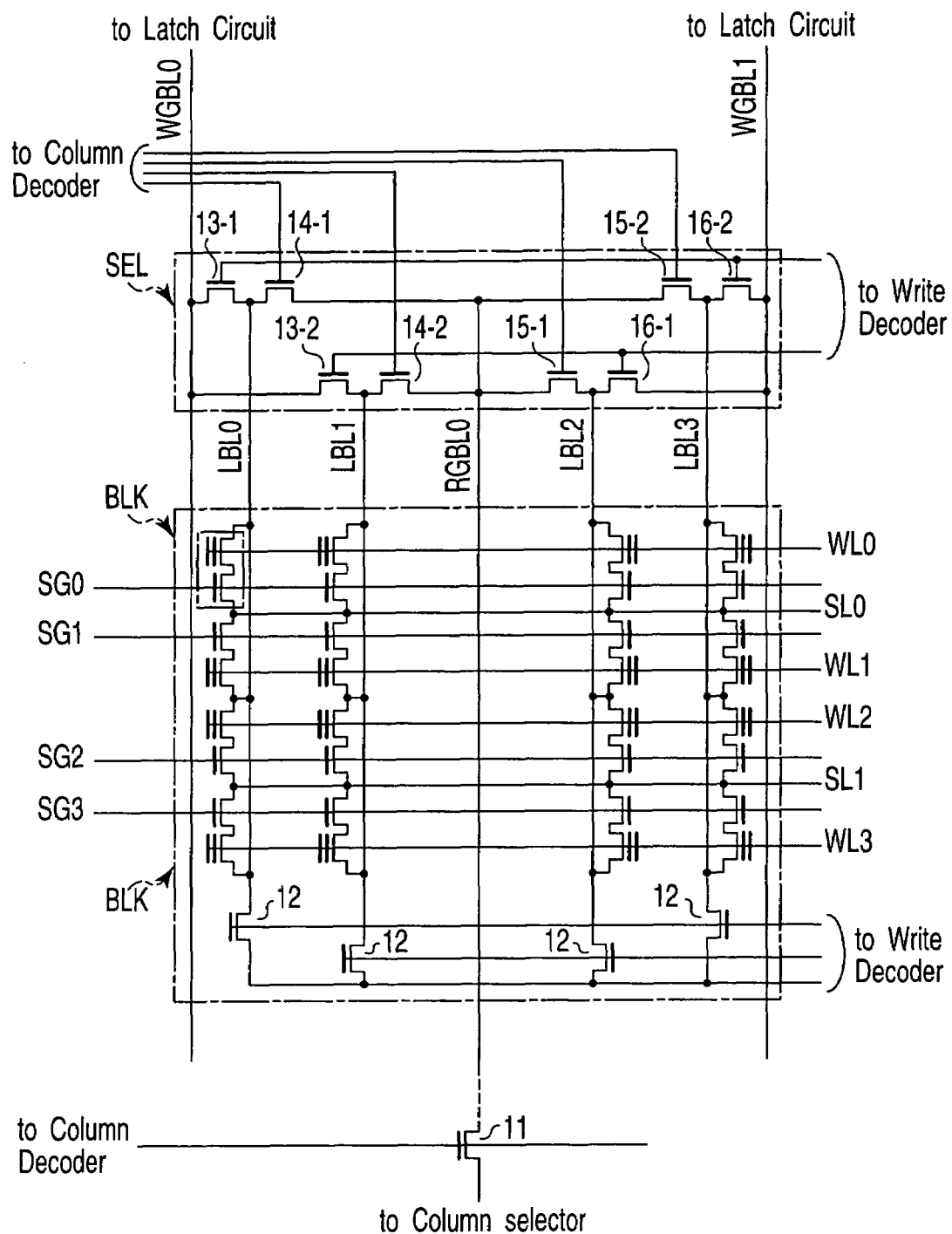
FIG. 53 is a circuit diagram of a memory cell array included in a 2Tr flash memory according to an eighth embodiment of the present invention.

Next, a nonvolatile semiconductor memory device according to a eighth embodiment of the present invention will be explained by reference to FIG. 53. The eighth embodiment is such that one memory cell block BLK of the first embodiment includes (4×4) memory cells MCs. FIG. 53 is a circuit diagram of a memory cell block BLK and a selector SEL in a flash memory of the eighth embodiment. The flash memory of the eighth embodiment has the same configuration as that of FIG. 2 except that the configuration of the memory cell block BLK and selector SEL in the first embodiment is replaced with the configuration of FIG. 53. Therefore, explanation of the configuration excluding the memory cell block BLK and selector SEL will be omitted.

As shown in FIG. 53, in the eighth embodiment, one memory cell block includes four columns of memory cells, whereas one memory cell block includes two columns of memory cells MCs in the first embodiment. That is, there are (4×4) memory cells MCs per memory cell block BLK. The drain regions of the memory cell transistors MTs of the memory cells in the four columns are connected to four local bit lines LBL0 to LBL3 in a one-to-one correspondence. One end of each of the local bit lines LBL0 to LBL3 is connected to a selector SEL. The other ends of the local bit lines are connected to a write decoder 20 via the current paths of MOS transistors 12. The gates of the MOS transistors 12 connected to the local bit lines LBL0, LBL2 are connected in common to one another. The gates of the MOS transistors 12 connected to the local bit lines LBL1, LBL3 are connected in common to one another. Furthermore, the control gates of memory cell transistors MT in the same row are connected in common to any one of the word lines WL0 to WL3. The gates of select transistors ST in the same row are connected in common to any one of the select gate lines SG0 to SG3. The source regions of the select transistors ST are connected in common in all of the memory cells MC.

Next, the configuration of a selector SEL will be explained. A selector SEL, which is provided for each memory cell block BLK, has eight MOS transistors 13-1 to 16-1, 13-2 to 16-2. The four MOS transistors 13-1, 14-1, 15-2, 16-2 are connected in series. The four MOS transistors 13-2, 14-2, 15-1, 16-1 are connected in series. Specifically, one end of the current path of the MOS transistor 13-1 is connected to one end of the current path of the MOS transistor 14-1. The other end of the current path of the MOS transistor 14-1 is connected to one end of the current path of the MOS transistor 15-2. The other end of the current path of the MOS transistor 15-2 is connected to one end of the current path of the MOS transistor 16-2. Furthermore, one end of the current path of the MOS transistor 13-2 is connected to one end of the current path of the MOS transistor 14-2. The other end of the current path of the MOS transistor 14-2 is connected to one end of the current path of the MOS transistor 15-1. The other end of the current path of the MOS transistor 15-1 is connected to one end of the current path of the MOS transistor 16-1. The gates of the MOS transistors 13-1, 13-2, 16-1, 16-2 are connected to the write decoder 20. The gates of the MOS transistors 14-1, 14-2, 15-1, 15-2 are connected to the column decoder 40. The local bit line LBL0 is connected to the connection node of the MOS transistor 13-1 and the MOS transistor 14-1. The local bit line LBL1 is connected to the connection node of the MOS transistor 13-2 and the MOS transistor 14-2. The local bit line LBL2 is connected to the connection node of the MOS transistor 15-1 and the MOS transistor 16-1. The local bit line LBL3 is connected to the connection node of the MOS transistor 15-2 and the MOS transistor 16-2. Furthermore, the other ends of the MOS transistors 13-1, 13-2 are connected to the write global bit line WGBL0. The other ends of the MOS transistors 16-1, 16-2 are connected to the write global bit line WGBL1. The current paths of the MOS transistors 13-1, 13-2 in the same column are connected in common to the write global bit line WGBL0. The current paths of the MOS transistors 16-1, 16-2 in the same column are connected in common to the write global bit line WGBL1. Each of the write global bit lines WGBL0, WGBL1 is connected to the corresponding latch circuit 51.

The read global bit line RGBL0 is connected to the connection node of the MOS transistor 14-1 and MOS transistor 15-2 and to the connection node of the MOS transistor 14-2 and MOS transistor 15-1. The connection node of the MOS transistor 14-1 and MOS transistor 15-2 in the same column and the connection node of the MOS transistor 14-2 and MOS transistor 15-1 in the same column are connected in common to the read global bit line RGBL0. Then, one end of the read global bit line RGBL0 is connected to the sense amplifier 70 via the MOS transistor 11. The gate of the MOS transistor 11 is connected to the column decoder 40.

A plurality of memory cell blocks BLK and selectors SEL configured as described above are arranged in a matrix in the memory cell array 20 as explained in the first embodiment.

In the memory cell block configured as described above, local bit line LBL0 or LBL1 is connected to write global bit line WGBL0 by one of MOS transistors 13-1, 13-2 in a write operation. In addition, local bit line LBL02 or LBL3 is connected to write global bit line WGBL1 by one of MOS transistors 16-1, 16-2. In a read operation, any one of LBL0 to LBL3 is connected to the read global bit line RGBL by any one of MOS transistors 14-1, 14-2, 15-1, 15-2. The other operations are as explained in the first embodiment.

The configuration of this embodiment further produces the following effect in item (19).

(19) A Flash Memory Manufacturing Method can be Carried Out Easily.

In the first embodiment, two columns of memory cells have been formed in a memory cell block BLK. Therefore, two metal wiring layers (write global bit lines) 280 and one metal wiring layer (read global bit line) 290 explained in FIG. 9 are formed in the area in which two columns of memory cells have been formed.

However, in this embodiment, four columns of memory cells are included in a memory cell block BLK. Therefore, two metal wiring layers 280 and one metal wiring layer 290 are formed in the area in which four columns of memory cells are formed. The area is twice as large as that in the first embodiment. In other words, the wiring margin for the metal wiring layers 280, 290 is doubled. This facilitates the patterning of the metal wiring layers 280, 290 and therefore makes the manufacture of flash memory products easier.

Moreover, since the wiring margin is doubled, adjacent metal wiring layers 280, 290 can be separated reliably, which helps improve the production yield.

Figure 54:
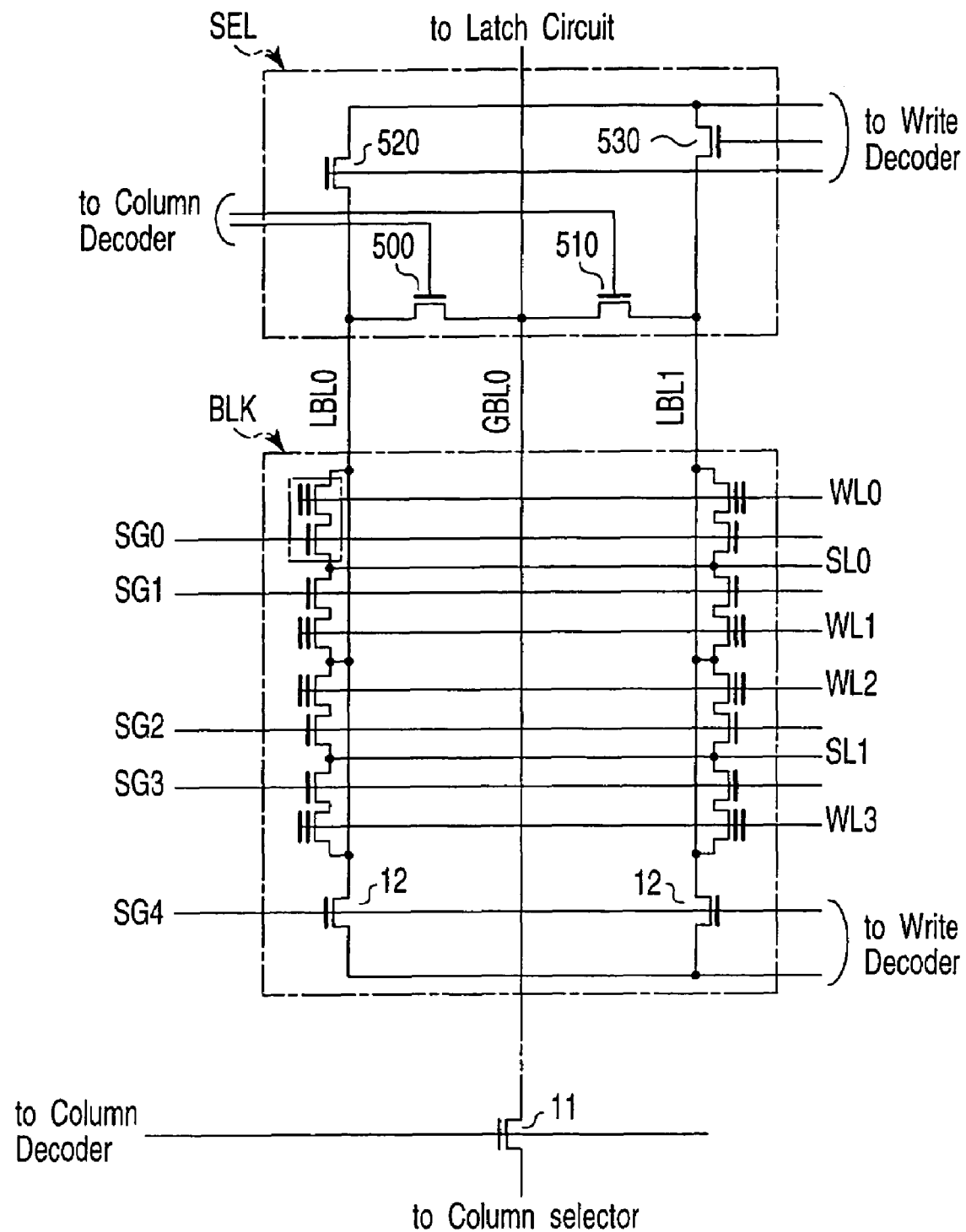
FIG. 54 is a circuit diagram of a memory cell array included in a 2Tr flash memory according to a ninth embodiment of the present invention.

Next, a nonvolatile semiconductor memory device according to a ninth embodiment of the present invention will be explained by reference to FIG. 54. The ninth embodiment is such that the write global bit line and read global bit line in the first embodiment are in common use. FIG. 54 is a circuit diagram of a memory cell block BLK and a selector SEL included in a flash memory according to the ninth embodiment. A flash memory of the ninth embodiment is the same as that of FIG. 1 except that the configuration of the memory cell block BLK and selector SEL is replaced with that of FIG. 54.

As shown in the figure, the configuration of a memory cell block BLK is the same as that of the first embodiment. That is, each memory cell block BLK includes two columns of memory cells.

A selector SEL includes four MOS transistors 500 to 530. As shown in the figure, the MOS transistors 500, 510 are connected in series between local bit lines LBL0 and LBL1. Specifically, one end of the current path of the MOS transistor 500 is connected to the local bit line LBL0. The other end of the current path of the MOS transistor 500 is connected to one end of the current path of the MOS transistor 510. The other end of the current path of the MOS transistor 510 is connected to the local bit line LBL1. The gates of the MOS transistors 500, 510 are connected to the column decoder 40. The connection node of the MOS transistors 500, 510 is connected to any one of the global bit lines GBL0 to GBL(n−1). The connection node of the MOS transistors 500, 510 in each of the selectors SEL in the same column is connected in common to each of the global bit lines GBL0 to GBL(n−1). One end of each of the global bit lines GBL0 to GBL(n−1) is connected to a latch circuit 51. The other end of each of the global bit lines GBL0 to GBL(n−1) is connected to a column selector via a MOS transistor 11. The gates of the MOS transistors 11 provided for the respective global bit lines GBL0 to GBL(n−1) are connected in common to one another and are connected to the column decoder 40.

Furthermore, one end of the current path of the MOS transistors 520 is connected to the local bit line LBL0. One end of the current path of the MOS transistor 530 is connected to the local bit line LBL1. The other ends of the current paths of the MOS transistors 520, 530 are connected in common to one another and are connected to the write decoder 20. The gates of the MOS transistors 520, 530, which are independent of each other, are connected to the write decoder 20.

In the memory cell block configured as described above, local bit line LBL0 or LBL1 is connected to global bit line GBL0 by one of the MOS transistors 500 and 510 in a write and a read operation. When local bit line LBL0 is selected, the MOS transistor 520 is turned off, with the result that the data from the latch circuit 51 is transferred to local bit line LBL0. When local bit line LBL1 is selected, the MOS transistor 530 is turned off, with the result that the data from the latch circuit 51 is transferred to local bit line LBL1.

In the configuration of this embodiment, only one global bit line GBL passes through one memory cell block. Therefore, a wiring margin in forming metal wiring layers serving as global bit lines GBL can be secured. As a result, the effect in item (19) explained in the eighth embodiment is obtained.

Figure 55:
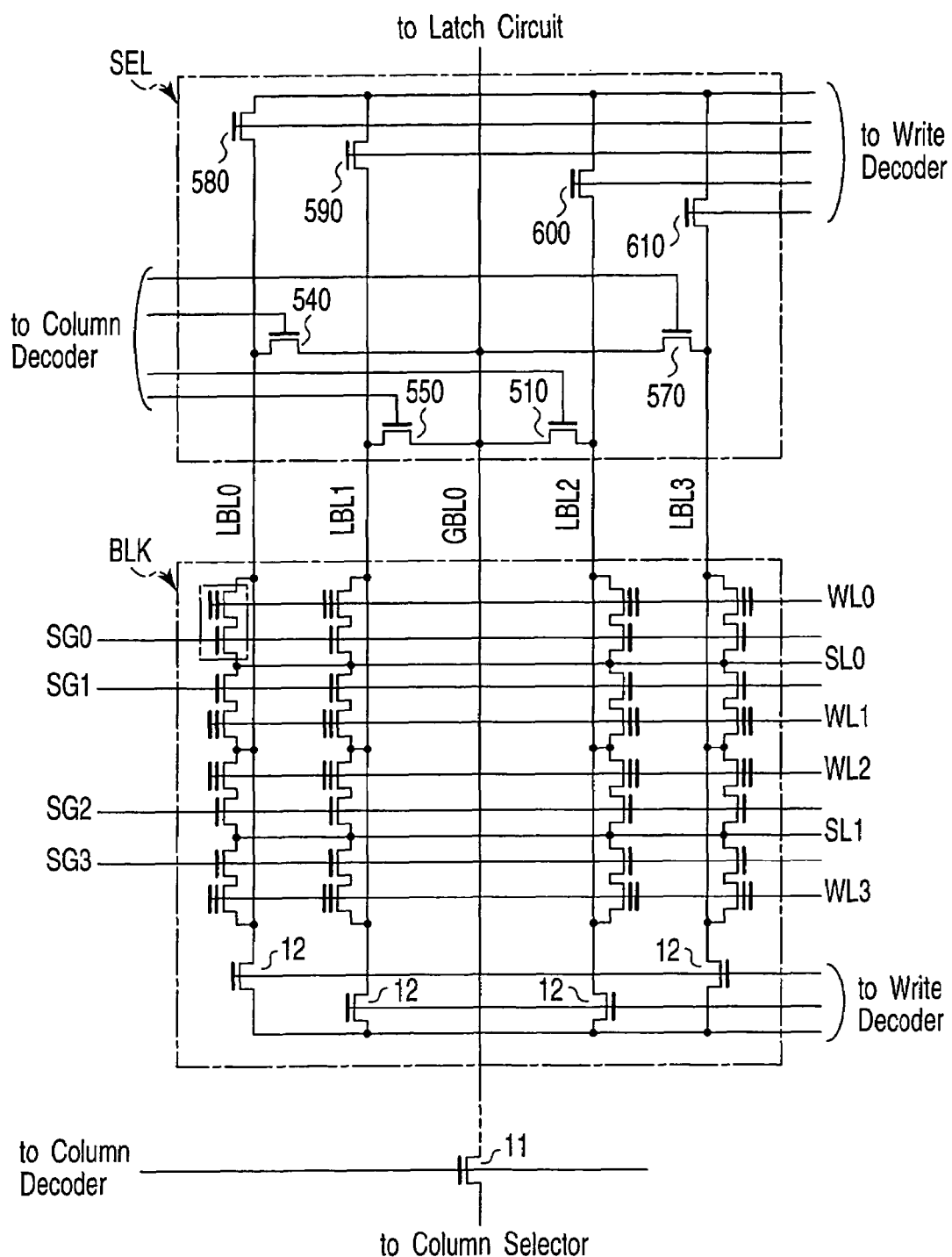
FIG. 55 is a circuit diagram of a memory cell array included in a 2Tr flash memory according to a tenth embodiment of the present invention.

Next, a nonvolatile semiconductor memory device according to a tenth embodiment of the present invention will be explained by reference to FIG. 55. The tenth embodiment is a combination of the eighth and ninth embodiments. FIG. 55 is a circuit diagram of a memory cell block BLK and a selector SEL included in a flash memory according to the tenth embodiment. A flash memory of the tenth embodiment is the same as that of FIG. 1 except that the configuration of the memory cell block BLK and selector SEL is replaced with that of FIG. 55.

As shown in the figure, the configuration of a memory cell block BLK is the same as that of the eighth embodiment. Each memory cell block BLK includes four columns of memory cells.

A selector SEL includes eight MOS transistors 540 to 610. As shown in the figure, the MOS transistors 540, 570 are connected in series between the local bit lines LBL0 and LBL3. Specifically, one end of the current path of the MOS transistor 540 is connected to local bit line LBL0. The other end of the current path of the MOS transistor 540 is connected to the current path of the MOS transistor 570. The other end of the current path of the MOS transistor 570 is connected to the local bit line LBL3. The gates of the MOS transistors 540, 570 are connected to the column decoder 40. The connection node of the MOS transistors 540, 570 is connected to any one of the global bit lines GBL0 to GBL(n−1). The MOS transistors 550, 560 are connected in series between the local bit lines LBL1 and LBL2. Specifically, one end of the current path of the MOS transistor 550 is connected to local bit line LBL1. The other end of the current path of the MOS transistor 550 is connected to one end of the current path of the MOS transistor 560. The other end of the current path of the MOS transistor 560 is connected to the local bit line LBL2. The gates of the MOS transistors 550, 560 are connected to the column decoder 40. The connection node of the MOS transistors 550, 560 is connected to any one of the global bit lines GBL0 to GBL(n−1). The connection node of the MOS transistors 540, 570 and the connection node of the MOS transistors 550, 560 in the same column are connected in common to each of the global bit lines GBL0 to GBL(n−1). Then, one end of each of the global bit lines GBL0 to GBL(n−1) is connected to a latch circuit 51. The other end of each of the global bit lines GBL0 to GBL(n−1) is connected to a sense amplifier 70 via a MOS transistor 11.

Furthermore, one end of the current path of each of the MOS transistors 580 to 610 is connected to the local bit lines LBL0 to LBL3, respectively. The other ends of the current paths of the MOS transistors 580 to 610 are connected in common to one another and are connected to the write decoder 20. The gates of the MOS transistors 580 to 610 are connected to the write decoder 20.

In the memory cell block configured as described above, any one of local bit lines LBL0 to LBL3 is connected to global bit line GBL0 by any one of the MOS transistors 540 to 570. When local bit line LBL0 is selected, the MOS transistor 580 is turned off, with the result that the data from the latch circuit 51 is transferred to local bit line LBL0. When local bit line LBL1 is selected, the MOS transistor 590 is turned off, with the result that the data from the latch circuit 51 is transferred to local bit line LBL1. When local bit line LBL2 is selected, the MOS transistor 600 is turned off, with the result that the data from the latch circuit 51 is transferred to local bit line LBL2. When local bit line LBL3 is selected, the MOS transistor 610 is turned off, with the result that the data from the latch circuit 51 is transferred to local bit line LBL3.

In the configuration of this embodiment, only one global bit line GBL passes through one memory cell block including four columns of memory cells. Therefore, a wiring margin in forming metal wiring layers serving as global bit lines GBL can be secured. As a result, the effect in item (19) explained in the eighth embodiment is obtained.

As described above, in a nonvolatile semiconductor memory device according to each of the first to tenth embodiments, the second polysilicon layer 330 is kept in an electrically floating state in a select gate line with a stacked gate which includes the first polysilicon layer 310 formed above the semiconductor substrate via a gate insulating film and the second polysilicon layer 330 formed above the first polysilicon layer 310 via an inter-gate insulating film.

Therefore, when the potential on the select gate line varies, the effect of coupling on the control gate of the memory cell transistor can be reduced. This makes a variation in the potential of the control gate caused by coupling very small and allows the potential of the control gate to be determined quickly. As a result, the operation speed of the flash memory can be improved.

The second polysilicon layer 330 of a select transistor does not function as a select gate line, whereas the polysilicon layer 310 practically functions as a select gate line. Thus, the row select signal supplied from the decode circuit is transmitted by the polysilicon layer 310.

Figure 56:
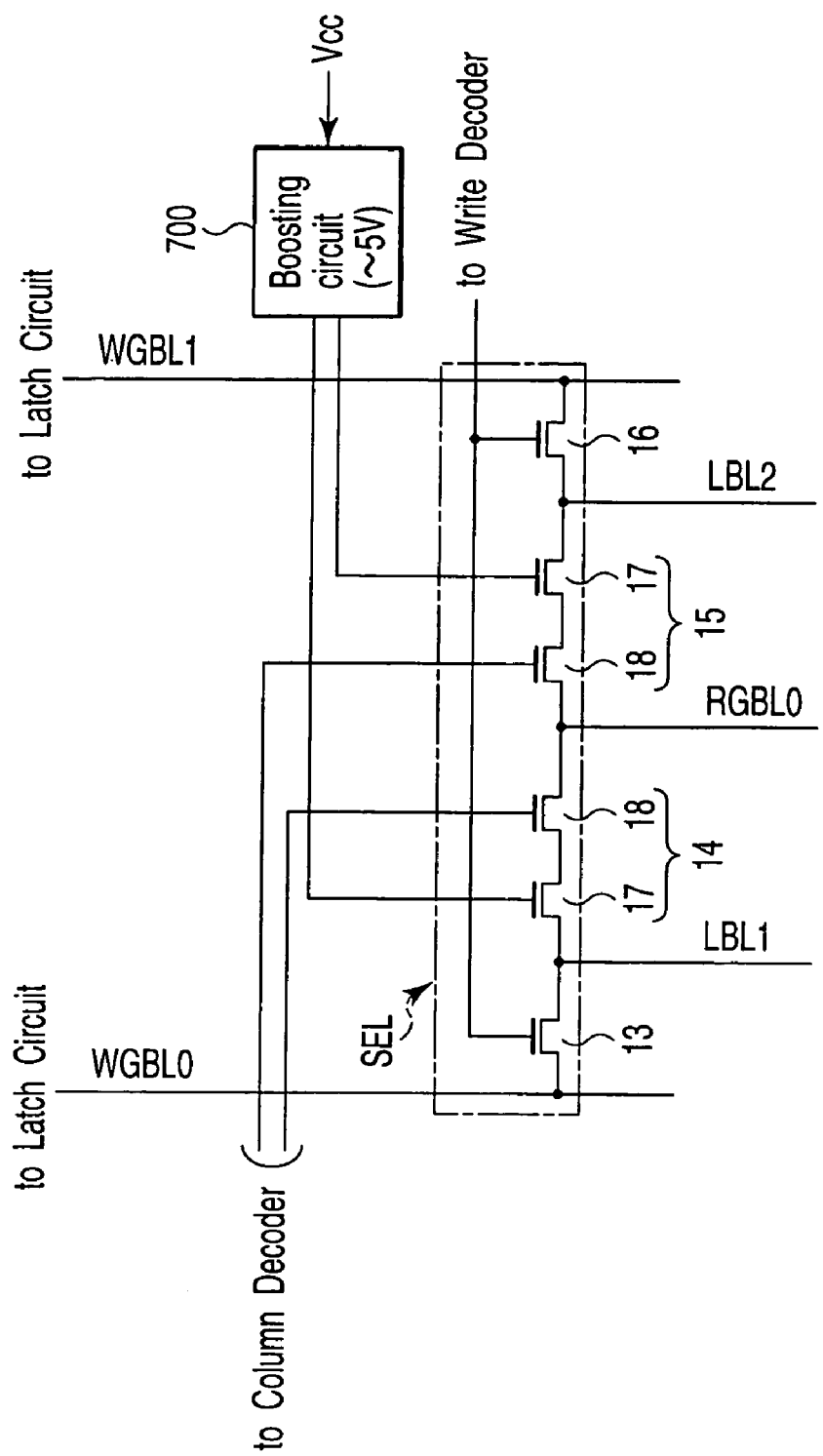
FIG. 56 is a circuit diagram of a selector in a 2Tr flash memory according to a first modification of each of the first embodiment and the third to tenth embodiments of the present invention.
Figure 57:
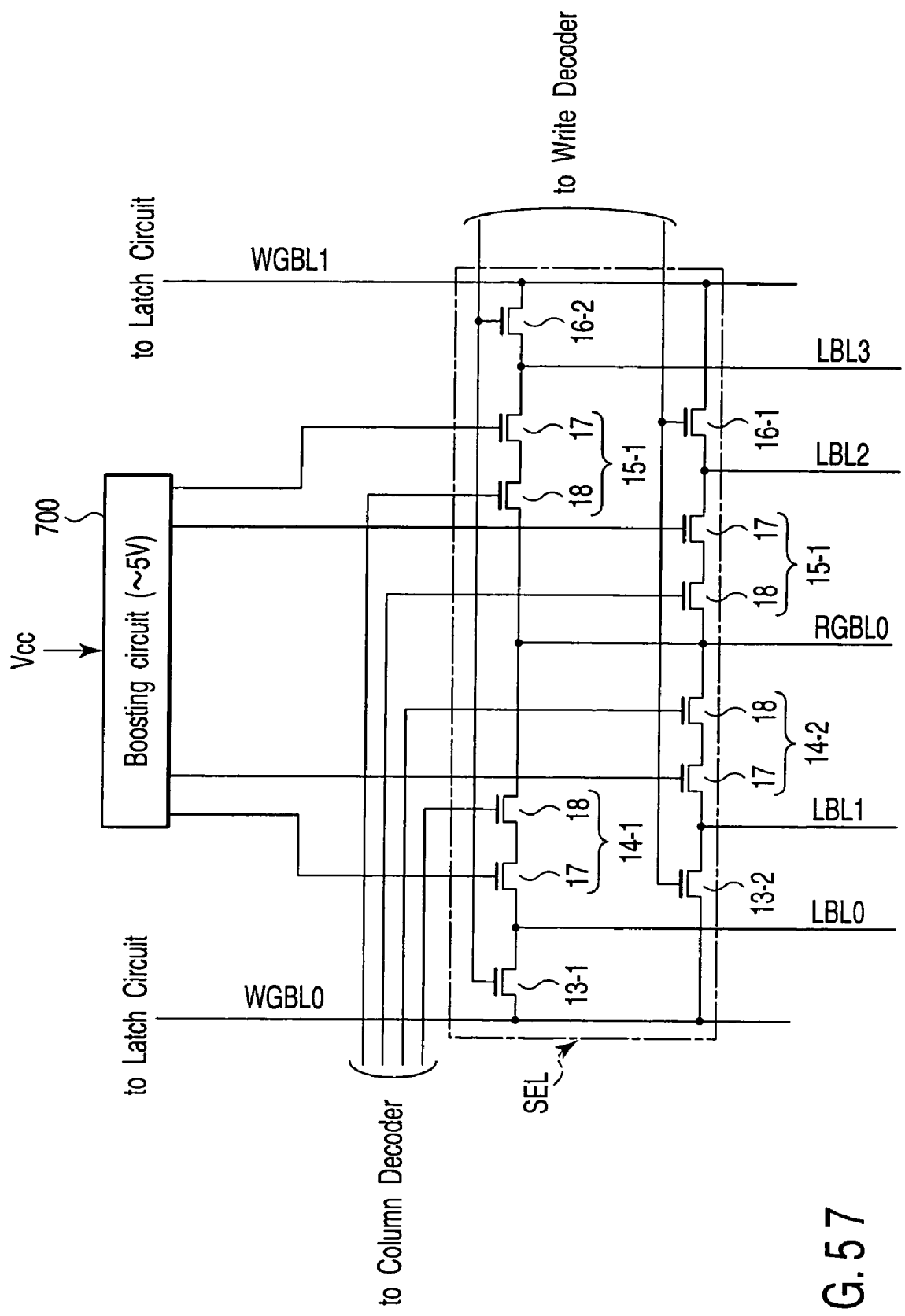
FIG. 57 is a circuit diagram of a selector in a 2Tr flash memory according to a second modification of each of the first embodiment and the third to tenth embodiments of the present invention.

In the first and eighth embodiments, the MOS transistors 14, 15, 14-1, 14-2, 15-1, 15-2 may be replaced with two MOS transistors. FIGS. 56 and 57 are circuit diagrams of selectors according to modifications of the first and eighth embodiments.

As shown in the figures, each of the MOS transistors 14, 15, 14-1, 14-2, 15-1, 15-2 is replaced by two MOS transistors 17, 18 connected in series. Then, the MOS transistor 17 is connected to the local bit line and the MOS transistor 18 is connected to the read global bit line. The MOS transistor 18 is a low-withstand-voltage MOS transistor whose gate insulating film is thin. The MOS transistor 17 is a high-withstand-voltage MOS transistor whose gate insulating film is thick. Then, a boosting circuit 700 always applies, for example, 5V to the gate of the MOS transistor 17. That is, the MOS transistor 17 does not carry out a switching operation. On the other hand, the gate of the MOS transistor 18 is connected to the column decoder 40. Then, using the voltage (e.g., Vcc1) from the column decoder 40, the MOS transistor 18 carries out a switching operation.

With this configuration, the high-withstand-voltage MOS transistor 17 practically does not function as a switch element. The low-withstand-voltage MOS transistor 17 switches between the local bit line and the read global bit line. Thus, there is practically no high-withstand-voltage MOS transistor in the reading path, which enables a faster read operation and reduces the power consumption.

Figure 58:
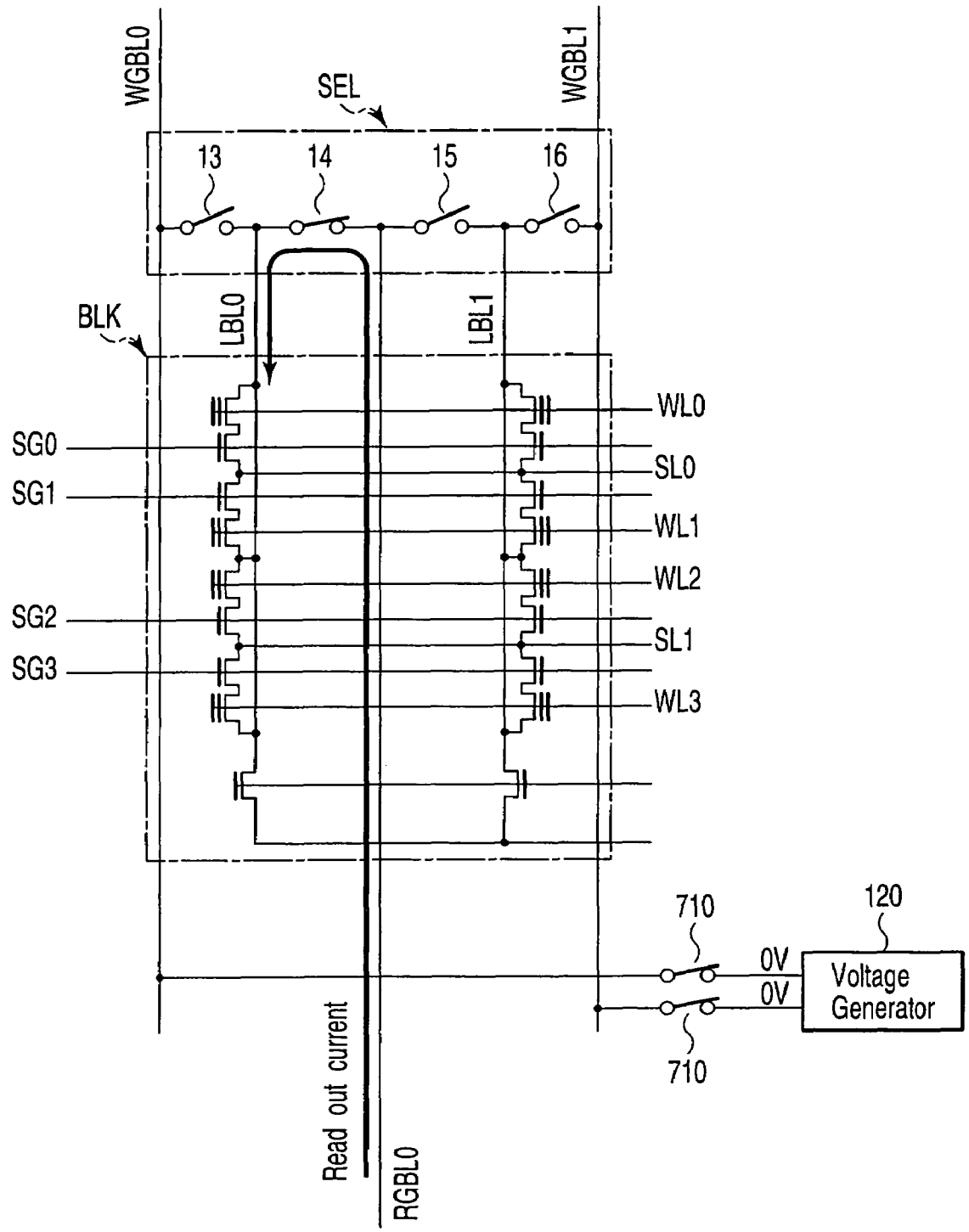
FIG. 58 is a circuit diagram of the memory cell array of a 2Tr flash memory according to a third modification of each of the first embodiment and the third to tenth embodiments of the present invention.

In the above embodiments, the bit lines are divided into the read global bit line and the write global bit line. In this case, it is desirable that the write global bit line should be set at the ground potential in a read operation. FIG. 58 is a circuit diagram of a memory cell block BLK and a selector SEL according to the first embodiment, which helps explain the division. As shown in the figure, in a read operation, the MOS transistor 14 is turned on and the local bit line LBL0 is connected to the read global bit line GBL0. Then, the write global bit lines WGBL0, WGBL1 are connected to a voltage generator 120 via a switch element 710. The voltage generator 120 applies 0V to the write global bit lines WGBL0, WGBL1.

As described above, setting the potential of the write global bit line to the ground potential in a read operation serves as a measures against noise, which stabilizes the read operation more.

Figure 59:
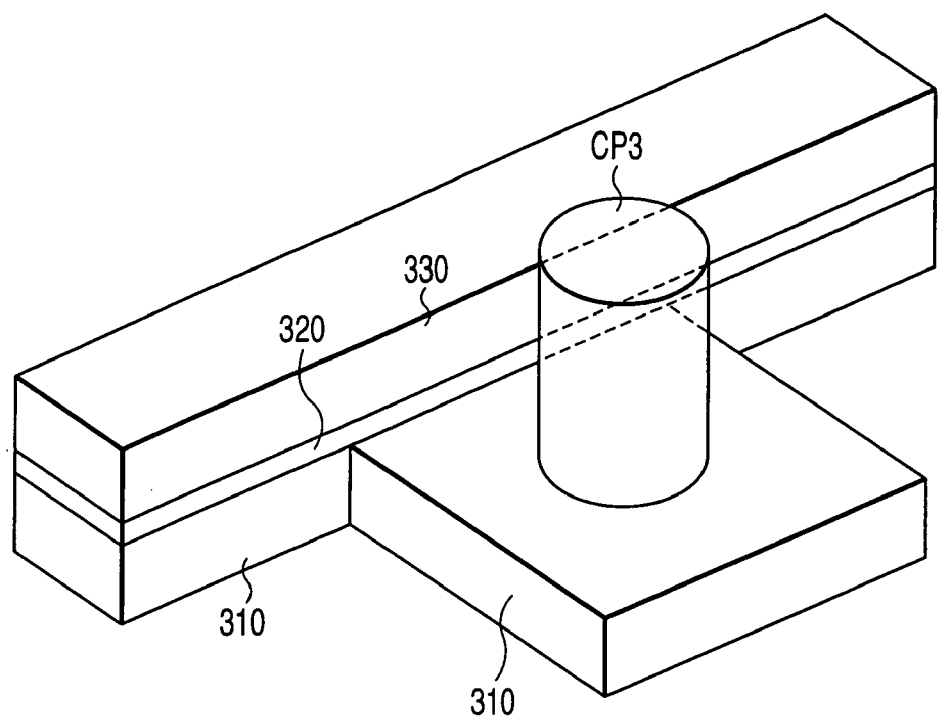
FIG. 59 is a perspective view of a shunt region included in a flash memory according to a first modification of each of the first to tenth embodiments of the present invention.
Figure 60:
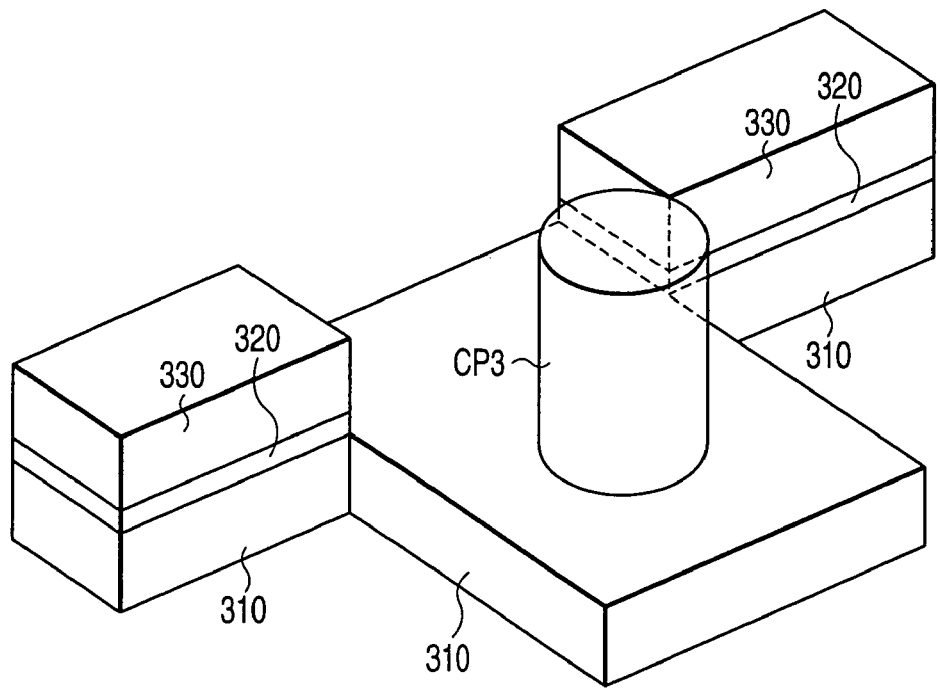
FIG. 60 is a perspective view of a shunt region included in a flash memory according to a second modification of each of the first to tenth embodiments of the present invention.

The configuration of the shunt regions SA2, SA3 is not limited to the configuration of FIG. 18 explained in the first embodiment, as long as the contact plug CP3 contacts the polysilicon layer 330. For instance, as shown in FIG. 59, all of the inter-gate insulating film 320 and polysilicon layer 330 in the projecting part of the select gate line may be removed and a contact plug CP3 may be formed in the region. Moreover, as shown in FIG. 60, all of the inter-gate insulating film 320 and polysilicon layer 330 of the select gate line in the stitch region SA1 may be removed.

Figure 61:
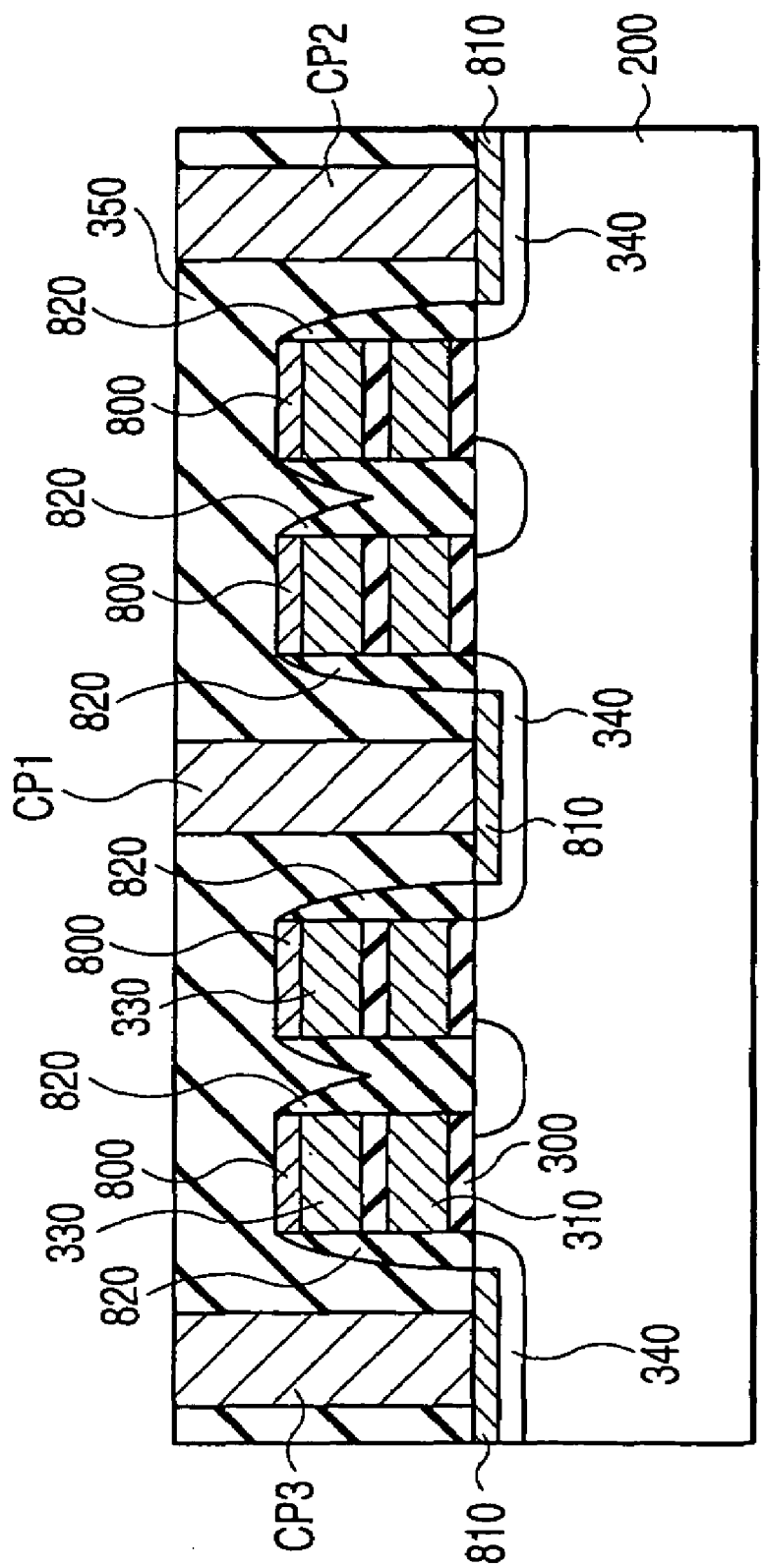
FIG. 61 is a sectional view of a memory cell included in a 2Tr flash memory according to a fourth modification of each of the first embodiment and the third to tenth embodiments of the present invention.
Figure 62:
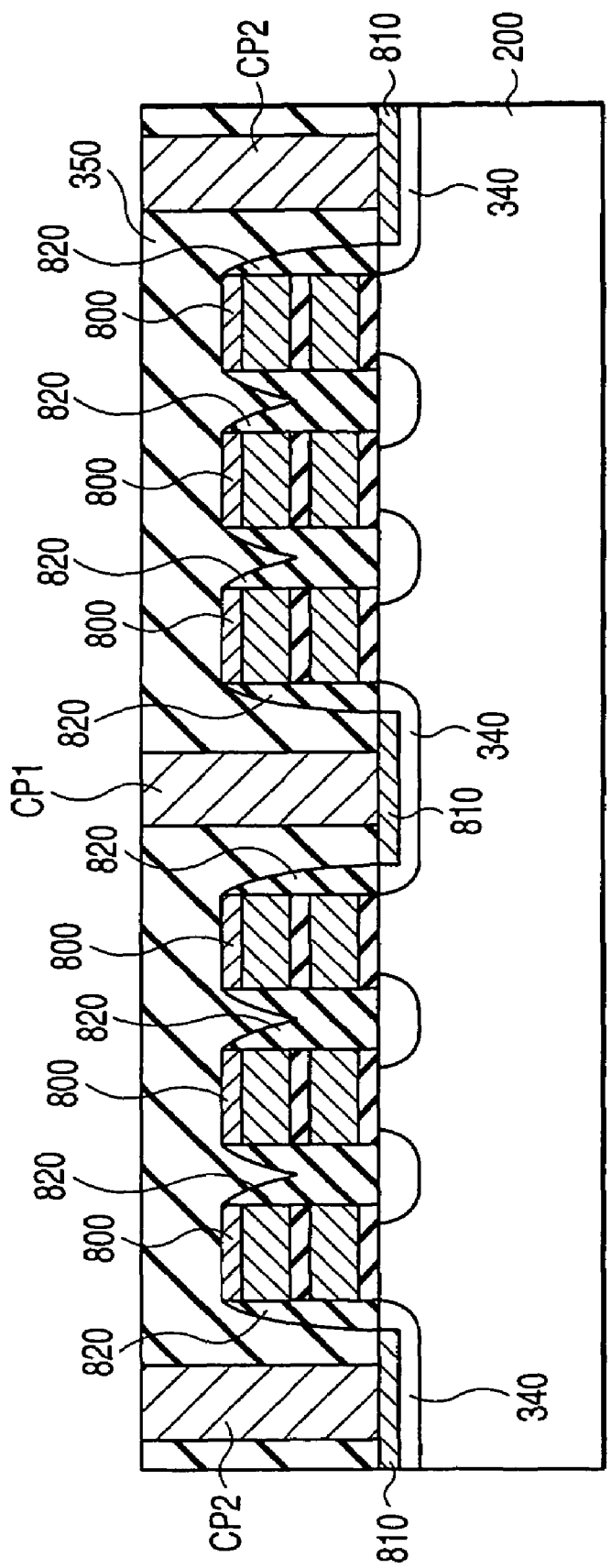
FIG. 62 is a sectional view of a memory cell included in a 3Tr-NAND flash memory according to a first modification of the second embodiment.

Furthermore, the configuration of the memory cell is not limited to the one explained in the above embodiment. FIGS. 61 and 62 are sectional views of a 2Tr flash memory and a 3Tr-NAND flash memory, respectively. As shown in the figures, a silicide layer 800 may be formed on the polysilicon layer 330 of a select transistor and a memory cell transistor and a silicide layer 810 may be formed at the surface of an impurity diffused layer 340 contacting the contact plugs CP1, CP2. Forming the silicide layers 800, 810 enables the operation speed of the flash memory to be improved. At this time, it is desirable that, in each memory cell, an insulating film 820 should be formed on the sidewall of the stacked gate and the region between adjacent stacked gates should be filled with the insulating film 820. This prevents an unnecessary silicide layer from being formed.

In the 2Tr flash memory of the above embodiment, the bit lines have been hierarchized into global bit lines and local bit lines. However, it goes without saying that the present invention may be applied to a case where the bit lines are not hierarchized.

In the above embodiment, the gate length of a memory cell transistor MT and the distance between stacked gates have been 200 nm and 250 nm respectively. However, the present invention is not limited to these values. For instance, a noticeable effect can be obtained when each of the gate length and the distance between stacked gates is 200 nm.

Figure 63:
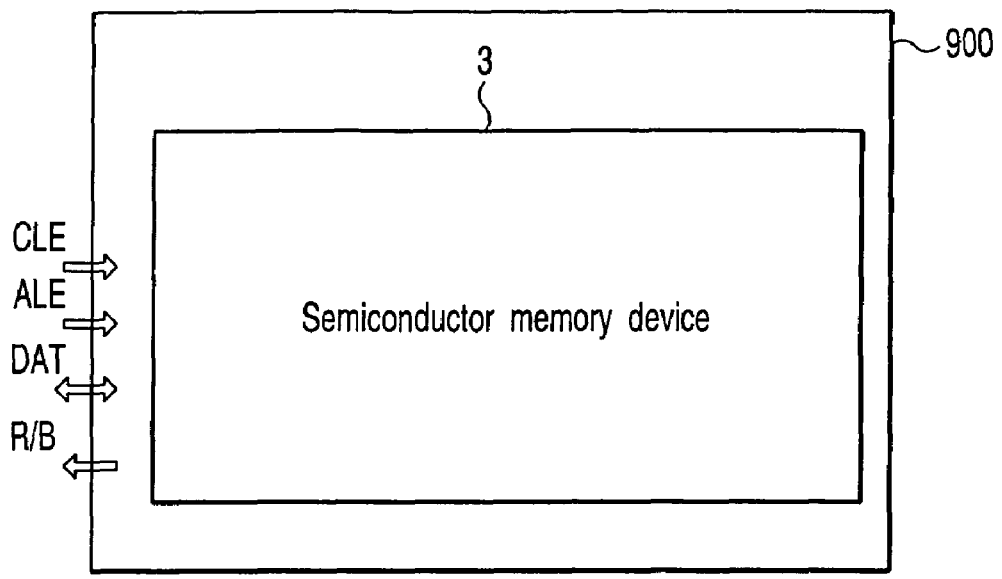
FIG. 63 is a block diagram of a memory card including a flash memory according to each of the first to tenth embodiments.

Next, an application of the flash memory will be explained. FIG. 63 shows an example of a memory card. As shown in FIG. 63, the memory card 900 includes a flash memory 3 (3Tr-NAND flash memory, NAND flash memory, or 2Tr flash memory) explained in the first to tenth embodiments. The flash memory 3 receives specific controls signals and data from an external unit (not shown). In addition, the flash memory 3 outputs specific control signals and data to the external unit.

A signal line (DAT), a command line enable signal line (CLE), an address line enable signal line (ALE) and a ready/busy signal line (R/B) are connected to the memory card 900 having the flash memory 3. The signal line (DAT) transfers data, address or command signals. The command line enable signal line (CLE) transfers a signal, which indicates that a command signal is transferred on the signal line (DAT). The address line enable signal line (ALE) transfers a signal, which indicates that an address signal is transferred on the signal line (DAT). The ready/busy signal line (R/B) transfers a signal, which indicates whether the memory device is ready, or not.

Figure 64:
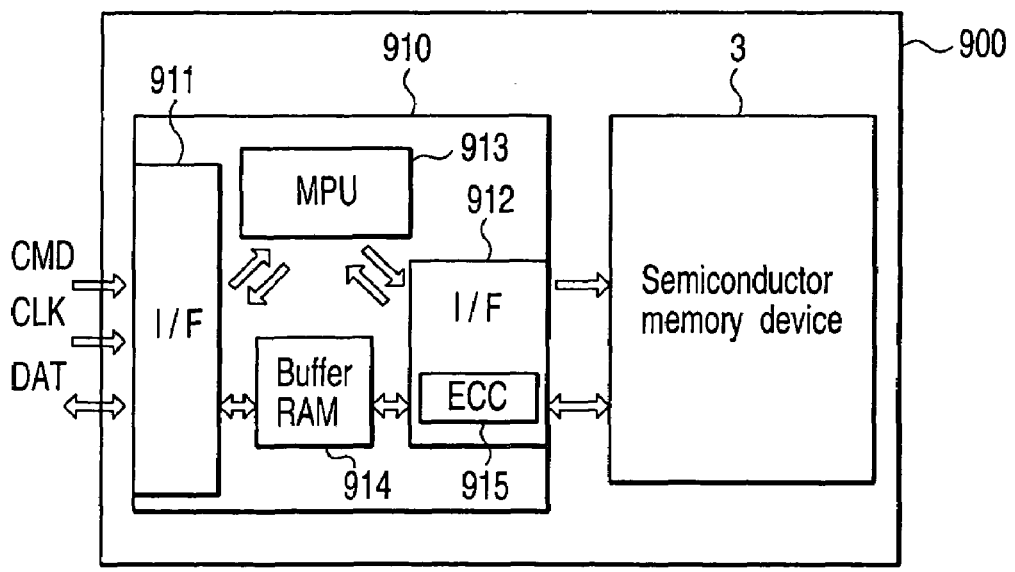
FIG. 64 is a block diagram of a memory card including a flash memory according to each of the first to tenth embodiments.

Another exemplary implementation is shown in FIG. 64. The memory card shown in FIG. 64 differs from the memory card presented in FIG. 63 in that the memory card of FIG. 64 includes, in addition to the memory device, a controller 910 which controls the flash memory 3 and receives/transfers predetermined signals from/to an external device (not shown).

The controller 910 includes interface units (I/F) 911, 912, a microprocessor unit (MPU) 913, a buffer RAM 914 and an error correction code unit (ECC) 915. The interface units (I/F) 911, 912 receives/outputs predetermined signals from/to an external device (not shown). The microprocessor unit 913 converts a logical address into a physical address. The buffer RAM 914 stores data temporarily. The error correction code unit 915 generates an error correction code. A command signal line (CMD), a clock signal line (CLK) and a signal line (DAT) are connected to the memory card 900. It should be noted that the number of the control signal lines, bit width of the signal line (DAT) and a circuit construction of the controller could be modified suitably.

Figure 65:
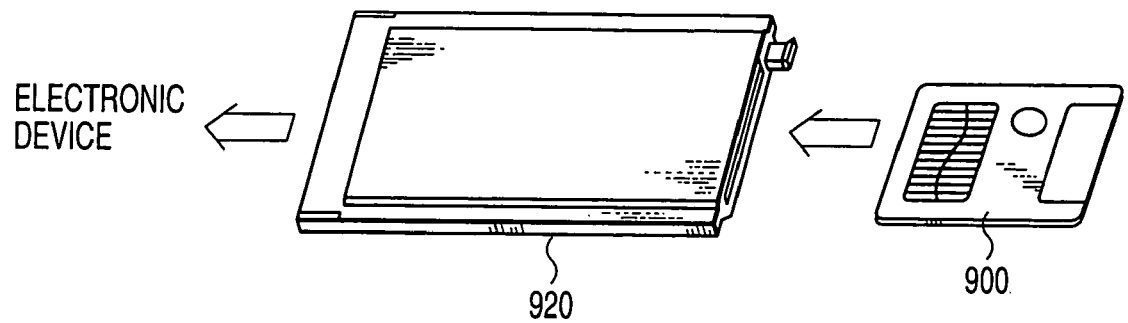
FIG. 65 is an external view of a memory card including a flash memory according to each of the first to tenth embodiments, and a card holder.

FIG. 65 shows another application. As shown in FIG. 65, the memory card 900 is inserted into a cardholder 920, which is then connected to electronic equipment (not shown). The cardholder 920 may have a part of the function of the controller 910.

Figure 66:
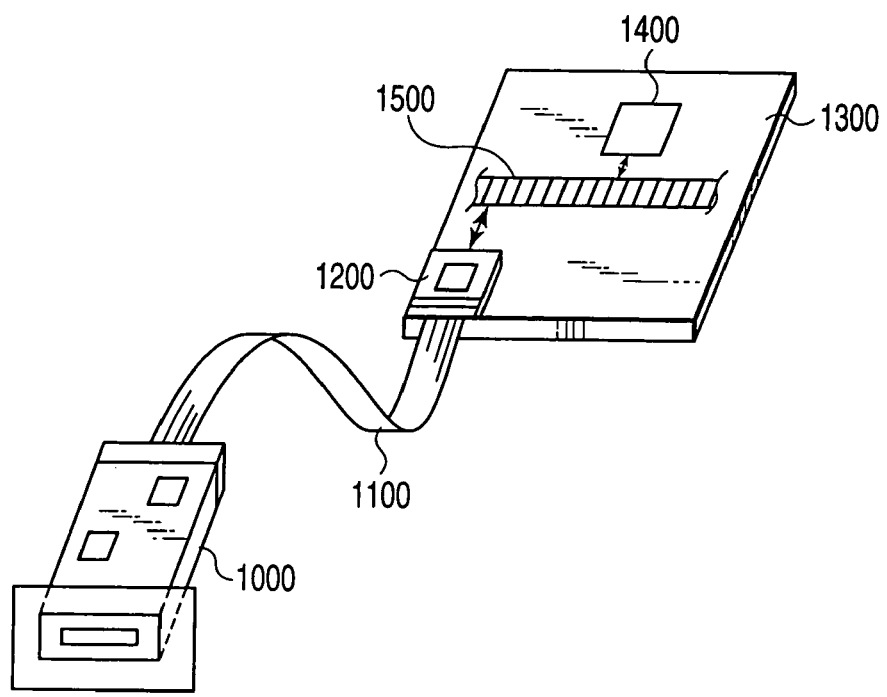
FIG. 66 is an external view of a connector unit which is to connect to a memory card including a flash memory according to each of the first to tenth embodiments.

FIG. 66 shows another application. As shown in FIG. 66, the memory card 900 or the cardholder 920 in which the memory card 900 has been inserted is inserted into a connection unit 1000. The connection unit 1000 is connected to a board 1300 via a connection cable 1100 and an interface circuit 1200. The board 1300 includes a CPU 1400 and a bus 1500.

Figure 67:
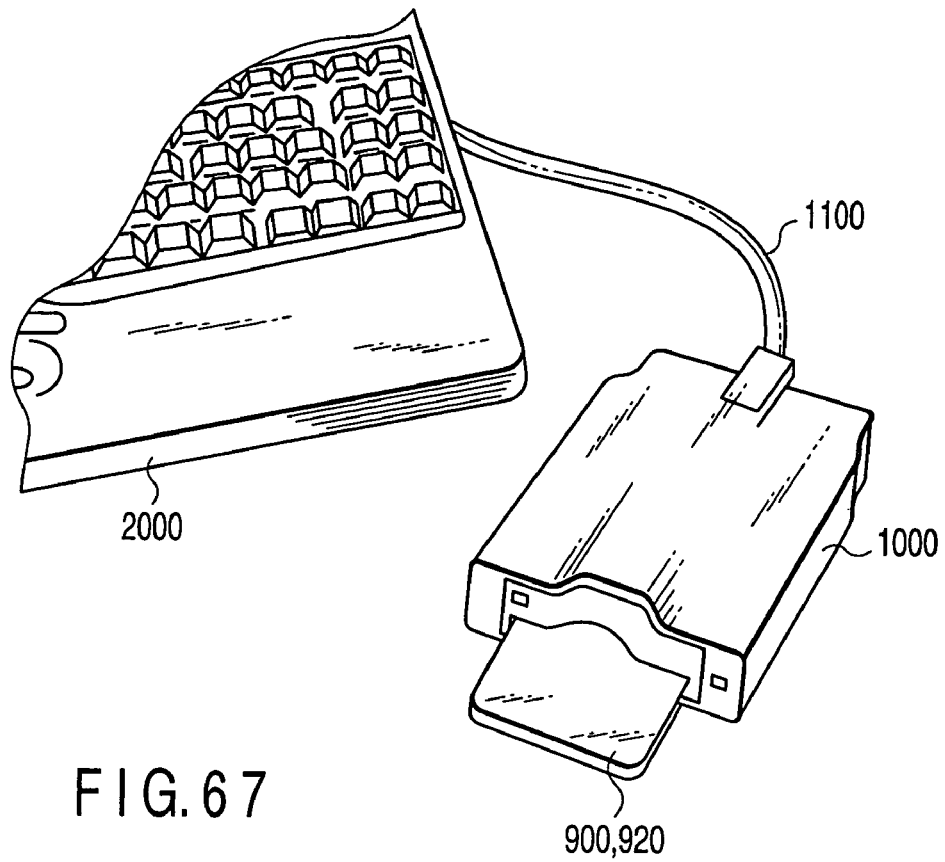
FIG. 67 is an external view of a connector unit which is to connect to a memory card including a flash memory according to each of the first to tenth embodiments.

FIG. 67 shows another application. The memory card 900 or the cardholder 920 in which the memory card 900 has been inserted is inserted into the connection unit 1000. The connection unit 1000 is connected to a personal computer 2000 via the connection cable 1100.

Figure 68:
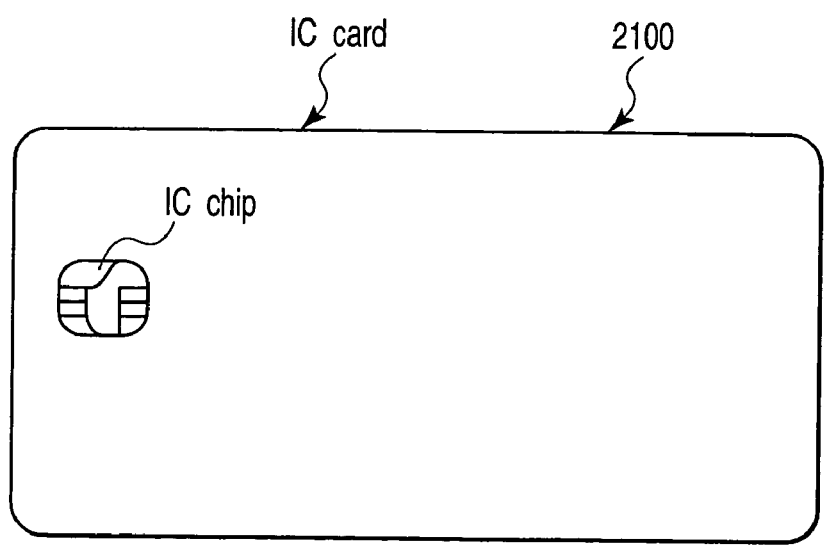
FIG. 68 is an external view of an IC card including a flash memory according to each of the first to tenth embodiments.
Figure 69:
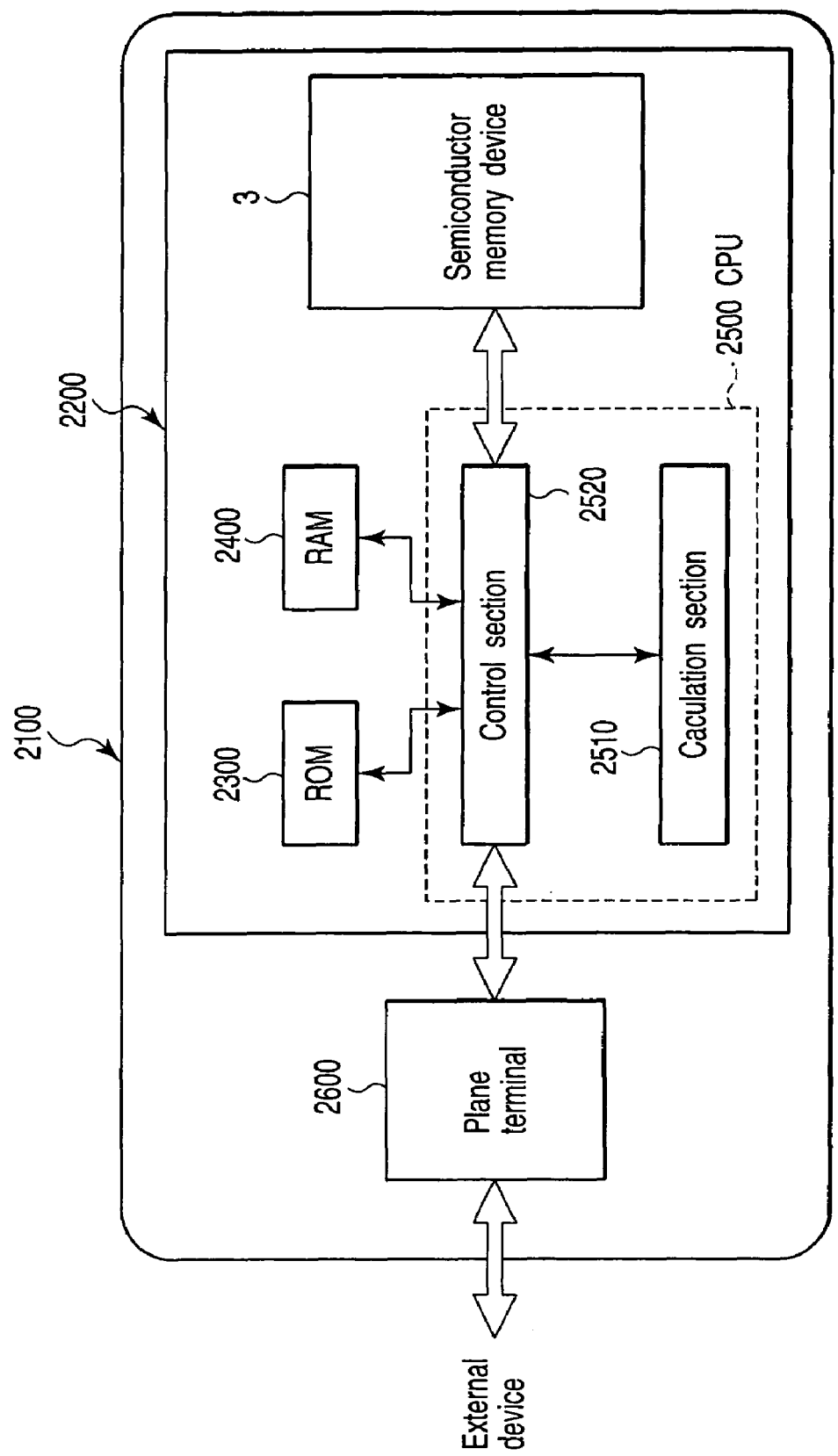
FIG. 69 is a block diagram of an IC card including a flash memory according to each of the first to tenth embodiments.

FIGS. 68 and 69 show another application. As shown in FIGS. 68 and 69, an IC card 2100 includes an MCU 2200. The MCU 2200 includes the flash memory 3 according to any one of the above embodiments, other circuits, including ROM 2300 and RAM 2400, and a CPU 2500. The IC card 2100 is connectable to the MCU 2200 via a plane connecting terminal 2600 connected to the MCU 2200 and provided on the IC card 2100. The CPU 2500 includes a computing section 2510 and a control section 2520 connected to the flash memory 3, ROM 2300, and RAM 2400. For example, the MPU 2200 is provided on one side of the IC card 2100 and the plane connecting terminal 2600 is provided on the other side.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   memory cells each of which includes a first MOS transistor and a second MOS transistor,
      the first MOS transistor including a source, a drain and a first stacked gate which includes a floating gate formed on a semiconductor substrate with a first gate insulating film interposed therebetween and a control gate formed on the floating gate with a first inter-gate insulating firm interposed therebetween, and
      the second MOS transistor including the source, the drain connected to the source of the first MOS transistor and a second stacked gate which includes a first gate electrode formed on the semiconductor substrate with a second gate insulating film interposed therebetween and a second gate electrode formed on the first gate electrode with a second inter-gate insulating film interposed therebetween, the second gate electrode being in an electrically floating state;
   bit lines each of which is connected to the drains of the first MOS transistors;
   source lines each of which is connected to the sources of the second MOS transistors;
   a memory cell array in which the memory cells are arranged in a matrix;
   word lines each of which is formed by connecting commonly the control gates of the first MOS transistors in a same row;
   select gate lines each of which is formed by connecting commonly the second stacked gates of the second MOS transistors in a same row; and
   metal wiring layers which are formed so as to correspond to the select gate lines, wherein
      the memory cell array includes first regions in which the memory cells are formed and second regions each of which is formed between adjacent first regions, at least part of the second gate electrode and second inter-gate insulating film of the second MOS transistor are removed in the second regions, exposing the top surface of each of the first gate electrodes, and the metal wiring layers are each connected electrically to the first gate electrode of the corresponding one of the select gate lines by a contact plug in the second region.

2. The semiconductor memory device according to claim 1, further comprising a row decoder which selects any one of the select gate lines in a read operation, wherein
the metal wiring layers are formed in the row direction so as to pass through the central part of the corresponding memory cells and transmit a row select signal for selecting any one of the select gate lines.

3. The semiconductor memory device according to claim 1, wherein
the metal wiring layers are each formed above the region between the central part of the corresponding one of the select gate lines and the central part of the corresponding one of the word lines.

4. The semiconductor memory device according to claim 1, wherein
the source lines each include a first wiring region which connects commonly the sources of the second MOS transistors in a same row, and
a second wiring region which connects, in the column direction, more than one of the first wiring regions.

5. The semiconductor memory device according to claim 4, further comprising third metal wiring layers which are formed in the column direction at a level higher than that of the source lines and which are connected to the first and second wiring regions of the source lines by a plurality of contact plugs.

* * * * *